(12) United States Patent
Sashida et al.

(10) Patent No.: US 7,176,132 B2
(45) Date of Patent: Feb. 13, 2007

(54) MANUFACTURING METHOD OF SEMICONDUCTOR DEVICE

(75) Inventors: Naoya Sashida, Kawasaki (JP);
Katsuyoshi Matsuura, Kawasaki (JP);
Yoshimasa Horii, Kawasaki (JP);
Masaki Kurasawa, Kawasaki (JP);
Kazuaki Takai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 12 days.

(21) Appl. No.: 10/695,642

(22) Filed: Oct. 29, 2003

(65) Prior Publication Data

US 2004/0166596 A1 Aug. 26, 2004

(30) Foreign Application Priority Data

Oct. 30, 2002 (JP) .............................. 2002-316894

(51) Int. Cl.
*H01L 21/44* (2006.01)
(52) U.S. Cl. ..................... 438/677; 438/3; 438/239; 438/648; 438/656
(58) Field of Classification Search ............... 438/3, 438/240, 253–255, 396–399, 239, 669, 642–648, 438/650, 652–654, 656–657, 677
See application file for complete search history.

(56) References Cited

U.S. PATENT DOCUMENTS

2002/0013057 A1* 1/2002 Abe .......................... 438/690

2002/0024142 A1* 2/2002 Sekiguchi .................. 257/758

FOREIGN PATENT DOCUMENTS

JP 9-053188 2/1997

OTHER PUBLICATIONS

Takeshi Ohwaki, Tomoyuki Yoshida, Shoji Hashimoto, Hideki Hosokawa, Yasuichi Mitsushima and Yasunori Taga; Preferred Orientation in Ti Films Sputter-Deposited on $SiO_2$ Glass: The Role of Water Chemisorption on the Substrate; Jpn. J. Appl. Phys. vol. 36 (1997) pp. L154-L157, Part 2, No. 2A, Feb. 1, 1997.

Makiko Kageyama; Keiichi Hasimoto and Hiroshi Onoda; Formation of Texture Controlled Aluminum and its Migration Performance in Al-Si/TiN Stacked Structure; IEEE/IRPS; pp. 97-101; 1991.

Tsutomu Mitsuzuka; Highly Preferred [111] Texture of Al Films Deposited on Ultrathin Metal Underlayers; Jpn. J. Appl. Phys. vol. 31 (1992) pp. L1280-L1283, Part 2, No. 9A, Sep. 1, 1992.

* cited by examiner

*Primary Examiner*—Thanhha S. Pham
(74) *Attorney, Agent, or Firm*—Westerman, Hattori, Daniels & Adrian, LLP

(57) ABSTRACT

There are provided a step of forming an insulating film over a semiconductor substrate, a step of exciting a plasma of a gas having a molecular structure in which hydrogen and nitrogen are bonded and then irradiating the plasma onto the insulating film, a step of forming a self-orientation layer made of substance having a self-orientation characteristic on the insulating film, and a step of forming a first conductive film made of conductive substance having the self-orientation characteristic on the self-orientation layer.

17 Claims, 43 Drawing Sheets

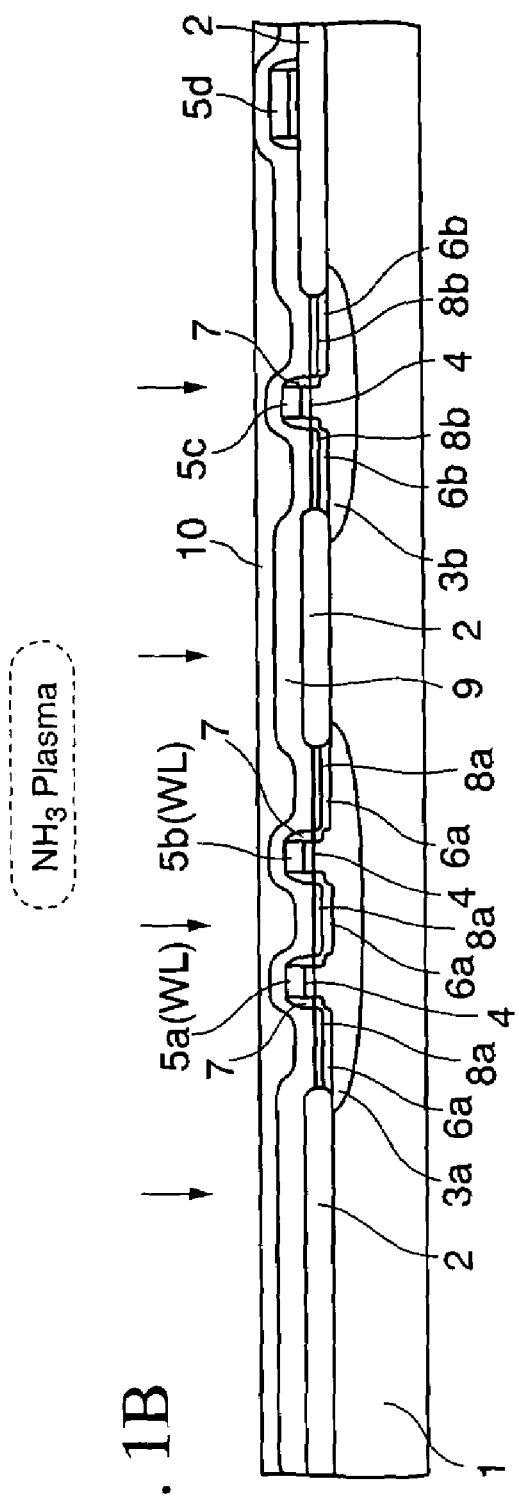
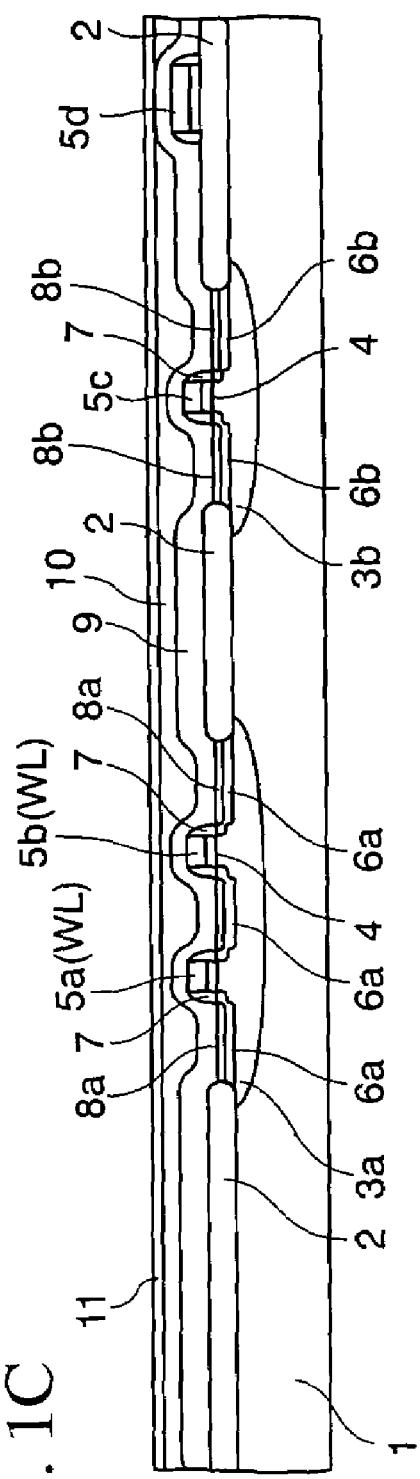
FIG. 1B
FIG. 1C

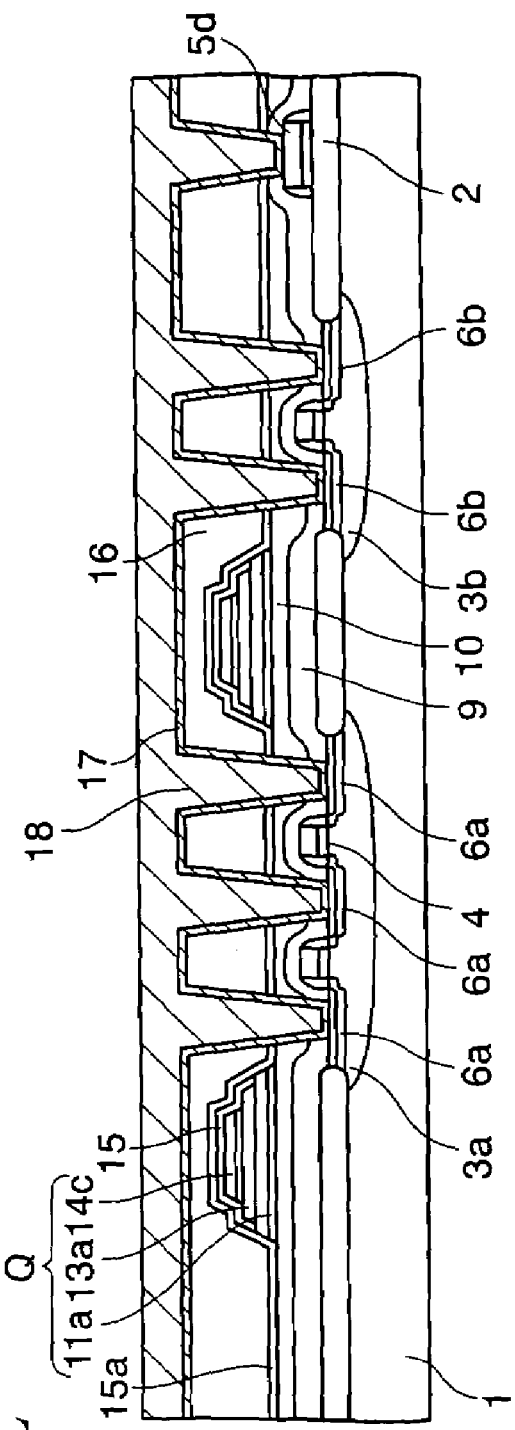
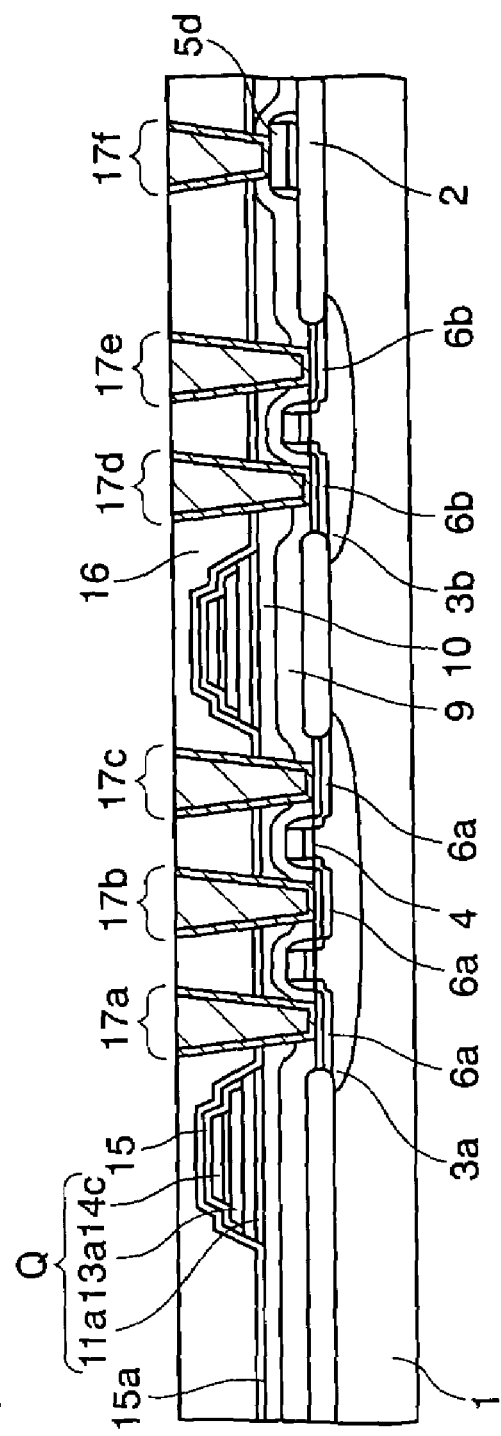
FIG. 1L
FIG. 1M

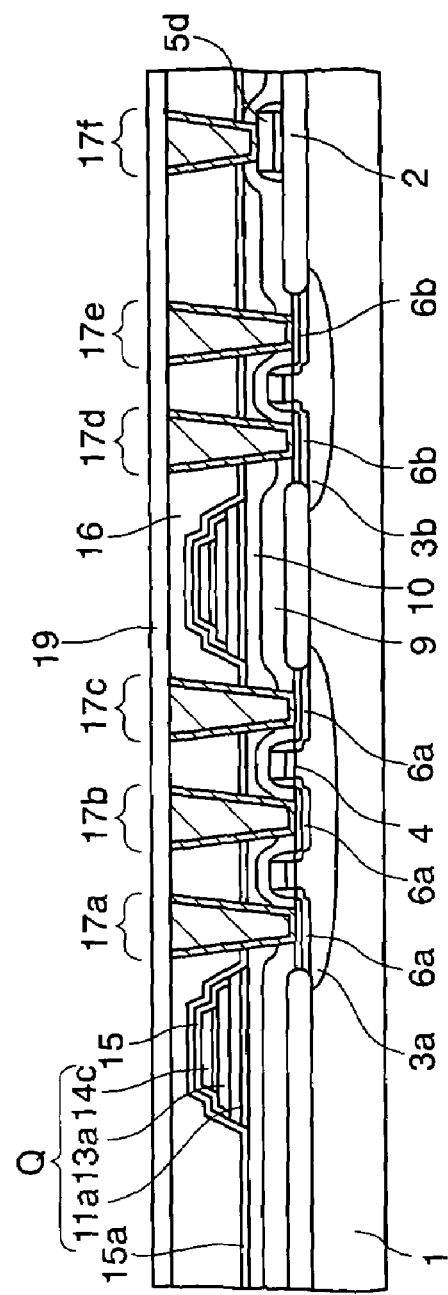
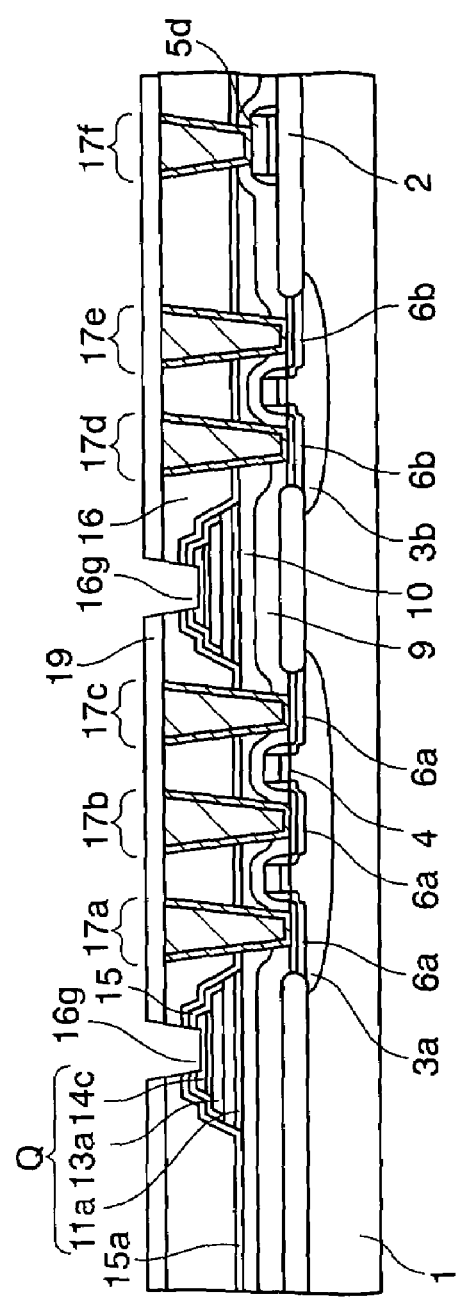
FIG. 1N
FIG. 1O

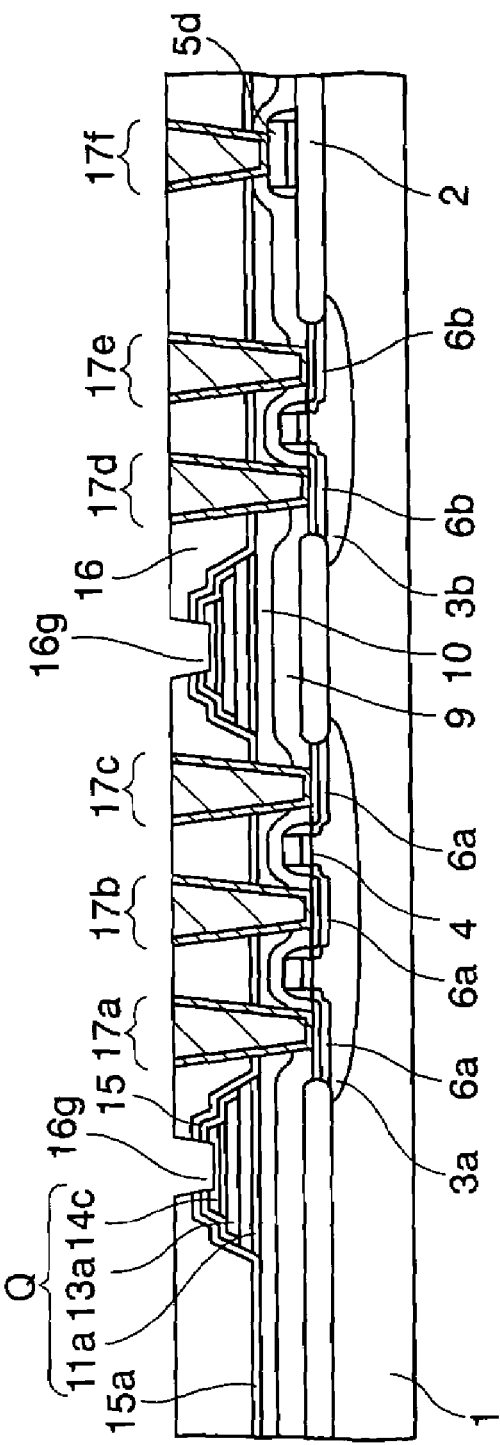
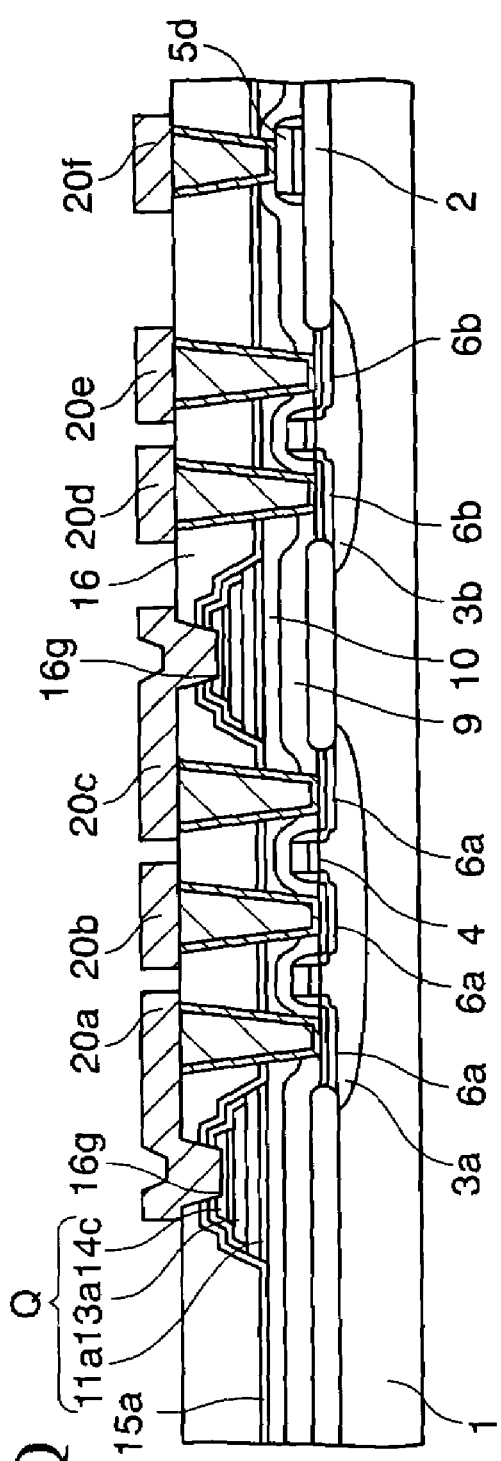
FIG. 1P
FIG. 1Q

○ Cen (002)
◇ No NH3 Plasma Process Applied Cen (002)

Atmosphere Leaving Time from NH3 Plasma Process to Ti Film Formation (hour)

PZT Orientation Characteristic

MANUFACTURING METHOD OF SEMICONDUCTOR DEVICE

CROSS-REFERENCE TO RELATED APPLICATIONS

This application is based upon and claims priority of Japanese Patent Application No. 2002-316894, filed on Oct. 30, 2002, the contents being incorporated herein by reference.

BACKGROUND OF THE INVENTION

1. Field of the Invention

The present invention relates to a manufacturing method of a semiconductor device and, more particularly, to a manufacturing method of a semiconductor device having a capacitor.

2. Description of the Related Art

As the nonvolatile memory that can still store the information after the power supply is turned off, the flash memory and the ferroelectric memory (FeRAM) are known.

The flash memory has a floating gate that is buried in a gate insulating film of the insulated-gate field effect transistor (IGFET), and stores the information by accumulating a charge indicating the stored information in the floating gate. A tunnel current that passes through the gate insulating film must be supplied to write/erase the information, and thus a relatively high voltage is required.

The FeRAM has a ferroelectric capacitor that stores the information by utilizing a hysteresis characteristic of a ferroelectric substance. The ferroelectric film formed between the upper electrode and the lower electrode in the ferroelectric capacitor generates a polarization in response to a voltage applied between the upper electrode and the lower electrode, and has a spontaneous polarization that still holds the polarization even after the applied voltage is removed.

If the polarity of the applied voltage is inverted, the polarity of the spontaneous polarization is also inverted. The information can be read by sensing the polarity and the magnitude of this spontaneous polarization. The FeRAM has such an advantage that such FeRAM can be operated at a low voltage rather than the flash memory and also a high-speed writing can be attained with low power consumption.

As the structure of the capacitor used in the memory cell of the FeRAM, the structure in which the Pt thin-film electrode, the PZT ferroelectric film, and the upper electrode are formed sequentially on the amorphous $SiO_2$ directly or via the buffer layer such as Ti, Ta, or the like on the Si substrate is set forth in following Patent Literature 1, for example.

In the prior art, in the case where a film such as Ti, or the like having the self-orientation characteristic is to be formed on the insulating film, method of changing the kind of gas when forming Ti is usually employed as a measure for improving the orientation of the film.

For instance, the method of adding $H_2O$ during the Ti sputter is set forth in following Non-Patent Literature 1. In Non-Patent Literature 1, there is shown experimental results that increase a (002) orientation intensity of the Ti film by adding $H_2O$ during the Ti sputter.

[Patent Literature 1]
  Patent Application Publication (KOKAI) Hei 9-53188 (page 3, FIG. 1)

[Non-Patent Literature 1]
  Jpn. J. Appl. Phys. Vol.36(1997) pp.L154–L157 part 2, No.2A, 1 Feb. 1997

However, according to such Ti-film forming method, it may be considered that since $H_2O$ is always present in the surrounding atmosphere of the Ti film during the sputter, it is difficult to get a pure film quality.

In Non-Patent Literature 1, it is also studied to form Ti film by introducing $H_2O$ only at the initial stage of the film formation, and subsequently form the Ti film without introducing $H_2O$. It is argued in Non-Patent Literature 1 that this method improves the quality of Ti film of later stage.

However, since $H_2O$ remains in an inside of Ti-film forming chamber for a while even after shutting of the introduction of $H_2O$, it is impossible to perfectly avoid the mixture of $H_2O$ into an upper portion of the Ti film.

Also, since a reactive gas ($H_2O$) is adhered to the Ti target, it is considered that the influence remains for a long time. Thus, a surface reforming of the target is caused by the reactive gas ($H_2O$) that was adhered to the target. Therefore, when the number of sheets of the processed wafer on which Ti is formed is increased, it is uncertain whether or not the Ti film with the same film quality can be supplied.

As other anxious points, the dark-space shielding portion is covered with the insulator (Ti oxide) to cause the abnormal discharge when $H_2O$ is introduced into the chamber. Thus, there arises possibility that the stable plasma cannot be maintained in the chamber.

In addition, in Non-Patent Literature 1, the $SiO_2$ surface is terminated by the O—H bond. Since the O—H bond itself is unstable and also presence of one Si—OH group to ten Si—O groups is stable on the surface, it is difficult to increase the density of hydrogen termination on the surface of the insulating film. In this case, the Ti film is oxidized by $H_2O$.

SUMMARY OF THE INVENTION

It is an object of the present invention to provide a manufacturing method a semiconductor device capable of improving the characteristic of a dielectric film formed on a capacitor lower electrode by improving a film quality of a conductive film constituting the capacitor lower electrode.

According to an aspect of the present invention, there is provided a manufacturing method of semiconductor device which comprises the steps of forming an insulating film over a semiconductor substrate; exciting a plasma of a gas having a molecular structure in which hydrogen and nitrogen are bonded and irradiating the plasma onto the insulating film; forming a self-orientation layer made of substance having a self-orientation characteristic on the insulating film; and forming a first conductive film made of conductive substance having the self-orientation characteristic on the self-orientation layer.

According to the present invention, the plasma of the gas having the molecular structure in which the hydrogen and the nitrogen are bonded to each other, e.g., the $NH_3$ gas, is irradiated onto the insulating film, and then the self-orientation film having the self-orientation characteristic is formed on the insulating film. According to this, the self-orientation film itself can grow with the good orientation characteristic, and then can approach the conductive film or the functional film such as the ferroelectric material formed thereon to attain the good crystallinity of the overlying film.

DETAILED DESCRIPTION OF THE PREFERRED EMBODIMENTS

Embodiments of the present invention will be explained with reference to the drawings hereinafter.

First Embodiment

Figure 1A:
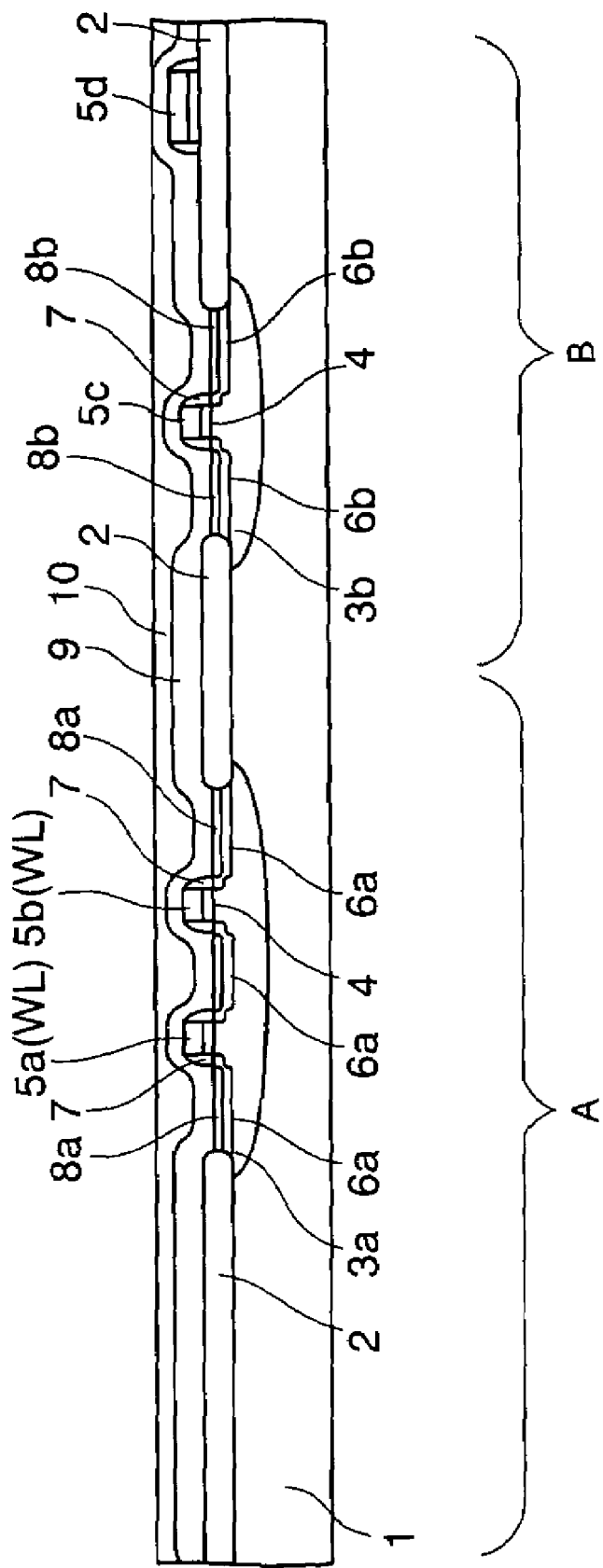
FIGS. 1A to 1R are sectional views showing steps of manufacturing a semiconductor device according to a first embodiment of the present invention.
Figure 1D:
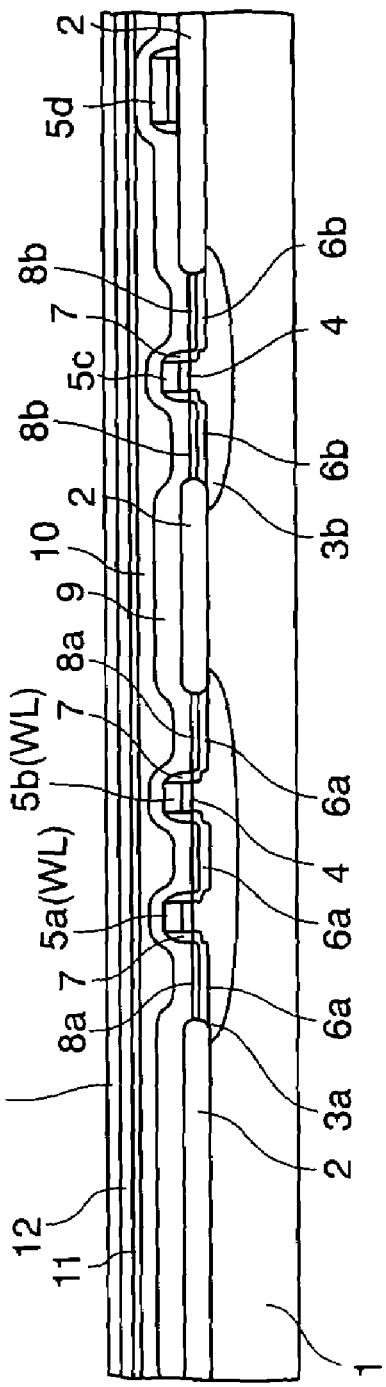
Figure 1E:
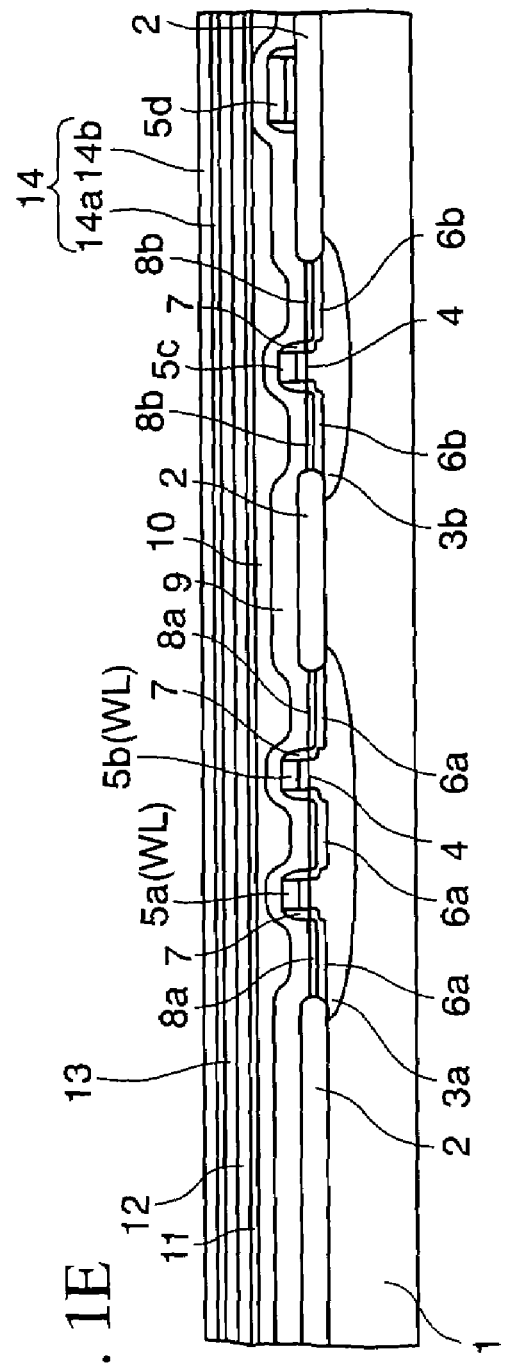
Figure 1F:
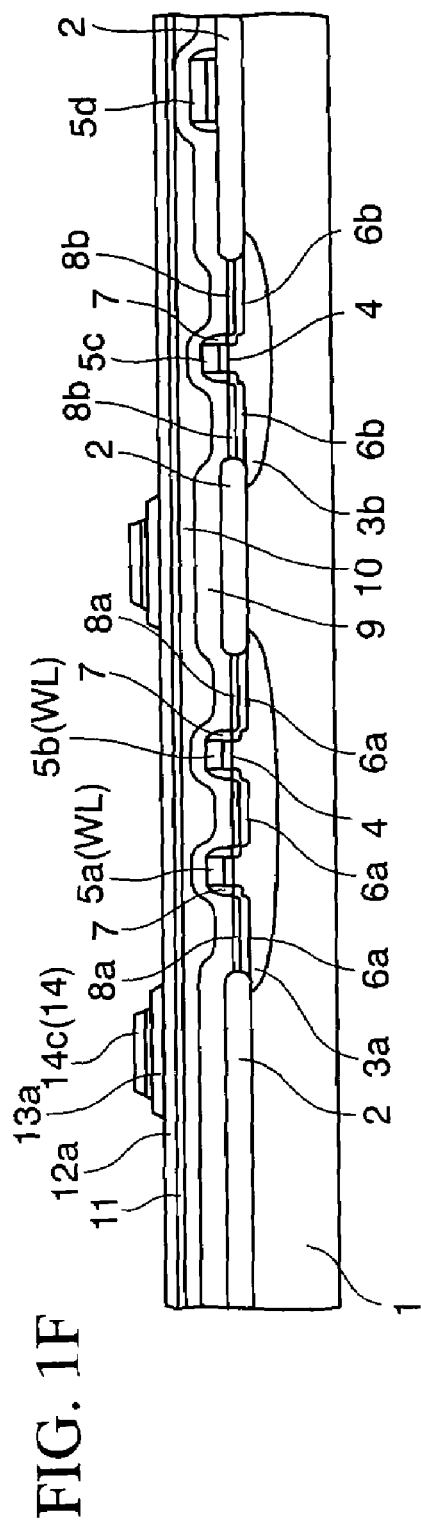
Figure 1G:
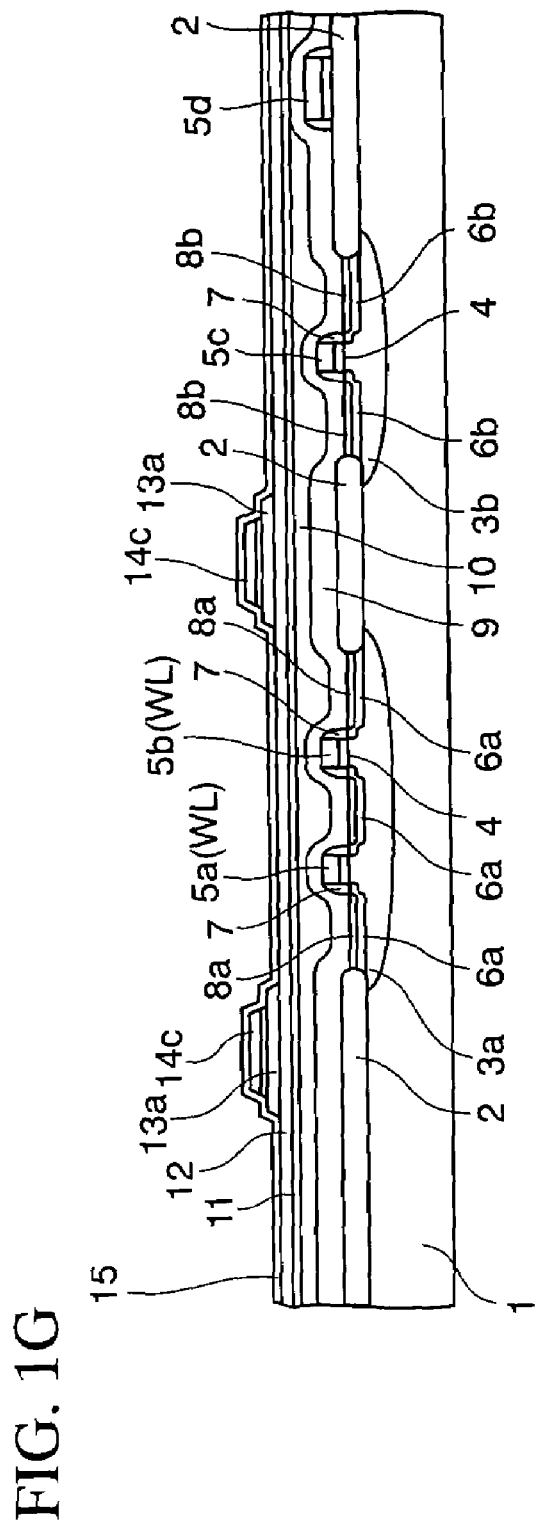
Figure 1H:
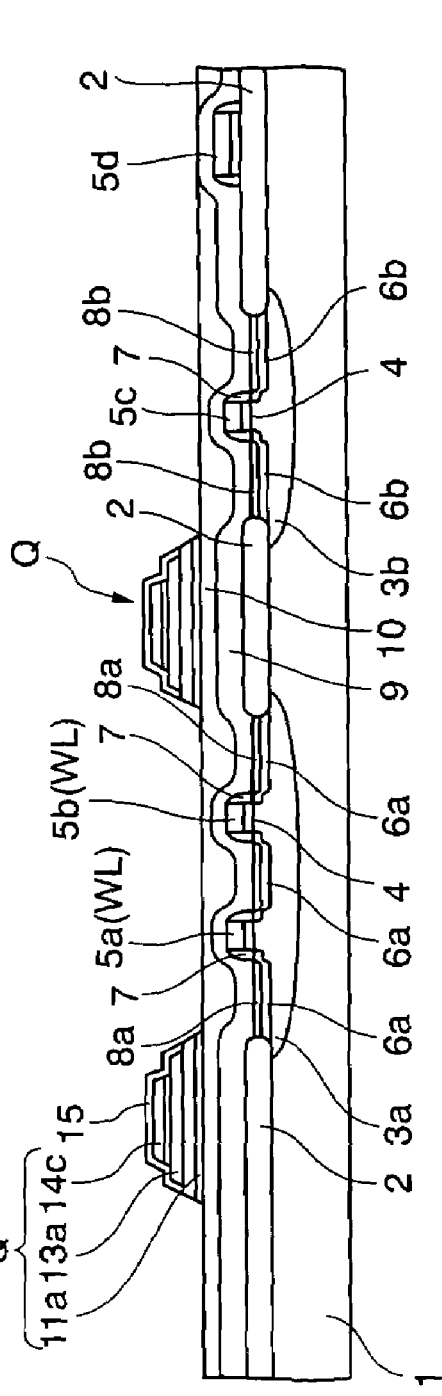
Figure 1I:
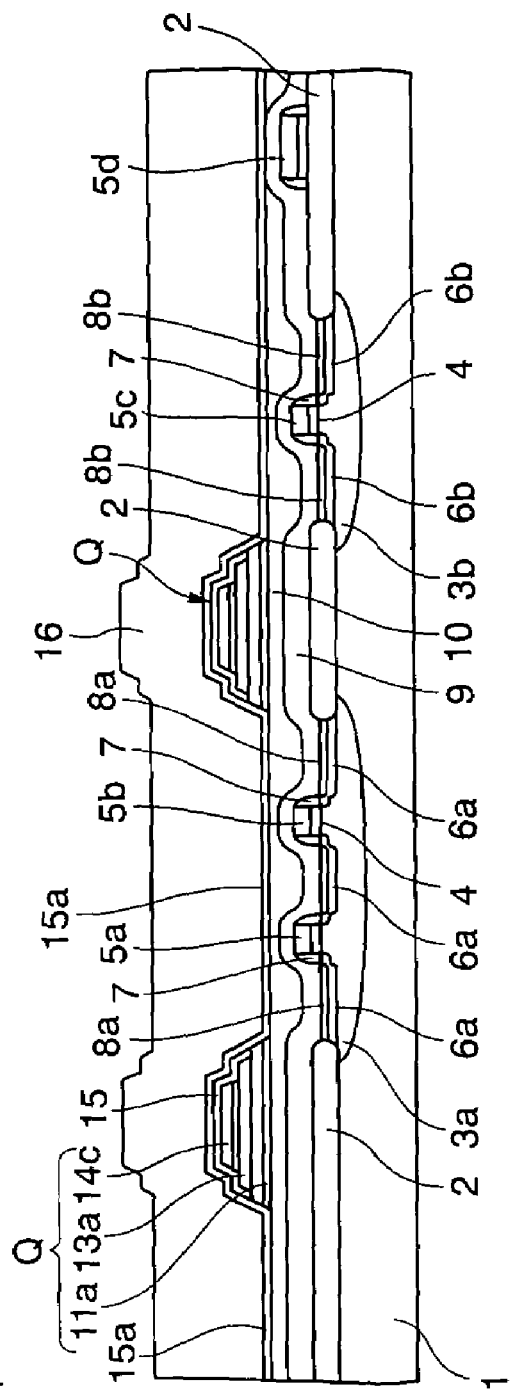
Figure 1J:
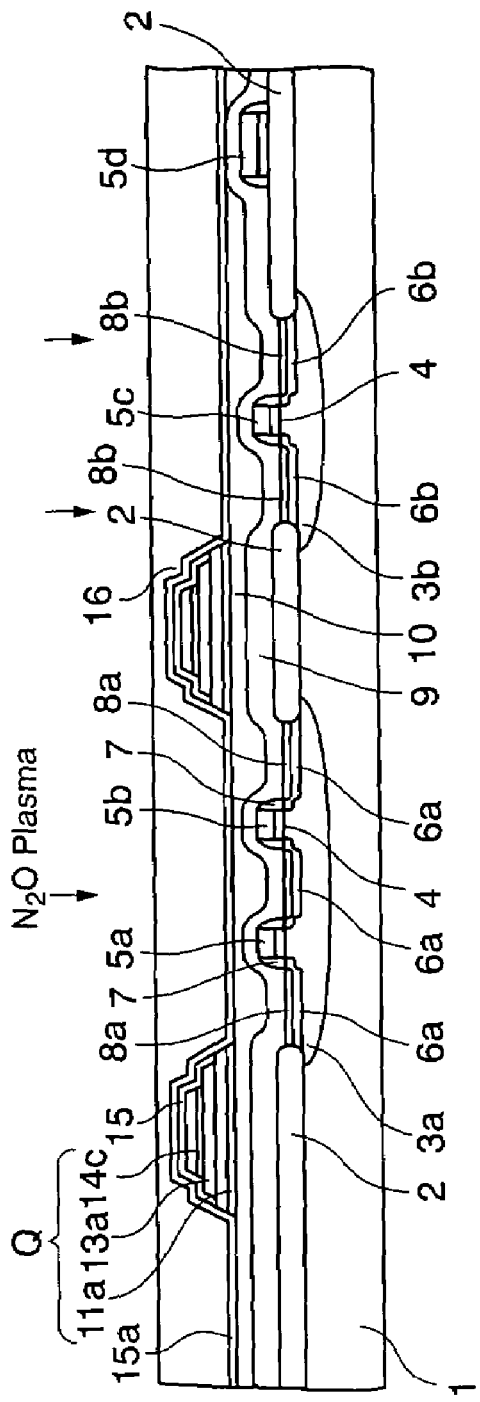
Figure 1K:
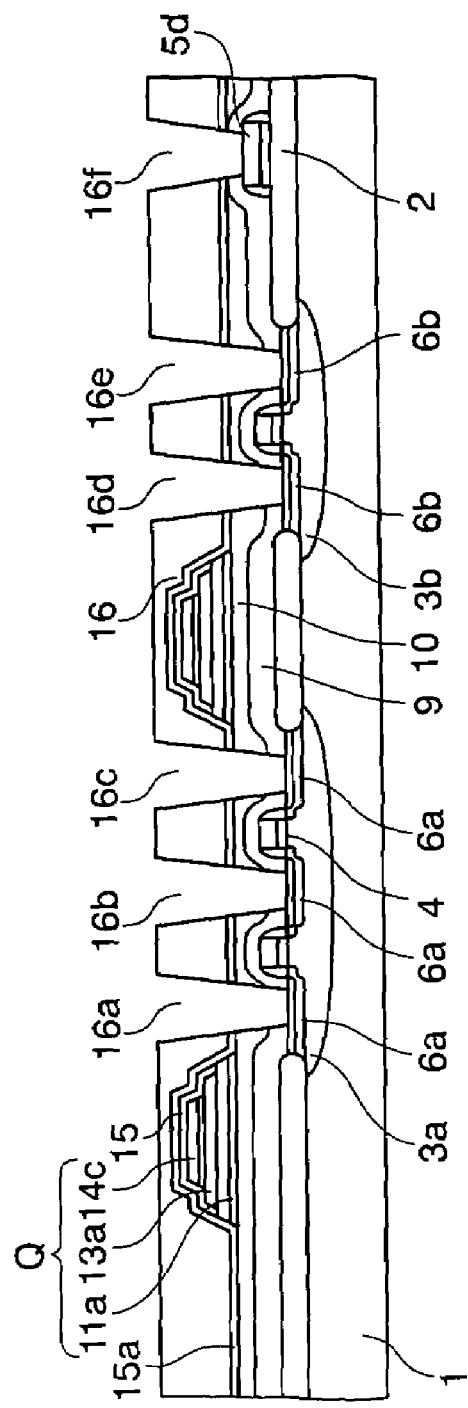
Figure 1R:
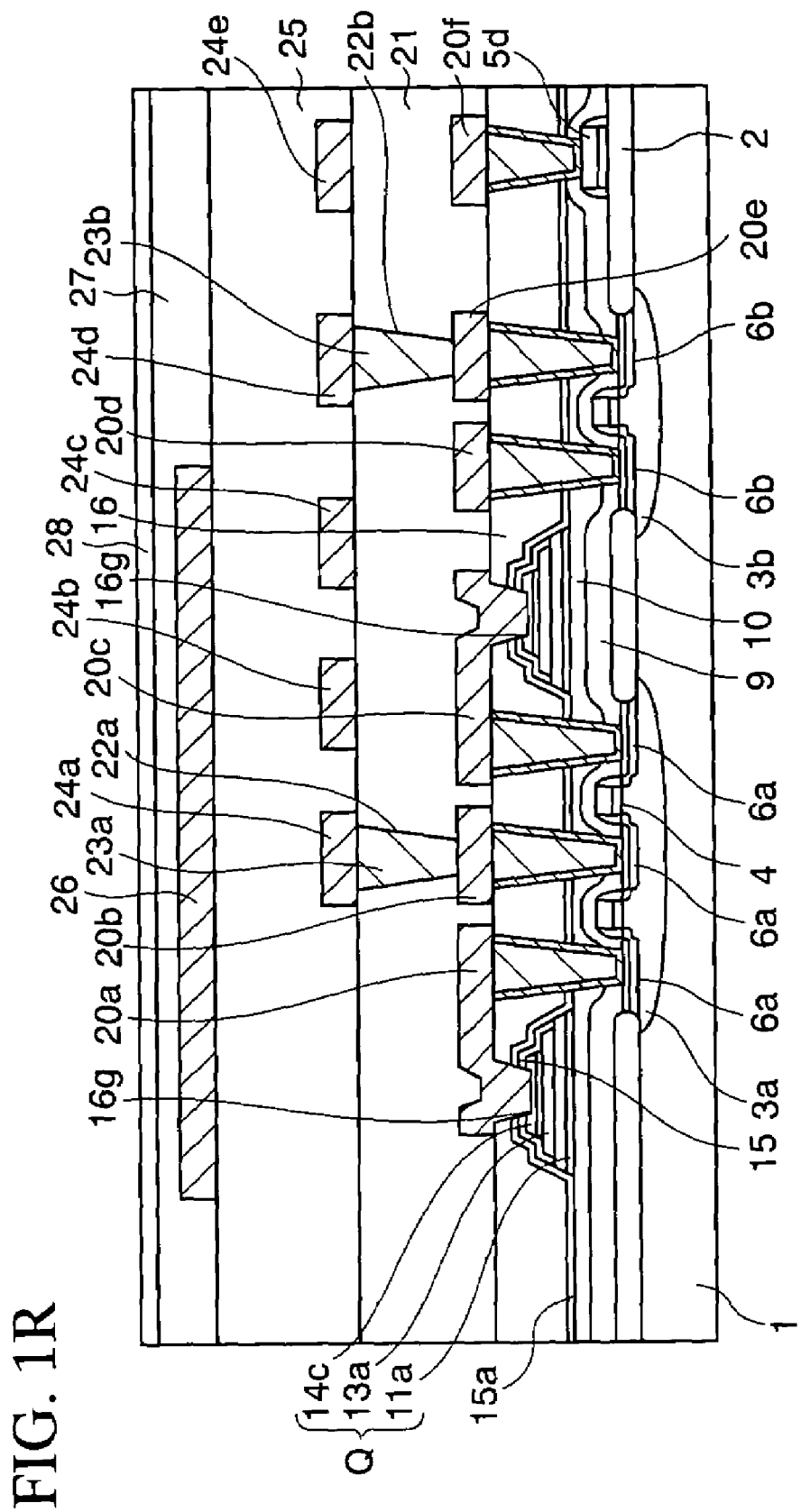

FIGS. 1A to 1R are sectional views showing steps of manufacturing a semiconductor device according to a first embodiment of the present invention.

Steps required until a structure shown in FIG. 1A is formed will be explained hereunder.

First, as shown in FIG. 1A, an element isolation insulating film 2 is formed on a surface of an n-type or p-type silicon (semiconductor) substrate 1 by the LOCOS (Local Oxidation of Silicon) method. As the element isolation insulating film 2, the STI (Shallow Trench Isolation) structure may be employed in place of the structure formed by the LOCOS method.

After such element isolation insulating film 2 is formed, a p-well 3a and an n-well 3b are formed by introducing the p-type impurity and the n-type impurity selectively into predetermined active regions (transistor forming regions) in a memory cell region A and a peripheral circuit region B of the silicon substrate 1.

In this case, a p-well (not shown) as well as the n-well 3b is formed in the peripheral circuit region B to form a CMOS.

Then, a silicon oxide film is formed as a gate insulating film 4 by thermally oxidizing surfaces of the active regions on the silicon substrate 1.

Then, an amorphous silicon film or a polysilicon film is formed on the overall upper surface of the silicon substrate 1. Then, a resistance of the silicon film is lowered by ion-implanting the impurity into the silicon film. Then, gate electrodes 5a, 5b, 5c and a wiring 5d are formed by patterning the silicon film into a predetermined shape by virtue of the photolithography method.

In the memory cell region A, two gate electrodes 5a, 5b are arranged in almost parallel at an interval on one p-well 3a. These gate electrodes 5a, 5b constitute a part of the word line WL.

Then, in the memory cell region A, three n-type impurity diffusion regions 6a serving as the source/drain of the n-channel MOS transistor are formed by ion-implanting the n-type impurity into the p-well 3a on both sides of the gate electrodes 5a, 5b. At the same time, the n-type impurity diffusion regions are formed in the p-well (not shown) in the peripheral circuit region B.

Then, in the peripheral circuit region B, p-type impurity diffusion regions 6b serving as the source/drain of the p-channel MOS transistor are formed by ion-implanting the p-type impurity into the n-well 3b on both sides of the gate electrode 5c.

Then, an insulating film is formed on the overall surface of the silicon substrate 1. Then, sidewall insulating films 7 are left only on both side portions of the gate electrodes 5a to 5c by etching back the insulating film. As the insulating film, silicon oxide ($SiO_2$) is formed by the CVD method, for example.

Then, the n-type impurity diffusion regions 6a are made into the LDD structure by implanting the n-type impurity ion again into the p-well 3a while using the gate electrodes 5a to 5c and the sidewall insulating films 7 as a mask. Also, the p-type impurity diffusion regions 6b are made into the LDD structure by implanting the p-type impurity ion again into the n-well 3b.

In this case, n-type impurity and the p-type impurity are individually implanted using resist patterns for each impurity.

As described above, in the memory cell region A, the n-type MOSFET is constructed by the p-well 3a, the gate electrodes 5a, 5b, the n-type impurity diffusion regions 6a on both sides of them, etc. Also, in the peripheral circuit region B, the p-type MOSFET is constructed by the n-well 3b, the gate electrode 5c, the p-type impurity diffusion regions 6b on both sides of them, etc.

Then, a refractory metal film, e.g., a Ti or Co film is formed on the overall surface. Then, refractory metal silicide layers 8a, 8b are formed on surfaces of the n-type impurity diffusion regions 6a and the p-type impurity diffusion regions 6b respectively by heating this refractory metal film. Then, the unreacted refractory metal film is removed by the wet etching.

Then, a silicon nitride (SiON) film of about 200 nm thickness is formed as a cover film 9 on the overall surface of the silicon substrate 1 by the plasma CVD method. Then, a silicon dioxide ($SiO_2$) film of about 1.0 μm thickness is grown as a first interlayer insulating film 10 on the cover film 9 by the plasma CVD method using the TEOS gas. In this case, the insulating film that is formed by the plasma CVD method using the TEOS gas is also called PE-TEOS hereunder.

Then, an upper surface of the first interlayer insulating film 10 is polished to be planarized by the CMP (Chemical Mechanical Polishing) method.

Next, steps required until a structure shown in FIG. 1B is formed will be explained hereunder.

First, the planarized surface of the first interlayer insulating film 10 is reformed by the plasma of an ammonia ($NH_3$) gas. the process of reforming the surface of the insulating film by the plasma of the $NH_3$ gas is also called the $NH_3$ plasma process hereunder.

As conditions of the $NH_3$ plasma process in this step, for example, a flow rate of the $NH_3$ gas introduced into the chamber is set to 350 sccm, a pressure in the chamber is set to 1 Torr, a substrate temperature is set to 400° C., a power of a HF (High frequency) power supply of 13.56 MHz supplied to the substrate is set to 100 W, a power of a HF power supply of 350 kHz supplied to the plasma generating region is set to 55 W, a distance between an electrode to the first interlayer insulating film is set to 350 mils, and a plasma irradiating time is set to 60 second.

Then, as shown in FIG. 1C, an intermediate layer (self-orientation layer) 11 made of substance having the self-orientation characteristic is formed on the first interlayer insulating film 10. The intermediate layer 11 is formed by the following step, for example.

First, a titanium (Ti) film of 20 nm thickness is formed on the first interlayer insulating film 10 by the DC sputter method. Then, a titanium oxide ($TiO_x$) film is formed by oxidizing the Ti film by means of RTA (Rapid Thermal Annealing). This $TiO_x$ film is served as the intermediate layer 11.

As the oxidizing conditions of the Ti film, for example, a substrate temperature is set to 700° C., an oxidizing time is set to 60 second, and oxygen ($O_2$) and argon (Ar) in the oxidation atmosphere are set to 1% and 99% respectively. In this case, the Ti film that is not oxidized may be used as the intermediate layer 11.

This intermediate layer 11 has a function of enhancing the orientation intensity of the first conductive film that is formed in later step, and a function of blocking the downward diffusion of Pb into the PZT ferroelectric film that is to be formed on the first conductive film. Also, the intermediate layer 11 has a function of improving the adhesiveness between a first conductive film 12 formed in the next step and the first interlayer insulating film 10.

As the substance that constitutes the intermediate layer 11 and has the self-orientation characteristic, there are aluminum (Al), silicon (Si), copper (Cu), tantalum (Ta), tantalum nitride (TaN), iridium (Ir), iridium oxide ($IrO_x$), platinum (Pt), etc. in addition to Ti. In following embodiments, the intermediate layer will be selected from any one of these materials.

Next, steps required until a structure shown in FIG. 1D is formed will be explained hereunder.

First, a Pt film of 175 nm thickness is formed as a first conductive film 12 on the intermediate layer 11 by the sputter method. As the film forming conditions of the Pt film, an Ar gas pressure is set to 0.6 Pa, a DC power is set to 1 kW, and a substrate temperature is set to 100° C.

In this case, as the first conductive film 12, a film made of iridium, ruthenium, ruthenium oxide, strontium ruthenium oxide ($SrRuO_3$), or the like may be formed. In the present embodiment and following embodiments, the first conductive film is made of the substance that has the self-orientation characteristic.

Then, PLZT (Lead Lanthanum Zirconate Titanate; $(Pb_{1-3x/2}La_x)(Zr_{1-y}Ti_y)O_3$), in which lanthanum (La) is add PZT (Pb(Zr$_{1-x}$Ti$_x$)O$_3$), of 100 to 300 nm, e.g., 240 nm thickness, is formed on the first conductive film 12 by the sputtering method. This film is used as a ferroelectric film 13. In this case, sometimes calcium (Ca) and strontium (Sr) are added into the PLZT film.

Then, the silicon substrate 1 is put into the oxygen atmosphere, and then the PLZT film is crystallized by the RTA. As the conditions of the crystallization, for example, a substrate temperature is set to 585° C., a processing time is set to 20 second, a programming rate is set to 125° C./sec, and rates of O$_2$ and Ar being introduced into the oxygen atmosphere are set to 2.5% and 97.5% respectively.

As the forming method of the ferroelectric film 13, there are the spin-on method, the sol-gel method, the MOD (Metal Organic Deposition) method, and the MOCVD method in addition to the above sputter method. Also, as the material of the ferroelectric film 13, there are PZT, SrBi$_2$(Ta$_x$Nb$_{1-x}$)$_2$O$_9$ (where 0<x≦1), Bi$_4$Ti$_2$O$_{12}$ in addition to PLZT. In this case, when the DRAM is to be formed, the high-dielectric material such as (BaSr)TiO$_3$ (BST), strontium titanate (STO), or the like may be employed instead of the above ferroelectric material.

Then, as shown in FIG. 1E, a second conductive film 14 is formed on the ferroelectric film 13. This second conductive film 14 is formed by two steps.

First, an iridium oxide (IrO$_x$) film of 20 to 75 nm, e.g., 50 nm thickness, is formed as a lower conductive layer 14a of the second conductive film 14 on the ferroelectric film 13 by the sputtering method. Then, the crystallization of the ferroelectric film 13 and the annealing of the lower conductive layer 14a are executed in the oxygen atmosphere by the RTA. As the RTA conditions, a substrate temperature is set to 725° C., a processing time is set to 1 minute, and rates of O$_2$ and Ar introduced into the oxygen atmosphere are set to 1% and 99% respectively.

Then, a iridium oxide (IrO$_x$) film of 100 to 300 nm, e.g., 200 nm thickness, is formed as an upper conductive layer 14b of the second conductive film 14 on the lower conductive layer 14a by the sputtering method.

In this case, a platinum film or a strontium ruthenium oxide (SRO) film may be formed as the upper conductive layer 14b of the second conductive film 14 by the sputter method.

Next, steps required until a structure shown in FIG. 1F is formed will be explained hereunder.

First, a resist pattern (not shown) having a planar shape of an upper electrode is formed on the second conductive film 14. Then, the second conductive film 14 is etched by using the resist pattern as a mask, and then the left second conductive film 14 is used as an upper electrode 14c.

After the resist pattern is removed, the ferroelectric film 13 is annealed in the oxygen atmosphere at 650° C. for 60 minute. This annealing is executed to recover the ferroelectric film 13 from the damages that are caused at the time of sputtering of the upper conductive layer 14b of the second conductive film 14 and at the time of etching of the second conductive film 14.

Then, the ferroelectric film 13 is etched in the state that a resist pattern (not shown) is formed on the capacitor upper electrode 14c and its peripheral area in the memory cell region A. Thus, the ferroelectric film 13 left under the upper electrode 14c is used as a capacitor dielectric film 13a.

Then, the ferroelectric film 13 is annealed in the nitrogen oxygen atmosphere in the state that the resist pattern (not shown) is removed. For example, this annealing is executed to degas the moisture, etc. absorbed by the ferroelectric film 13 and its underlying films.

Then, as shown in FIG. 1G, an Al$_2$O$_3$ film of 50 nm thickness is formed as a first encapsulation layer 15 on the upper electrode 14c, the capacitor dielectric film 13a, and the first conductive film 12 at the ordinary temperature by the sputtering method. This first encapsulation layer 15 is formed to protect the dielectric film 13a, which is ready to be reduced, from the hydrogen and block the hydrogen from entering into the inside.

In this case, as the first encapsulation layer 15, a PZT film, a PLZT film, or a titanium oxide film may be formed. The Al$_2$O$_3$ film, the PZT film, the PLZT film, or the titanium oxide film as the encapsulation layer may be formed by MOCVD, or may be formed as a laminated film that is formed by two methods of the sputtering and MOCVD. If the first encapsulation layer 15 is formed of the laminated film, it is preferable that Al$_2$O$_3$ should be formed precedingly by the sputtering with regard to deterioration of the capacitor.

Then, the first encapsulation layer 15 is annealed 550° C. for 60 minute in the oxygen atmosphere to improve the film quality.

Then, a resist (not shown) is coated on the first encapsulation layer 15. Then, the resist is exposed/developed such that a planar shape of the lower electrode is left on the upper electrode 14c and the capacitor dielectric film 13a and their peripheries. Then, the first encapsulation layer 15, the first conductive film 12, and the intermediate layer 11 are etched by using the resist as a mask. Thus, the remaining first conductive film 12 is used as a capacitor lower electrode 11a. In this case, the intermediate layer 11 also constitutes the lower electrode 11a. The etching of the first encapsulation layer 15, the first conductive film 12, and the intermediate layer 11 is carried out by the dry etching using the halogen element such as chlorine, bromine, or the like.

After the resist is removed, the upper electrode 14c, the dielectric film 13a, etc. are annealed at 350° C. for 30 minute in the oxygen atmosphere. This intends to prevent the peeling-off of the film formed in the later process.

Thus, as shown in FIG. 1H, capacitors Q each consisting of the lower electrode 11a (first conductive film 12/intermediate layer 11), the dielectric film 13a, and the upper electrode 14c (second conductive film) are formed on the first interlayer insulating film 10.

Next, steps required until a structure shown in FIG. 1I is formed will be explained hereunder.

First, an Al$_2$O$_3$ film of 20 nm thickness is formed as a second encapsulation layer 15a by the sputtering method to cover the capacitors Q and the first interlayer insulating film 10. As the second encapsulation layer 15a, other material used as the first encapsulation layer 15 may be employed. Then, the ferroelectric film 13a is recovered from the damage by executing the annealing at 650° C. for 60 minute in the oxygen atmosphere.

Then, an SiO$_2$ film of 1500 nm thickness is formed as a second interlayer insulating film 16 on the encapsulation layer 15a by the CVD method. Silane (SiH$_4$), polysilane compound (Si$_2$F$_6$, Si$_3$F$_8$, Si$_2$F$_3$Cl, or the like) and SiF$_4$, or TEOS may be employed as the film forming gas to grow the second interlayer insulating film 16. As the film forming method, the plasma excitation (ECR method: Electron Cyclotron Resonance, ICP method: Inductively Coupled Plasma, HDP: High Density Plasma, EMS: Electron Magneto-Sonic), the thermal excitation, or the laser-beam excitation system may be employed.

Then, as shown in FIG. 1J, an upper surface of the second interlayer insulating film 16 is planarized by the CMP method. The planarization of the surface of the second interlayer insulating film 16 is carried out until a thickness of 400 nm from the upper surface of the upper electrode 14c is obtained. The moisture in the slurry, which is used in this planarization by this CMP method, and the moisture in the cleaning liquid, which is used at the time of the subsequent cleaning, is adhered to the surface of the second interlayer insulating film 16 and is absorbed in its inside.

Therefore, the moisture on the surface and in the inside is discharged by annealing the second interlayer insulating film 16 at the temperature of 390° C. in the vacuum chamber (not shown). After such dehydration process, the second interlayer insulating film 16 is exposed to the $N_2O$ plasma while heating to execute the dehydration and improve the film quality. Hence, deterioration of the capacitor due to the heating and the moisture in later steps can be prevented. Such dehydration process and the plasma process may be carried out in the same chamber (not shown). A loading electrode, on which the silicon substrate 1 is loaded, and an opposing electrode, which opposes to the loading electrode, are arranged in the chamber, and a high-frequency power supply can be connected to the opposing electrode. Then, in the state that the $N_2O$ gas is introduced into the chamber, the $N_2O$ plasma is generated between the electrodes by applying the high-frequency power to the opposing electrode. Thus, the $N_2O$ plasma process of the insulating film is carried out. According to the $N_2O$ plasma process, the nitrogen is contained at least in a surface of the insulating film. Such method may be employed in following steps. It is preferable that the $N_2O$ plasma should be used in the plasma process subsequent to the dehydration process, but the NO plasma, the $N_2$ plasma, or the like may be used. This is similarly true of the steps described later. In this case, the substrate temperature of the dehydration process and the substrate temperature of the plasma process are set substantially equal to each other.

Then, as shown in FIG. 1K, the first interlayer insulating film 10, the second encapsulation layer 15a, the second interlayer insulating film 16, and the cover film 9 are etched by the photolithography method using a resist pattern (not shown). Thus, contact holes 16a to 16c are formed on the impurity diffusion layers 6a in the memory cell region A respectively, and simultaneously contact holes 16d, 16e are formed on the impurity diffusion layers 6b in the peripheral circuit region B. Also, a contact hole 16f is formed on the wiring 5d on the element isolation insulating layer 2.

The second interlayer insulating film 16, the second encapsulation layer 15a, the first interlayer insulating film 10, and the cover film 9 are etched by using a mixed gas in which $CF_4$, Ar are added into the CF-based gas, e.g., $CHF_3$.

Then, as shown in FIG. 1L, the RF (high frequency) etching is applied to the upper surface of the second interlayer insulating film 16 and inner surfaces of the contact holes 16a to 16f as the pre-process. Then, a titanium (Ti) film of 20 nm thickness and a titanium nitride (TiN) film of 50 nm thickness are formed successively by the sputtering method. These films are used as a glue layer 17. In addition, a tungsten film 18 is formed on the glue layer 17 by the CVD method using a mixed gas consisting of tungsten fluoride ($WF_6$) gas, argon, and hydrogen. In this case, a silane ($SiH_4$) gas is also used in the initial growth of the tungsten film 18. A thickness of the tungsten film 18 is set to bury completely respective contact holes 16a to 16f, for example, about 500 nm on an uppermost surface of the glue layer 17.

Then, as shown in FIG. 1M, the tungsten film 18 and the glue layer 17 are removed from the upper surface of the second interlayer insulating film 16 by the CMP method to leave only in respective contact holes 16a to 16f. Thus, the tungsten film 18 and the glue layer 17 in the contact holes 16a to 16f are used as conductive plugs 17a to 17f respectively.

In order to remove the moisture that is adhered onto the surface of the second interlayer insulating film 16 or is permeated into its inside by the steps such as the cleaning process after the formation of the contact holes 16a to 16f and the cleaning process after the CMP, etc., the second interlayer insulating film 16 is annealed again at the temperature of 390° C. in the vacuum chamber to emit the moisture to the outside. After such dehydration process, the annealing for improving the film quality is executed for 2 minute by exposing the second interlayer insulating film 16 to the $N_2O$ plasma while heating.

Then, as shown in FIG. 1N, an SiON film of about 100 nm thickness is formed as an oxidation preventing film 19 of the tungsten on the second interlayer insulating film 16 and the conductive plugs 17a to 17f by the plasma CVD method.

Then, as shown in FIG. 1O, holes 16g are formed by etching the second interlayer insulating film 16 and the encapsulation layers 15, 15a on the upper electrodes 14c while using a resist pattern (not shown) as a mask. At the same time, holes (not shown) are formed on the lower electrodes 11a that protrude from the upper electrodes 14c in the extending direction of the word line WL. Then, the resist pattern is removed.

Such etching is executed by using a mixed gas in which $CF_4$ and Ar are added to the CF-based gas, e.g., $CHF_3$.

Then, the film quality of the dielectric film 13a is improved by executing the annealing via the holes 16g at 550° C. for 60 minute in the oxygen atmosphere in the state shown in FIG. 1O. In this case, since the conductive plugs 17a to 17f made of tungsten, which is ready to be oxidized, are covered with the oxidation preventing film 19, these plugs are not oxidized.

Then, as shown in FIG. 1P, the oxidation preventing film 19 formed on the second interlayer insulating film 16 and the conductive plugs 17a to 17f is etched by the etching-back method. Thus, the conductive plugs 17a to 17f are exposed. In such case, top ends of the conductive plugs 17a to 17f project upwardly from the second interlayer insulating film 16.

Then, in the state that the conductive plugs 17a to 17f and the upper electrodes 14c are exposed, surfaces of them are etched by about 10 nm (in terms of $SiO_2$) by means of the RF etching method to expose the clean surfaces.

Then, a conductive film having a quadruple-layered structure containing aluminum is formed on the second interlayer insulating film 16 and the conductive plugs 17a to 17f by the sputter method. This conductive film consists sequentially of a titanium nitride film of 150 nm thickness, a copper-containing (0.5%) aluminum film of 550 nm thickness, a titanium film of 5 nm thickness, and a titanium nitride film of 150 nm thickness from the bottom.

Then, as shown in FIG. 1Q, first to fifth wirings 20a, 20c, 20d to 20f and a conductive pad 20b are formed by patterning the conductive film by virtue of the photolithography method.

In the memory cell region A, the first wiring 20a is connected to the upper electrode 14c on one side of the p-well 3a via the hole 16g, and is connected to the conductive plug 17a that is closest to the upper electrode 14c on the p-well 3a. The wiring 20c is connected to the upper electrode 14c on the other side of the p-well 3a via the hole 16g, and is connected to the conductive plug 17c that is closest to the upper electrode 14c on the p-well 3a. The conductive pad 20b is formed like an island on the conductive plug 17b that is formed on the center of the p-well 3a. The third to fifth wirings 20d to 20f are connected to the conductive plugs 17d to 17f in the peripheral circuit region B.

Next, steps required until a structure shown in FIG. 1R is formed will be explained hereunder.

First, a third interlayer insulating film 21 is formed on the first to fifth wirings 20a, 20c, 20d to 20f and the conductive pad 20b. Then, an upper surface of the third interlayer insulating film 21 is planarized by the CMP.

Then, via holes 22a, 22b are formed in the third interlayer insulating film 21 by using a mask (not shown). The via holes 22a, 22b are formed on the conductive pad 20b on the p-well 3a in the memory cell region A and the wiring 20e in the peripheral circuit region B, or other positions.

Then, vias 22a, 22b made of a TiN layer and a W layer are formed in the via holes 22a, 22b. These vias 22a, 22b are formed by forming the TiN layer and the W layer in the via holes 22a, 22b and on the third interlayer insulating film 21 by means of the sputter and then removing the TiN layer and the W layer from the upper surface of the third interlayer insulating film 21 by means of the CMP to leave in the via holes 22a, 22b.

Then, second-layer wirings 24a to 24e are formed on the third interlayer insulating film 21. Then, a fourth interlayer insulating film 25 is formed on the second-layer wirings 24a to 24e on the third interlayer insulating film 21. Then, the fourth interlayer insulating film 25 is planarized, and then a conductive pattern 26 made of aluminum is formed on the fourth interlayer insulating film 25. Then, a first cover insulating film 27 made of silicon oxide and a second cover insulating film 28 made of silicon nitride are formed sequentially on the fourth interlayer insulating film 25 and the conductive pattern 26. According to the above, the basic structure of the FeRAM is formed.

Since the upper surface of the first interlayer insulating film 10 formed under the capacitor Q is exposed to the plasma using the $NH_3$ gas, the capacitor characteristic of the capacitor Q formed by the above embodiment can be improved compared to the prior art.

The capacitor Q formed by the above embodiment will be explained in detail hereunder. In this case, the insulating film described in the following is made of the silicon oxide film in principle.

First, the FeRAM formed by the above steps in the present embodiment and the FeRAM formed by the conventional method are prepared.

The FeRAM having the conventional structure is formed via the same steps as those in the above embodiment except that the intermediate layer 11 is formed on the first interlayer insulating film 10 that is not exposed to the $NH_3$ plasma.

These FeRAMs are the 1T1C type in which 1 transistor and 1 capacitor constitute 1 bit, and have a reference cell serving as the reference by which "0", "1" of the data are decided. When measuring a quantity of polarization charges written in the memory cells, a quantity of polarization charges written in a reference capacitor of the reference cell is used as standard charge.

For example, if a quantity of polarization charges written in the capacitor of the memory cell is higher than that written in the reference capacitor, the memory cell capacitor is decided as being "0", whereas the capacitor is decided as being "1" under the opposite situation. As a result, a quantity of polarization charges in the reference capacitor is set between $(+P_r)$ and $(-P_r)$, which are residual dielectric polarization of plus side and mines side respectively, at zero electric field in hysteresis loop of the voltage-polarization charge characteristic of the memory cell.

In the hysteresis loop, a signal (charge) obtained when a negative pulse is once applied to the capacitor and then a positive pulse is applied to the capacitor is represented by P, and is called $P_{term}$. A signal (charge) obtained when the positive pulse is once again applied to the capacitor after this is represented by U, and is called $U_{term}$. Also, a charge sensed when the pulse returns to 0 V after the negative pulse is again applied to the capacitor is represented by Da, and is called $Da_{term}$.

Figure 2:
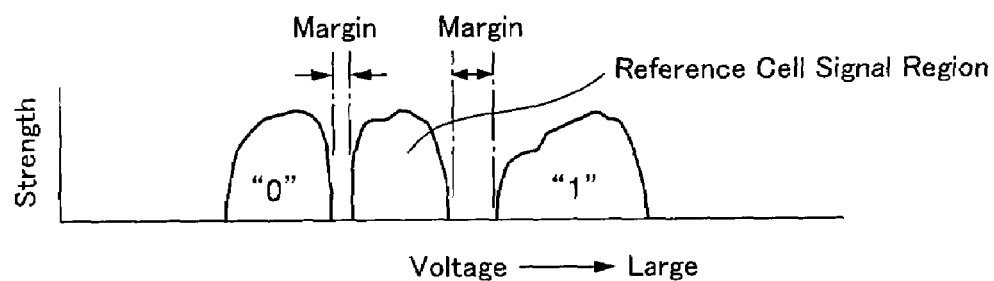
FIG. 2 is a view showing "0", "1" margins in the device in the prior art, in which the $NH_3$ plasma process is not applied to an insulating film under a capacitor.

At first, when margins between "0" and "1" in the FeRAM in the prior art were examined, the margin characteristic shown in FIG. 2 was obtained. On the contrary, when the margins between "0" and "1" in the FeRAM in the present embodiment were examined, the margin characteristic shown in FIG. 3 was obtained.

Figure 3:
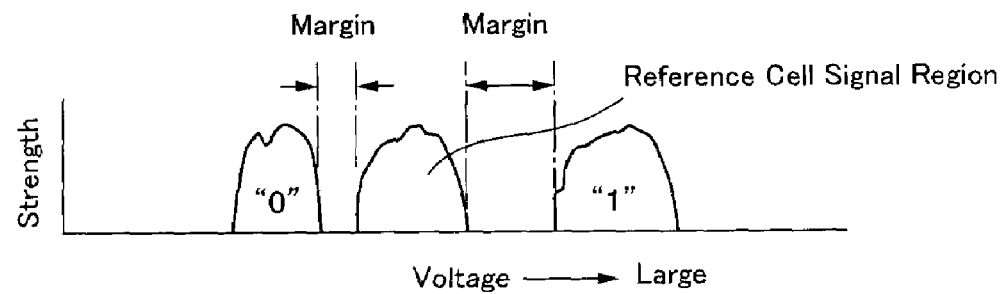
FIG. 3 is a view showing "0", "1" margins in the device according to the embodiment of the present invention, in which the $NH_3$ plasma process is applied to an insulating film formed under a capacitor.

In FIG. 2 and FIG. 3, there exist three regions in each figure. Among these regions, central region is the signal region of the (Da+P)×0.6 reference cell. The region that is positioned on the higher voltage side than the signal region of the reference cell is a potential of the bit line generated by the $P_{term}$ signal, and indicates a "1" signal. Also, the region that is positioned on the lower voltage side than the signal region of the reference cell is a potential of the bit line generated by the $U_{term}$ signal, and indicates a "0" signal.

In FIG. 2 and FIG. 3, when both ends of the signal region of the reference cell intersects with the "1" signal region or the "0" signal region, there is no margin of signal isolation. Therefore, as indicated by arrows in FIG. 2 and FIG. 3, situations that an interval between an end of the signal region of the reference cell and an end of the "1" signal region and an interval between an end of the signal region of the reference cell and an end of the "0" signal region are wide signify that margins of the "1", "0" signals are wide respectively. It is understood that the margins of the "1", "0" signals in FIG. 3 become wider than the margins of the "1", "0" signals in FIG. 2.

According to such experimental results, it became apparent that the "1", "0" margins as the FeRAM device can be widened consequently by applying the $NH_3$ plasma process to a surface of the insulating film formed under the capacitor.

A difference between flow of conventional method and improving flow of present embodiment is whether the $NH_3$ plasma process is performed for the underlying P-TEOS interlayer insulating film or not. The orientation of the lower electrode under the ferroelectric film can be improved by the action of this $NH_3$ plasma, and the characteristic of the ferroelectric capacitor can be improved correspondingly. Thus, "0", "1" switching margins can be widened.

Next, explanation will be made for a fail bit of the FeRAM hereunder.

When fail-bit counts were made under severe conditions, which give rise to many failures, in the FeRAM having the conventional structure and the FeRAM in the present embodiment, results shown in Table 1 were obtained. According to Table 1, failures that are more than thirty thousands of bits on an average were generated in the FeRAM formed under the conventional conditions. In contrast, in the present embodiment having the improved structure, fail-bits could be suppressed to a level of about 1/10 in the prior art. In this case, S/n indicates the sample number in Table 1.

TABLE 1

Reduction in the fail-bit number by the NH₃ plasma process (PLA)

| | Measured Temperature | S/n | Fail-bit number | Average | Relative ratio |
|---|---|---|---|---|---|
| Prior Art | −45° C. | 1 | 23521 | — | — |
| | | 2 | 28023 | — | — |
| | | 3 | 33622 | — | — |
| | | 4 | 36938 | — | — |
| | | 5 | 36977 | 31816.2 | 10 |
| | +85° C. | 6 | 1 | — | — |
| Improved (NH₃ PLA applied) | −45° C. | 7 | 4531 | — | — |
| | | 8 | 6175 | — | — |
| | | 9 | 4665 | — | — |
| Present Embodiment | | 10 | 2001 | — | — |
| | | 11 | 1336 | 3741.6 | 1.2 |
| | +85° C. | 12 | 0 | — | — |

Measuring Flow: (1) SS (RowB) write @ 25° C.

(2) IR reflow 250° C./1 min (3) SS read @−45° C., +85° C.

By the way, in the FERAM in the present embodiment, the reason why the "0", "1" margin is expanded, as shown in the result in FIG. 3, or why the fail-bits are reduced to about 1/10 in the prior art, as indicated in Table 1, is that crystallinity of PZT itself as the ferroelectric substance of the capacitor Q can be improved. In other words, the (002) orientation of the Ti film is improved by forming the Ti film on the first interlayer insulating film 10 that is exposed to the NH₃ plasma, then the TiO$_x$ film is formed by oxidizing the Ti film (intermediate layer 11), and then the Pt film is formed as the first conductive film 12 thereon to form the lower electrode. Then, the PZT film is formed thereon, and then the crystallinity of the PZT film itself can be improved by annealing the PZT film.

Table 2 shows compared experimental results indicating how the orientation intensities of the lower electrode 11a and the dielectric layer 13a on the first interlayer insulating film 10 are influenced based on whether or not the NH₃ plasma process is applied to the first interlayer insulating film 10. In this case, a (111) plane appears from the Pt film formed on a Ti (002) plane, and a (111) plane appears from the Pt film formed on a TiO₂ (200) plane. The Ti (002) plane becomes the TiO₂ (200) plane by the oxidation. Also, a (222) plane is equivalent to the (111) plane.

TABLE 2

Comparison of orientation intensities of the lower electrode and PZT based on NH₃ plasma process application

| | NH₃-PLA | Ti(002) | TiO₂(200) | Pt(222) | PZT(222) |
|---|---|---|---|---|---|
| Prior Art | not applied | 1104 | 718 | 39849 | 5000 |
| Improvement | applied | 13435 | 4068 | 199909 | 15000 |

According to Table 2, it is appreciated that, since the NH₃ plasma process is applied to the insulating film, the orientation intensities of Ti(002), TiO₂(200) formed on the insulating film can be improved drastically, then the orientation characteristic of Pt formed on the titanium oxide film can be improved, and finally PZT formed on the Pt film is also influenced.

Also, when it was examined how surface roughness, i.e., flatness of the TiO₂ film on the insulating film is improved by exposing the insulating film to the NH₃ plasma, results shown in Table 3 were obtained, showing that the NH₃ plasma can suppress the surface roughness.

TABLE 3

Comparison of flatness of TiO₂ based on NH₃ plasma process application (AFM measured results)

| | NH₃-PLA | Flatness of TiO₂ (μm) |
|---|---|---|
| Prior Art | not applied | 2.328 |
| Improvement | applied | 1.712 |

According to Table 2 and Table 3, it was found that the NH₃ plasma process applied to the surface of the insulating film can attain improvement in both the flatness and the orientation of the TiO₂ film formed thereon. This is similarly applied to the Ti film.

For some time past, the flatness is regarded as important in the underlying layer of the Pt film.

According to the present invention, it was found that the NH₃ plasma process has effects of improving both the flatness and the orientation of the underlying layer of the Pt film.

Meanwhile, in some cases reduction in the effect of the NH₃ plasma process is found in the insulating film that has been subjected to the NH₃ plasma process. In order to detect the cause for such reduction in the effect of the NH₃ plasma process, the inventors of the present invention made following experiments.

Figure 4:
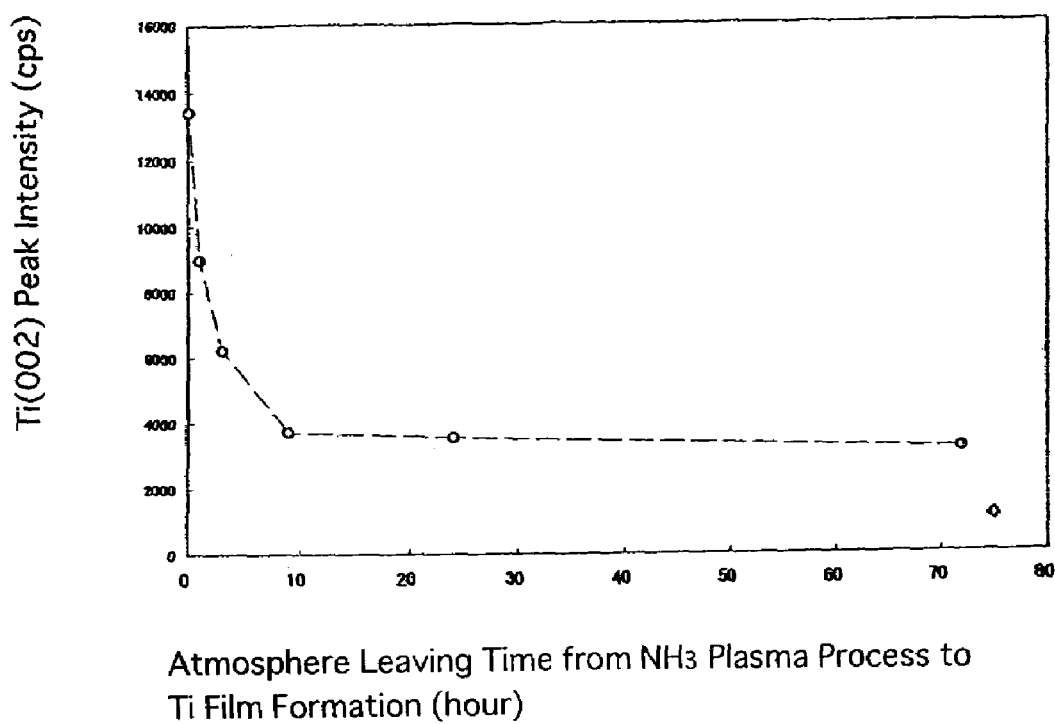
FIG. 4 is a view showing an atmosphere leaving dependence of an insulating film, which is processed by the first embodiment of the present invention, from the $NH_3$ plasma process to the Ti film formation.

First, as shown in FIG. 4, it became apparent by the experiment that the insulating film that was processed by the NH₃ plasma has an atmosphere leaving time dependence and that, if an atmosphere leaving time from the NH₃ plasma process to the formation of the Ti film is extended, reduction in such effect is caused.

Therefore, plural types of samples were prepared and then experiments described as follows were made.

As a first sample, the surface of the insulating film formed over the silicon substrate was processed by the NH₃ plasma, and then the Ti film was formed on the insulating film not to leave in the atmosphere. As a second sample, the surface of the insulating film formed over the silicon substrate was processed by the NH₃ plasma, then the resultant structure was left in the atmosphere for 24 hours, and then the Ti film was formed on the insulating film. As a third sample, the surface of the insulating film formed over the silicon substrate was processed by the NH₃ plasma, then the resultant structure was left in the atmosphere for 24 hours, then IPA (isopropyl alcohol) is coated on the insulating film by using a coater and then is dried, and then the Ti film was formed on the insulating film.

In this case, as the conditions for the NH₃ plasma process, a flow rate of the NH₃ gas introduced into the plasma generating chamber is set to 250 sccm, a pressure in the chamber is set to 4 Torr, a substrate temperature is set to 400° C., a power of the RF power supply supplied to the substrate is set to 100 W, a power of the RF power supply supplied to the plasma generating area is set to 55 W, a distance between the electrode—the first interlayer insulating film is set to 300 mils, and a plasma irradiating time is set to 10 minute.

Figure 5:
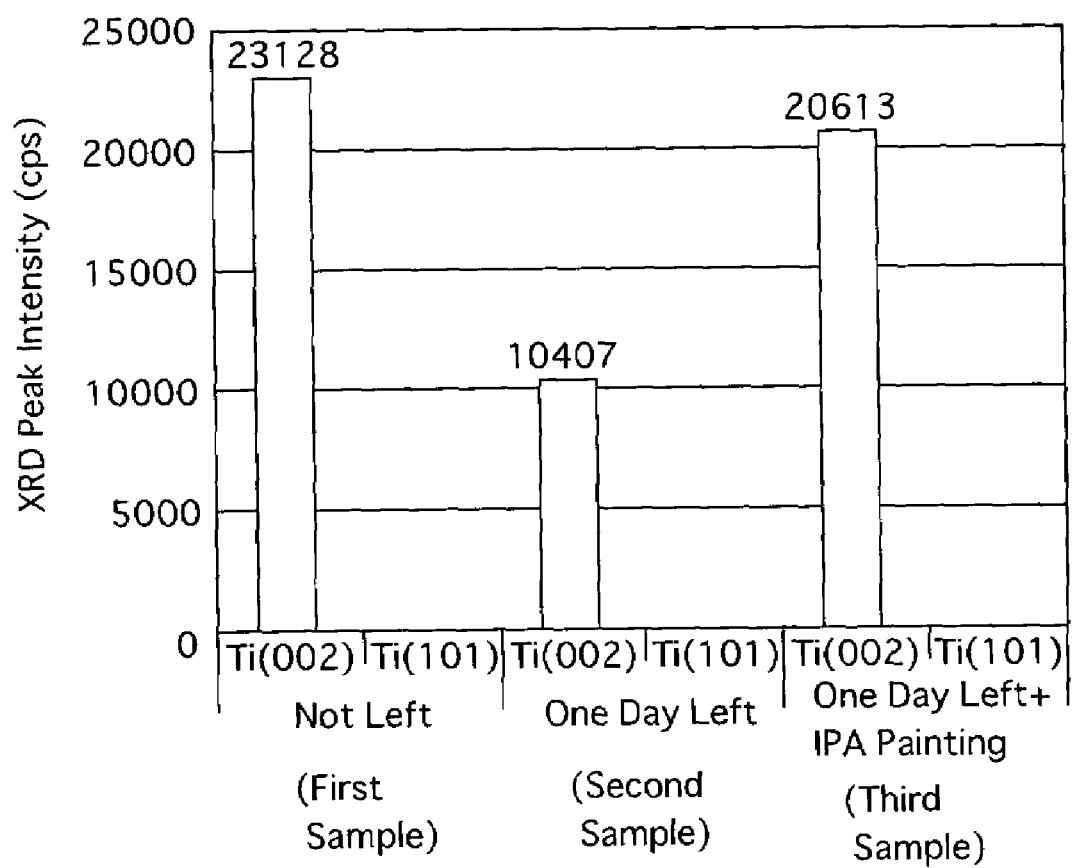
FIG. 5 is a view showing a reviving process dependence of an insulating film, which is processed by the first embodiment of the present invention, after such film is left after the $NH_3$ plasma process.

Then, as shown in FIG. 5, the (002) orientation intensities of respective Ti films in the first to third samples were measured by the X-ray diffraction method (XRD). At this time, respective results were derived such that the (002) orientation intensity was enhanced in the first sample, the (002) orientation intensity was lowered extremely in the second sample, and the (002) orientation intensity was recovered in the third sample.

In addition, other samples were prepared and then experiments described as follows were made.

As a fourth sample, the surface of the insulating film formed over the silicon substrate was processed by the $NH_3$ plasma, and then the Ti film was formed on the insulating film not to leave in the atmosphere. As a fifth sample, the surface of the insulating film formed over the silicon substrate was processed by the $NH_3$ plasma, then the resultant structure was left in the atmosphere for 24 hours, and then the Ti film was formed on the insulating film. As a sixth sample, the surface of the insulating film formed over the silicon substrate was processed by the $NH_3$ plasma, then the surface jet scriber (SJ) process using the water is applied to the surface of the insulating film that was exposed to the $NH_3$ plasma, and then the Ti film was formed on the insulating film.

In this case, as the conditions for the $NH_3$ plasma process, the same conditions as those for the $NH_3$ plasma process, which was applied to form the sample 1 to the sample 3, are set except the processing time. The processing time was 1 minute.

Figure 6:
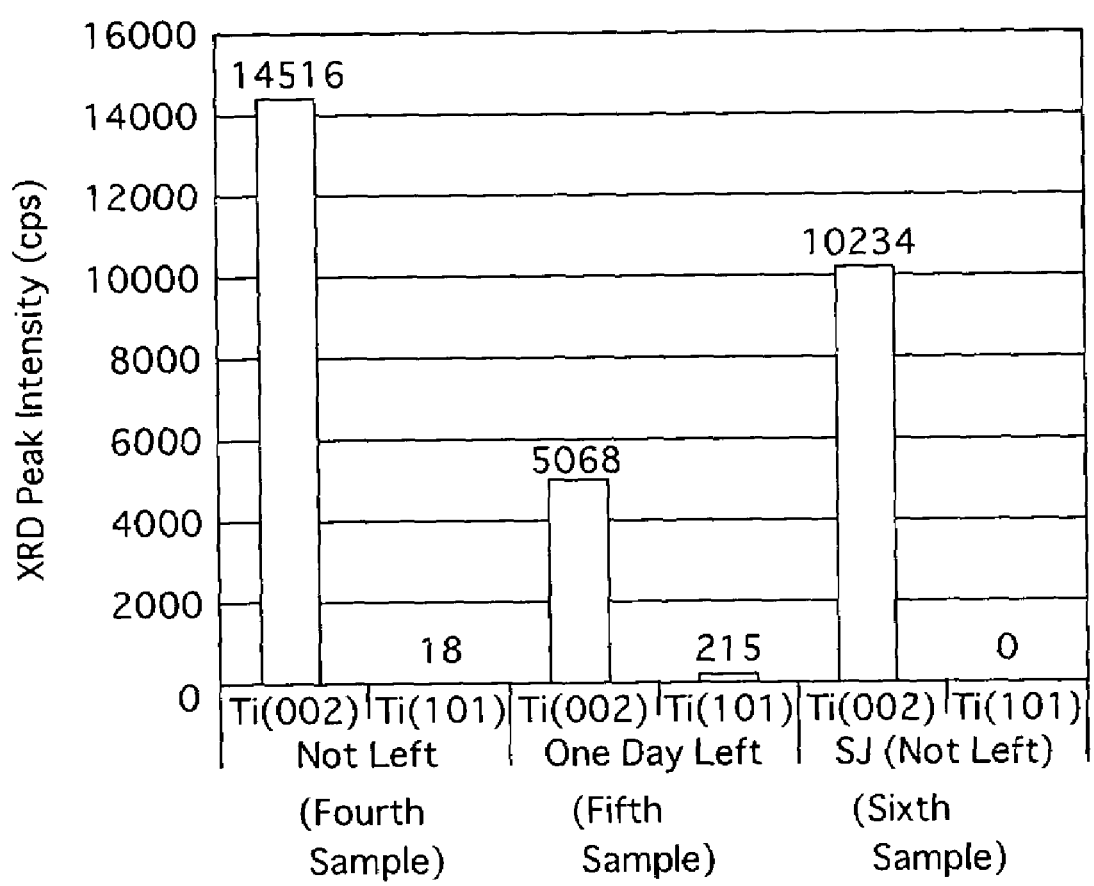
FIG. 6 is a view showing an $H_2O$ dependence of an insulating film, which is processed by the first embodiment of the present invention, after such film is left after the $NH_3$ plasma process.

Then, as shown in FIG. 6, the (002) orientation intensities of respective Ti films in the fourth to sixth samples were measured by the XRD. At this time, it was understood that the Ti(002) orientation intensity in the sixth sample is extremely lowered rather than the Ti(002) orientation intensity in the fourth sample. However, the Ti(002) orientation intensity in the sixth sample is increased higher than the Ti(002) orientation intensity in the fifth sample.

In this case, if the fourth sample is compared with the above first sample, the Ti(002) orientation intensities of these samples are different. This is due to differences in the $NH_3$ plasma processing time, and there is no difference in the essential effects.

Based on the measured results in FIG. 5 and FIG. 6, it is supposed that the cause for deterioration of the insulating film, which was exposed to the $NH_3$ plasma, due to the leaving in the atmosphere is the moisture in the atmosphere.

That is, as shown in FIG. 5, the surface of the insulating film that was exposed to the atmosphere after the $NH_3$ plasma process was revived by the IPA process. As the reason for this, it may be supposed that $H_2O$ molecules are adhered to the surface of the insulating film by leaving the structure in the atmosphere, then $H_2O$ adhered to the surface of the insulating film is absorbed by IPA and then is dried, and then $H_2O$ on the surface is decreased to revive the orientation.

Also, in FIG. 6, it may be considered that the $H_2O$ molecules are adhered to the surface of the insulating film by the surface jet scriber (SJ process) to produce the artificial atmosphere leaving condition, and thus the orientation characteristic of the Ti film formed on the insulating film is lowered.

According to the above results, it is concluded that the moisture in the atmosphere has an influence on the deterioration of the insulating film, which was exposed to the $NH_3$ plasma, caused by leaving the insulating film in the atmosphere. Therefore, the inventors of the present invention thought out that the deterioration of the Ti film can be prevented if the substrate (wafer) having the insulating film, which was exposed to the $NH_3$ plasma, is held in a vacuum atmosphere not to leave in the atmosphere for a long time before the Ti film is formed, and then made the experiment. According to such experiment, results shown in FIG. 7 were obtained. The Ti films given under an abscissa in FIG. 7 were formed on the insulating film that was put in the conditions set forth under the abscissa. Also, these insulating films were processed by the $NH_3$ plasma before they were put in the conditions recited under the abscissa.

Figure 7:
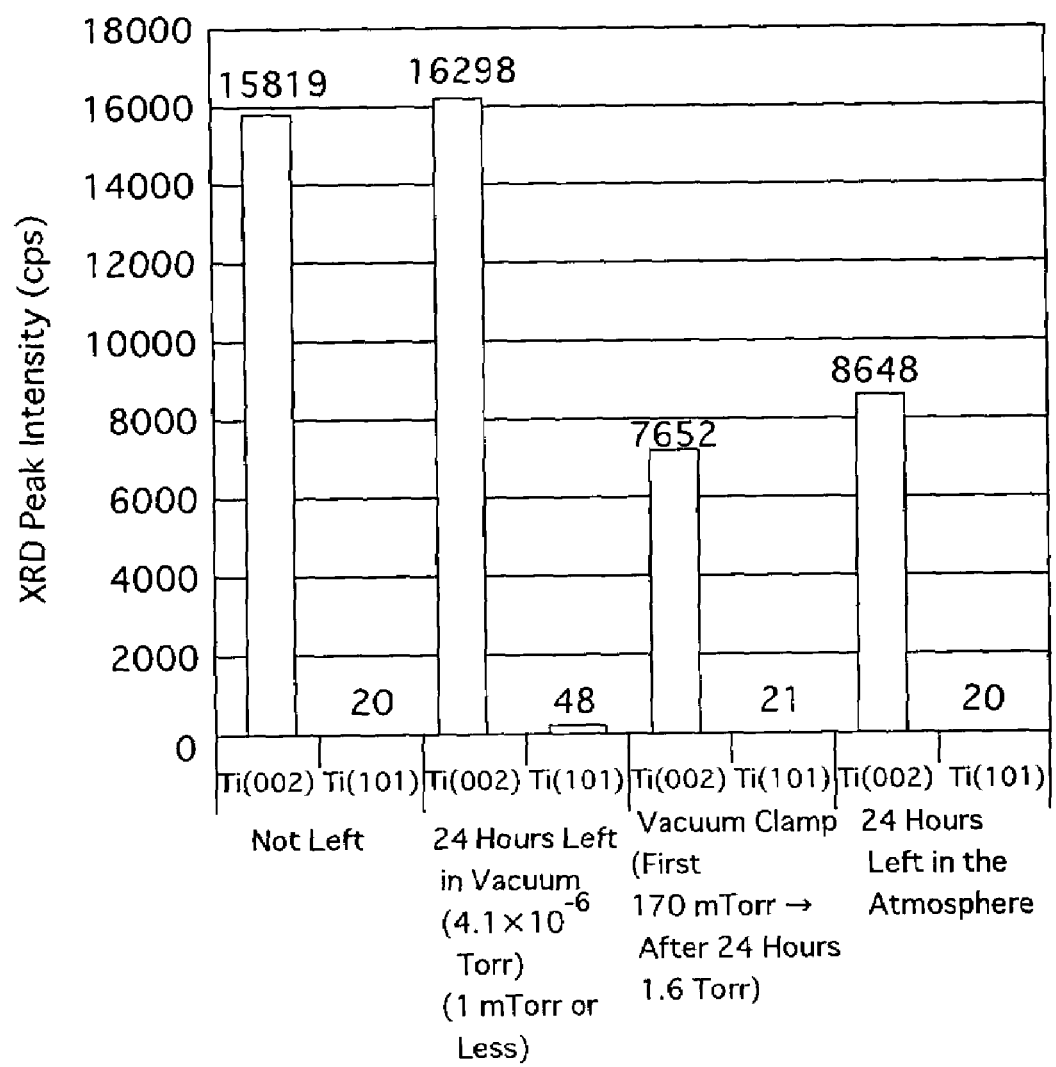
FIG. 7 is a view showing an atmospheric pressure dependency of an insulating film, which is processed by the first embodiment of the present invention, after such film is left after the $NH_3$ plasma process.

According to FIG. 7, it was found that if the insulating film is kept to be held in a high vacuum atmosphere such as $4.1 \times 10^{-6}$ Torr after the $NH_3$ plasma process is applied, the (002) orientation intensity of the Ti film can maintain the high value.

However, it was also found that if the insulating film that was exposed to the $NH_3$ plasma is held in a low vacuum atmosphere such as 170 mTorr and then is left for a long time as it is without the vacuum suction, the (002) orientation intensity of the Ti film, which is formed on the insulating film after the leaving, is deteriorated into the state that has little difference from the atmosphere leaving state. In other words, it is appreciated that a slight leakage of the gas into the vacuum atmosphere can act as the cause to deteriorate the orientation of the Ti film.

Also, according to the results in FIG. 7, it was found that the substances that exist in the atmosphere lead to the deterioration of the orientation characteristic of the Ti film. According to the experimental results in FIG. 7 and the experimental results in FIG. 5 and FIG. 6 in combination, it can be said that there is the very fair possibility that the moisture in the atmosphere participates in superiority or inferiority of the surface condition of the insulating film that was processed by the $NH_3$ plasma.

As can be seen from these results, processes should be executed in the vacuum as possible until the Ti film is formed after the $NH_3$ plasma process is applied to the surface of the insulating film. If, unfortunately, such processes cannot be executed in the vacuum, the Ti film should be formed on the surface as soon as possible after the surface of the insulating film is exposed to the $NH_3$ plasma or, alternatively, the IPA process should be added prior to the Ti film formation after the surface is left as it is in the atmosphere.

Figure 8:
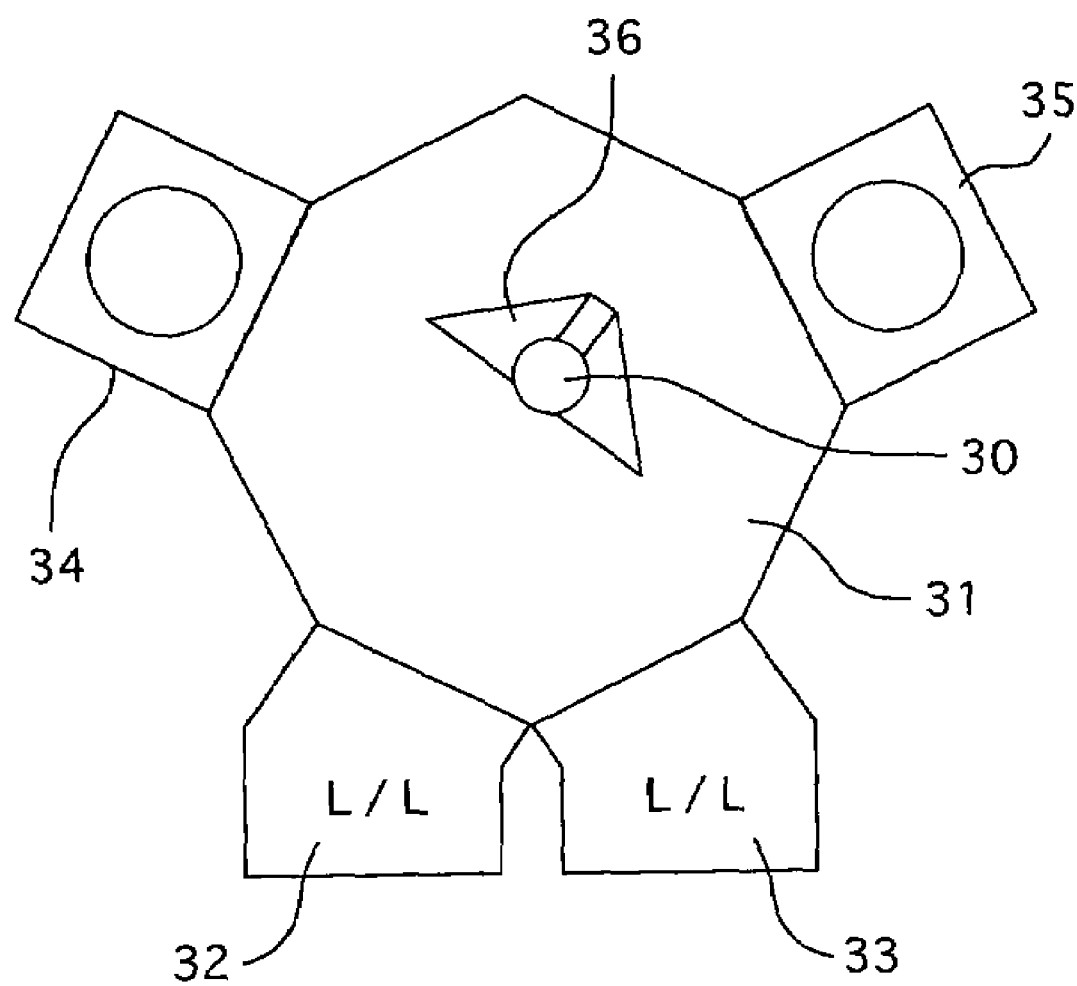
FIG. 8 is a configurative view of the equipment that is used in the embodiment of the present invention to execute the $NH_3$ plasma process and the Ti formation.

An example of the equipment that is used to form the Ti film on the insulating film without exposure of the insulating film to the atmosphere after the $NH_3$ plasma process is applied to the surface of the insulating film is shown in FIG. 8.

In FIG. 8, a loading chamber 32, an unloading chamber 33, a plasma generating chamber 34 for the $NH_3$ plasma process, and a sputter chamber 35 for titanium formation are connected to a vacuum transfer chamber 31. Also, a robot 36 for carrying a wafer (semiconductor substrate) 30 is fitted to the inside of the vacuum transfer chamber 31.

The interior of the vacuum transfer chamber 31 is maintained in the vacuum state such as $1 \times 10^{-3}$ Torr, for example. Also, the loading chamber 32, the unloading chamber 33, the plasma generating chamber 34, and the sputter chamber 35 are set to the predetermined vacuum state.

The insulating film is formed on the wafer 30 that is carried into the loading chamber 32. Then, the wafer 30 in the loading chamber 32 is carried into the plasma generating chamber 34 by using the robot 36. The $NH_3$ gas is introduced into the plasma generating chamber 34 and then the plasma is generated under the above conditions, so that the insulating film is exposed to the $NH_3$ plasma. Then, the robot 36 transfers the wafer 30 into the sputter chamber 35 via the vacuum transfer chamber 31 after the plasma process of the insulating film is finished. Then, the Ti film is formed on the insulating film in the sputter chamber 35 under the above conditions. Then, the robot 36 transfers the wafer 30 to the unloading chamber 33 via the vacuum transfer chamber 31 after the formation of the Ti film is finished.

As a result, the titanium is formed on the insulating film without the exposure to the atmosphere after the insulating film is exposed to the $NH_3$ plasma.

In this case, it is preferable that the first conductive layer 12 should be formed on the intermediate layer 11 not to expose the substrate to the atmosphere after the intermediate layer 11 such as titanium is formed.

Figure 9:
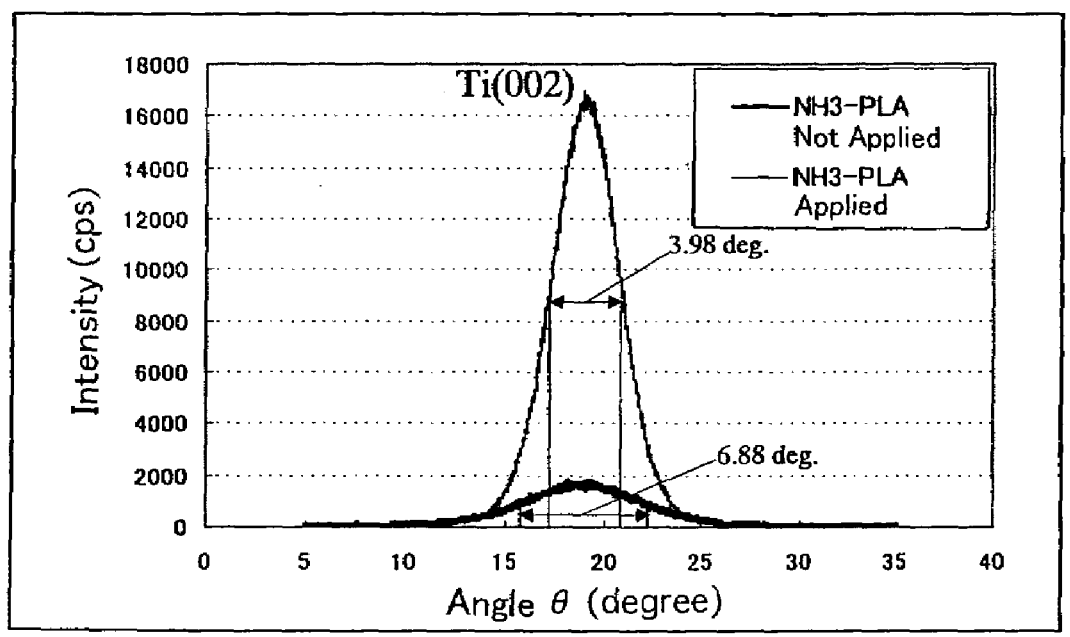
FIG. 9 is a view showing an XRD rocking curve of a Ti film formed on an $SiO_2$ film in connection with whether or not the $NH_3$ plasma process is applied to the $SiO_2$ film.

Next, when (002) rocking curves of a first Ti film, which is formed on the insulating film that was processed by the $NH_3$ plasma, and a second Ti film, which is formed on the insulating film that was not processed by the $NH_3$ plasma, were measured respectively, results shown in FIG. 9 were derived. As for the peak indicating the (002) orientation, the peak of the first Ti film became extremely higher than the peak of the second Ti film. In addition, when half widths of the rocking curves having these peaks were detected, a half width of the first Ti film became narrow such as 3.98 and a half width of the second Ti film became wide such as 6.88.

Therefore, it was understood that the (002) orientations of the first Ti film formed on the insulating film that was processed by the $NH_3$ plasma have no variation and are uniform clearly, and thus the orientation characteristic can be largely improved rather than the prior art.

In this case, FIG. 9 shows the rocking curves that were measured by XRD using the three-circle goniometer. Such rocking curves were measured by first fixing 2θ to a peak position of Ti(002) near 38.4 in the 2θ/θ measurement and then swinging θ from 5 to 35 Here, measured results of respective rocking widths of the (111) orientation of the Pt film formed on the Ti film and the (111) orientation of the PZT film formed on the Pt film, in addition to the Ti film formed on the insulating film, according to whether or the $NH_3$ plasma process is applied to the insulating film, are shown in Table 4.

According to Table 4, it was understood that an angle of the Pt film and the PZT film formed on the insulating film, which was subjected to the $NH_3$ plasma process, to the (111) orientation substrate surface becomes smaller than an angle of the Pt film and the PZT film formed on the insulating film, which was not subjected to the $NH_3$ plasma process, to the same.

TABLE 1

Rocking widths of the lower electrode and PZT according to $NH_3$-PLA application (χ scan measurement)

| | $NH_3$-PLA | Ti | TiO2 | Pt(111) | PZT(111) |
|---|---|---|---|---|---|
| Prior Art (degree) | not applied | 6.88* | — | 5.45 | 8.98 |
| Improvement (degree) | applied | 3.98* | — | 2.97 | 4.15 |

*half width in θ scan measurement

Next, the experiment executed to examine such a mechanism that the Ti orientation intensity is increased when the Ti film is formed on the insulating film to which the $NH_3$ plasma process was applied will be explained hereunder.

Figure 10:
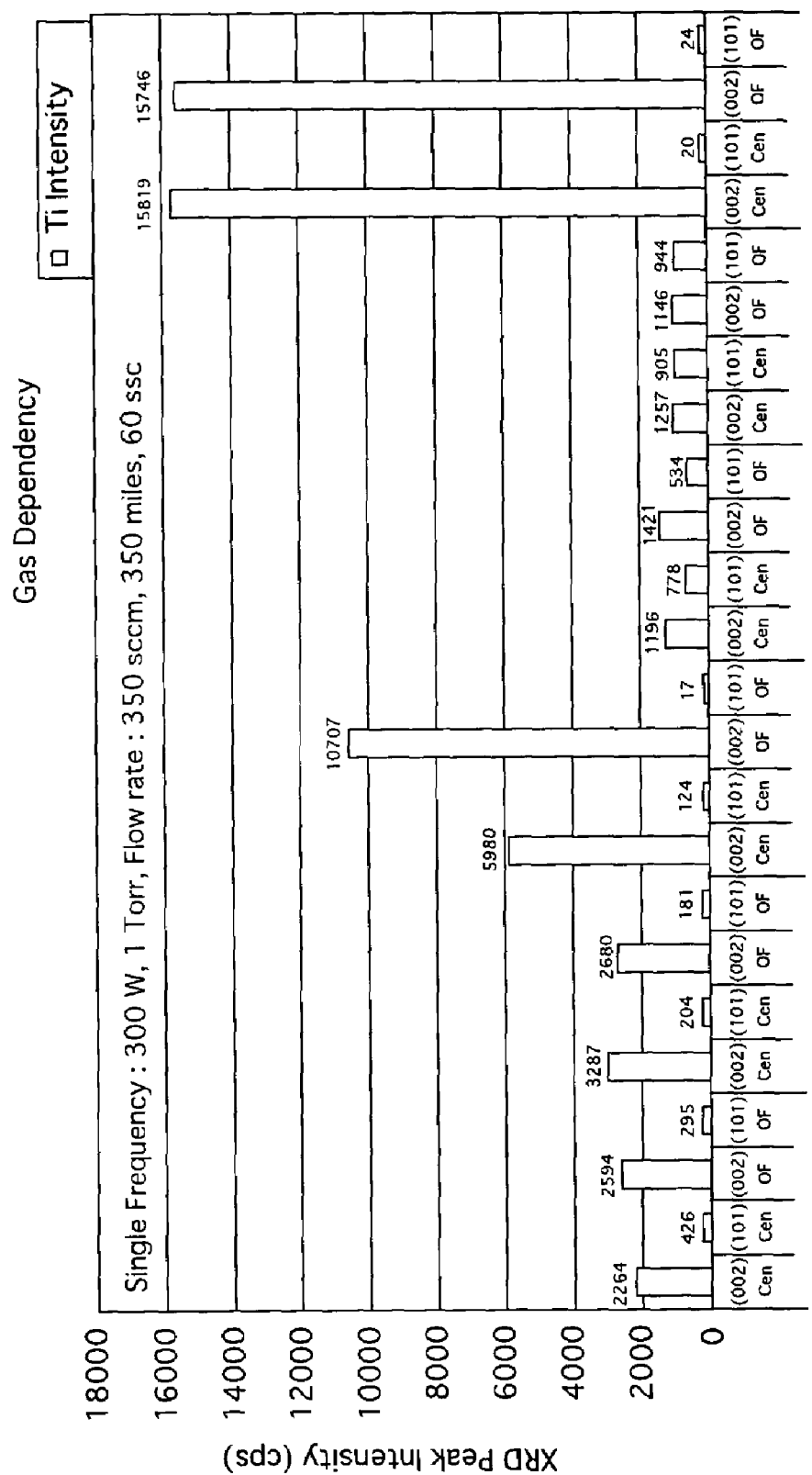
FIG. 10 is a view showing compared results of a Ti orientation intensity when various gases are employed.

First, the plasma process was applied to the insulating film made of PE-TEOS on the silicon substrate by using six types of gases, and then the Ti film was formed on the insulating film. Then, when the orientation intensity of the Ti film was examined by XRD, relationships between six types of gases in the plasma and the XRD peak intensity of the Ti film shown in FIG. 10 were derived.

As a result, the gases having the suitable effect were $N_2$ and $NH_3$. In particular, $NH_3$ has a small difference between the center (Cen) and the periphery (OF) of the wafer, and has the very high (002) orientation intensity in contrast to other gases. The second high intensity is given by $N_2$. A difference is generated in the in-plane distribution by $N_2$, and the orientation intensity is enhanced in the periphery of the wafer. As the reason for this, it may be supposed that the hydrogen emitted from the side wall of the chamber enters into the plasma to exert the same action as the effect, which can be achieved by using the $NH_3$ gas, in a pseudo manner. In addition, the worse result of the (002) orientation was obtained by $O_2$ or $N_2O$, which contains the oxygen, in contrast to other gases.

Based on these results, it was found that the gas that does not contain the oxygen and contains the nitrogen is good and thus the Ti (002) orientation intensity can be enhanced by the plasma using such gas. Also, it is possible to say that, since the best result can be attained by $NH_3$, the gas that contains N and H is effective.

Also, as one of mechanism analyses, two types of wafers in which the $NH_3$ plasma process was applied and not applied to the $SiO_2$ substrate respectively were prepared, and then the Fourier transform infrared spectrophotometer (FT-IR) measurement was executed. Results are shown in FIG. 11.

Figure 11:
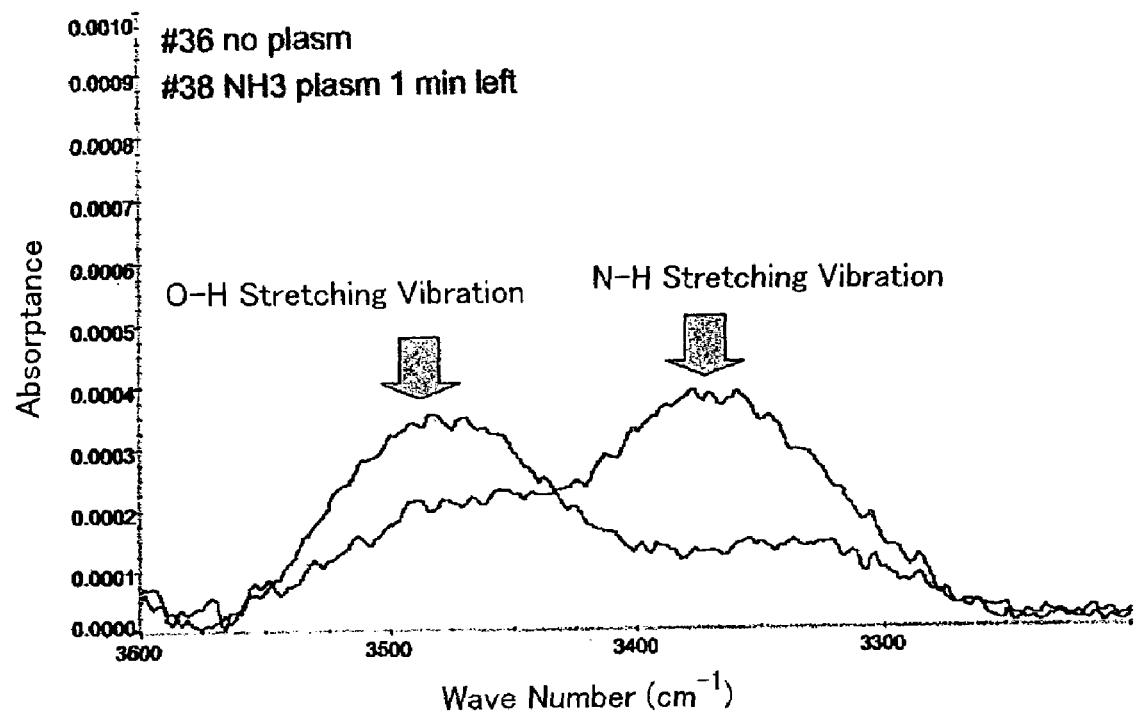
FIG. 11 is a view showing change in the bonded state of elements in the $SiO_2$ film based on whether or not the $NH_3$ plasma process is applied.

According to FIG. 11, it was found that if the $NH_3$ plasma process is applied to the $SiO_2$ substrate, the O—H bond in $SiO_2$ is reduced and the N—H bond is increased. From this result and the results in FIG. 10, a following mechanism may be considered.

Figure 12A:
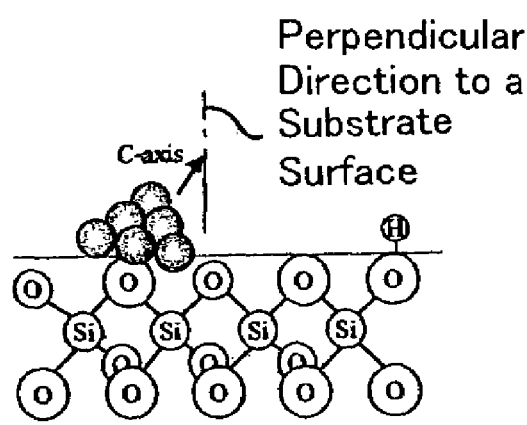
FIGS. 12A and 12B are views showing an atomic model indicating the Ti growing process based on whether or not the $NH_3$ plasma process is applied, respectively.

That is, as shown in FIG. 12A, it may be supposed that, in the $SiO_2$ film that did not receive the $NH_3$ plasma process, the oxygen (O) atom appears from the surface, the oxygen (O) and the titanium (Ti) are ready to bond, the Ti migration is difficult to occur, and thus the c-axis of Ti is deviated from the perpendicular direction to the substrate surface. In the experimental results in FIG. 10 obtained when the gas seeds are changed, it may be supposed that the phenomenon of reducing the orientation intensity of the Ti film at the time when the plasma is generated in the gas ($N_2O$ or $O_2$) atmosphere that contains the oxygen is caused because the O—H group on the surface of the $SiO_2$ film is reduced and the density of the O atom that appears from the surface is increased.

Figure 12B:
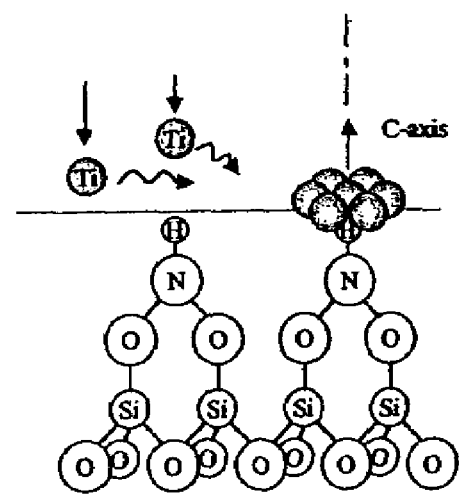

In contrast, as shown in FIG. 12B, it may be supposed that, if the $NH_3$ plasma process is applied to the $SiO_2$ surface, the nitrogen (N) is bonded to O that exits near the surface and another bond of N on the surface is terminated by H. Therefore, the reactivity of the $SiO_2$ surface with Ti is lowered. It may be considered that this action can cause the Ti migration to easily generate and can cause the c-axis to stand in the perpendicular direction to the substrate surface.

In this case, H is desorbed from the $SiO_2$ film surface as a thickness of Ti is increased, and finally H is not left in the Ti film.

Meanwhile, based on the above considerations, it may also be considered that, in order to increase the N—H bond, the nitrogen ($N_2$) gas and the hydrogen ($H_2$) gas are introduced into the plasma generating chamber without use of the $NH_3$ gas. Therefore, a plurality of samples in which the Ti film is formed on the insulating film after the $SiO_2$ insulating film is exposed to the $N_2$ and $H_2$ plasmas were manufactured. These samples were formed under the same conditions except that a flow rate of the $H_2$ gas out of the $N_2$ gas and the $H_2$ gas, which are introduced into the plasma generating chamber, is differentiated respectively. In addition, the sample in which the Ti film is formed on the insulating film to which the $NH_3$ plasma process is applied was also manufactured.

Figure 13:
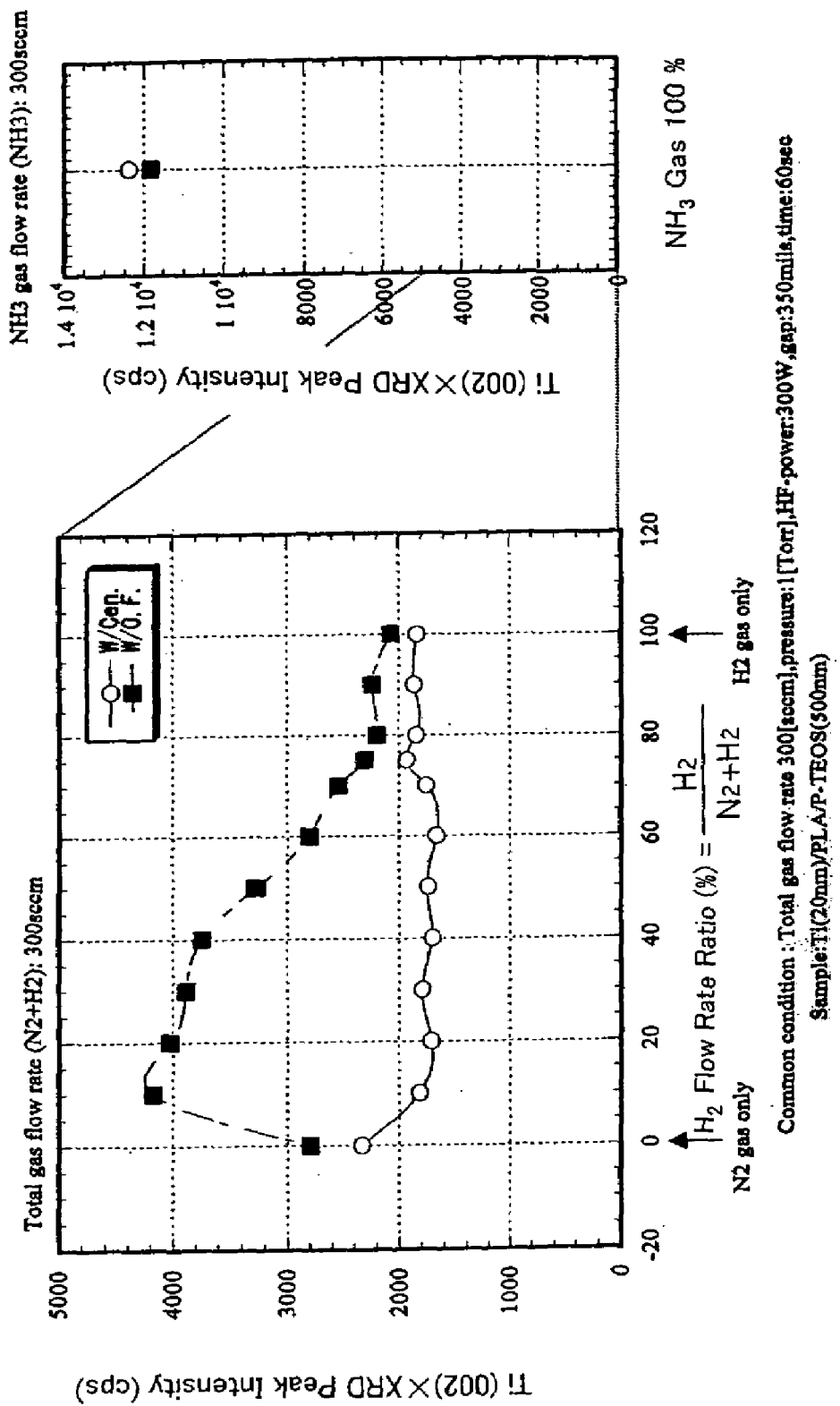
FIG. 13 is a view showing a (002) orientation intensity of the Ti film on the $SiO_2$ film that is processed by the ($N_2+H_2$) plasma, and a (002) orientation intensity of the Ti film on the $SiO_2$ film that is processed by the $NH_3$ plasma.

When the (002) orientation intensity of the Ti film in these samples was examined by XRD, results shown in FIG. 13 were derived.

According to FIG. 13, it was found that all the samples that were produced by using the ($N_2+H_2$) plasma have the low (002) orientation intensity of the Ti film rather than the samples that were produced by using the $NH_3$ plasma. Hence, it can be said that, in order to form the N—H bond on the surface of the $SiO_2$ film prior to the formation of the Ti film, the drastic effect can be attained if the gas containing the molecules like $NH_3$, in which N and H are bonded, is employed. In this case, if the $N_2+H_2$ plasma is employed, the peak of the (002) orientation intensity became high in vicinity of the periphery of the wafer by introducing $H_2$ into the chamber by a minute amount of about 10%.

Figure 14:
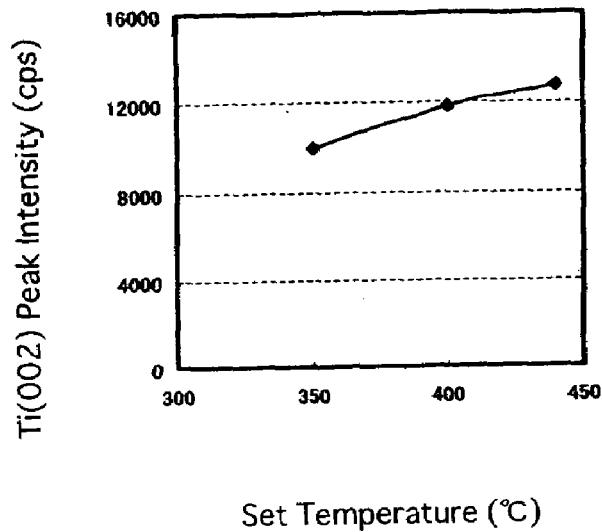
FIG. 14 is a view showing a relationship between a substrate temperature at the time of the $NH_3$ plasma process of the insulating film and a (002) orientation intensity of the Ti film on the insulating film.

By the way, it is preferable that, in order to form many N—H bonds on the surface of the $SiO_2$ film, a reaction rate should be accelerated by increasing the substrate temperature, as shown in FIG. 14.

In this case, in the experiment to get the results shown in FIG. 14, as the conditions for the $NH_3$ plasma process applied to the $SiO_2$ film, a flow rate of the $NH_3$ gas introduced into the plasma generating chamber is set to 250 scan, a pressure in the chamber is set to 4 Torr, a power of the RF power supply supplied to the substrate is set to 100 W, a power of the RF power supply supplied to the plasma generating area is set to 55 W, a distance between the electrode—the first interlayer insulating film is set to 300 mils, a plasma irradiating time is set to 1 minute, and a substrate temperature was changed.

Figure 15:
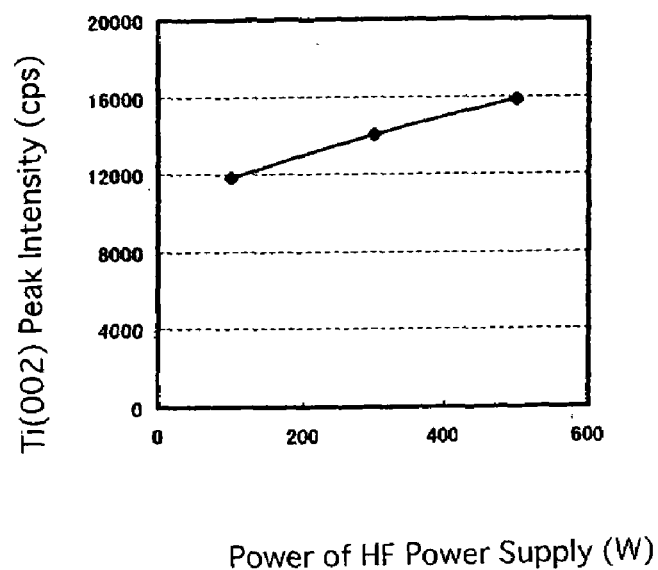
FIG. 15 is a view showing a relationship between a substrate power strength at the time of the $NH_3$ plasma process of the insulating film and a (002) orientation intensity of the Ti film on the insulating film.

Also, as shown in FIG. 15, if the power of the HF power supply of 13.56 MHz supplied to the substrate is increased, the Ti (002) orientation intensity can be increased even when decomposition of the $NH_3$ gas is accelerated.

In this case, in the experiment to get the results shown in FIG. 15, as the conditions for the $NH_3$ plasma process applied to the $SiO_2$ film, a flow rate of the $NH_3$ gas introduced into the plasma generating chamber is set to 250 scam, a pressure in the chamber is set to 4 Torr, a substrate temperature is set to 400° C., a power of the RF power supply supplied to the plasma generating area is set to 55 W, a distance between the electrode—the first interlayer insulating film is set to 300 mils, a plasma irradiating time is set to 1 minute, and a power of the RF power supply supplied to the substrate is changed.

Figure 16:
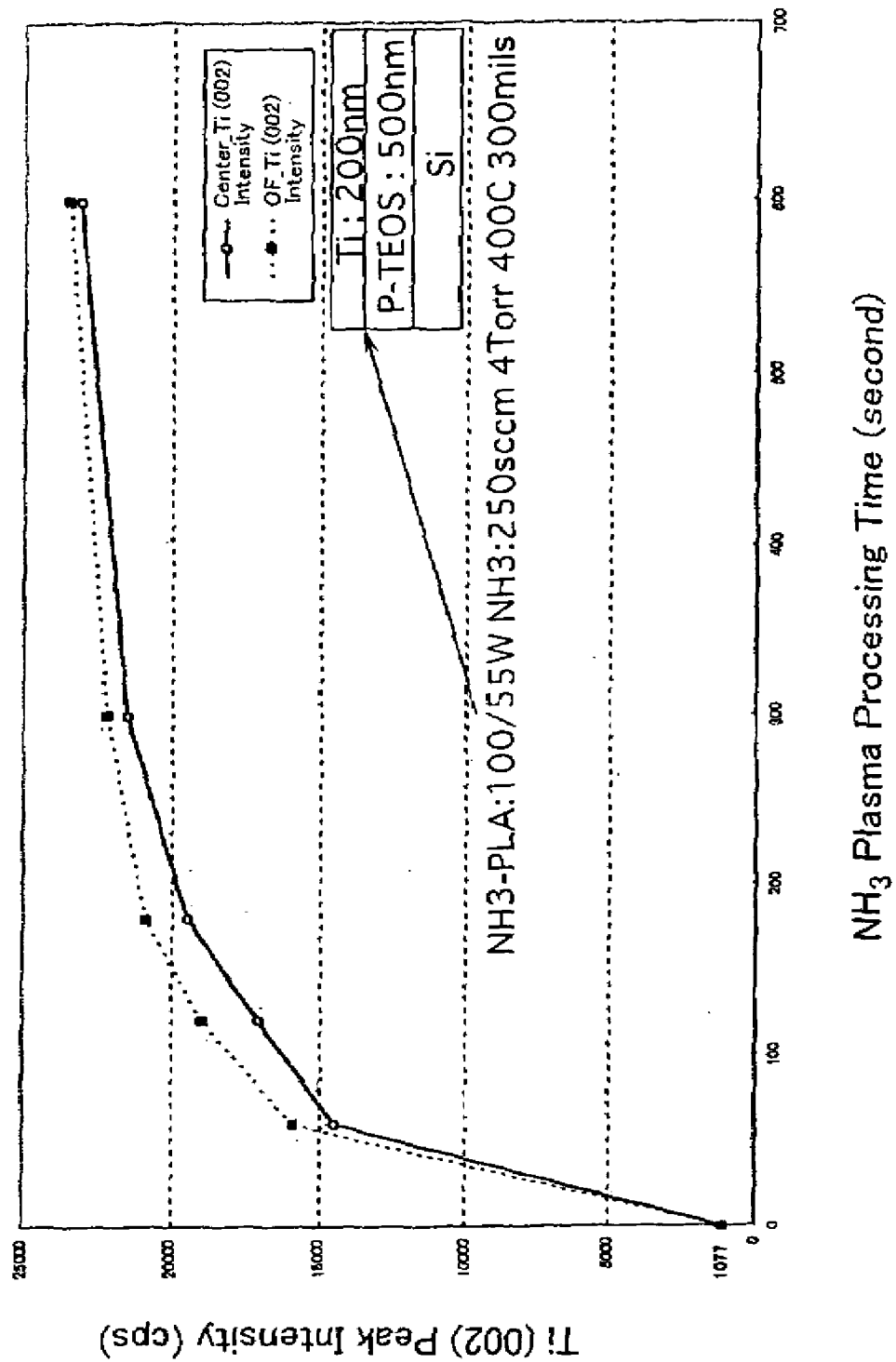
FIG. 16 is a view showing a relationship between an $NH_3$ plasma processing time of the insulating film and a (002) orientation intensity of the Ti film on the insulating film that is processed by the $NH_3$ plasma.

Also, as shown in FIG. 16, it was found that the Ti (002) orientation intensity on the $SiO_2$ film is enhanced as a time during when the $SiO_2$ film is exposed to the $NH_3$ plasma is prolonged.

In this case, in the experiment to get the results shown in FIG. 16, as the conditions for the $NH_3$ plasma process applied to the $SiO_2$ film, a flow rate of the $NH_3$ gas introduced into the plasma generating chamber is set to 250 sccm, a pressure in the chamber is set to 4 Torr, a substrate temperature is set to 400° C., a power of the RF power supply supplied to the substrate is set to 100 W, a power of the RF power supply supplied to the plasma generating area is set to 55 W, a distance between the electrode—the first interlayer insulating film is set to 300 mils, and a plasma irradiating time was changed.

According to the above experimental results, the N—H bonds on the surface of the $SiO_2$ insulating film can be increased effectively by accelerating the $NH_3$ decomposition in the plasma, increasing the substrate temperature to increase the reaction rate, and prolonging the $NH_3$ plasma processing time. As a result, the Ti (002) orientation intensity on the $SiO_2$ insulating film can be enhanced.

If the substance is formed on the (002) of the Ti film whose orientation is made uniform, such substance has good orientation owing to the orientation of the Ti film. If the conductive film made of noble metal such as platinum, iridium, iridium oxide, or the like or noble metal oxide, for example, is formed as such substance, the (111) orientation intensity of the conductive film to the perpendicular direction to the substrate surface can be enhanced. In addition, if the above ferroelectric film such as PZT, or the like is formed on such conductive film having the good orientation characteristic, the (111) orientation intensity of the ferroelectric film to the perpendicular direction to the substrate surface can also be enhanced.

Above table 2 indicates an example in which, although the step of oxidizing the Ti film is employed, the crystallinity of the PZT film on the $TiO_x$ film is improved under the influence of the orientation of the Ti film. Various applications may be thought of other than this.

As the layer structure of the lower electrode of the FeRAM using the next generation 0.18 μm line width, the Ir/Ti structure is studied.

If the interlayer insulating film as the underlying film is exposed to the $NH_3$ plasma prior to the formation of the Ti film serving as the lower electrode, the orientation of the Ti film is improved and then the Ir film, which is formed on the Ti film, has also the good orientation because of the good orientation of the underlying Ti film.

In other words, the orientation of the Ti film is improved on the first interlayer insulating film 10 that was exposed to the $NH_3$ plasma, and the orientation of the titanium oxide ($Ti_x$ or $Ti_2$) film, which is obtained by oxidizing the Ti film, is also improved correspondingly. As a result, the (111) orientation intensity of the noble metal film such as Pt, Ir, or the like formed on the Ti film, the $Ti_x$ film, or the $Ti_2$ film is enhanced, and in addition the (111) orientation intensity of the ferroelectric film formed on the noble metal film is also enhanced.

Figure 17:
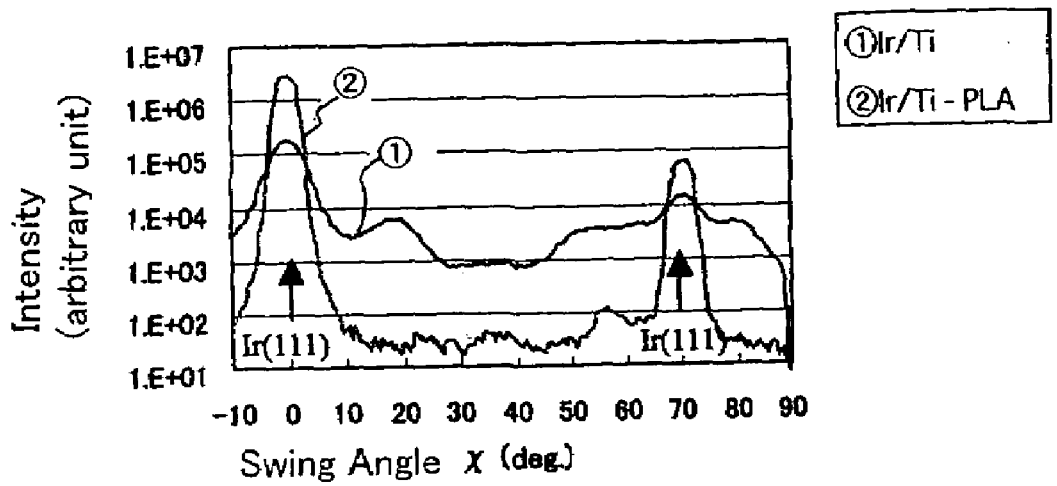
FIG. 17 is a view showing orientation characteristic rocking curves of the Ti films formed on the insulating film, which is processed by the $NH_3$ plasma, and the insulating film, which is not processed by the $NH_3$ plasma, respectively.

FIG. 17 shows how the Ir/Ti lower electrode is changed depending on whether the $NH_3$ plasma process is applied to the interlayer insulating film or not. It was found that the peak indicating the (111) orientation of the upper surface of the Ir film over the interlayer insulating film, which was subjected to the $NH_3$ plasma process (PLA), becomes large and that a half width of the peak becomes small.

FIG. 17 shows results measured by the four-circle goniometer, and shows the results measured by setting 2θ/θ around 40 as the angle of the Ir(111) plane while changing a swing angle ($\chi$). Then, the peak indicating the (111) plane appears at $\chi=0$, $\chi=90$.

Figure 18:
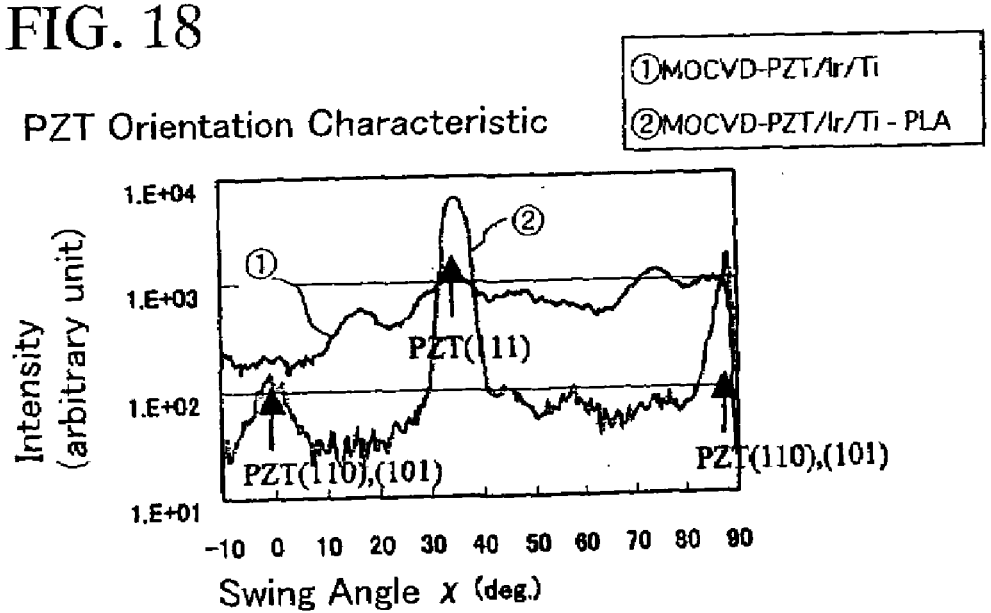
FIG. 18 is a view showing orientation characteristic rocking curves of PZT films formed on the insulating film, which is processed by the $NH_3$ plasma, and the insulating film, which is not processed by the $NH_3$ plasma, via the Ti film respectively.

Further, when the PZT film is formed on the Ir films with different orientation intensities in two types of samples, which were employed in the experimental results in FIG. 17, by the MOCVD method respectively and then the (111) orientation intensity of the PZT film was measured, results shown in FIG. 18 were derived.

According to FIG. 18, it was found that the peak indicating the (111) orientation of the upper surface of the PZT film over the interlayer insulating film, which was subjected to the $NH_3$ plasma process, via the Ir/Ti film becomes large and that a half width of the peak becomes small.

FIG. 18 shows results measured by the four-circle goniometer, and shows results measured by setting 2θ/θ around 31 as the angle between (110), (101) planes of PZT while changing a swing angle ($\chi$). Then, the strong peak at $\chi=35$ is due to the PZT (111) plane. If the $NH_3$ plasma process (PLA) is applied to the underlying interlayer insulating film of the Ti film, the (111) peak of the PZT film formed on the Ir film became strong and sharp. However, if the $NH_3$ plasma process is not applied to the interlayer insulating film, the (111) peak of the PZT film formed on the Ir film became weak and spread gently.

In addition, when the capacitors were formed by using two types of structures shown in FIG. 18 respectively and then switching charges ($Q_{SW}$) were measured, results shown in Table 5 were derived. Thus, the $Q_{SW}$ of the capacitor having the interlayer insulating film, which was processed the $NH_3$ plasma, became higher.

TABLE 5

Comparison of $Q_{sw}$ @ 1.8 V of MOCVD-PZT based on $NH_3$-PLA application

| | $Q_{sw}$ @ 1.8 V |
|---|---|
| $NH_3$-PLA not applied | 24 $\mu C/cm^2$ |
| $NH_3$-PLA applied | 31 $\mu C/cm^2$ |

Figure 19:
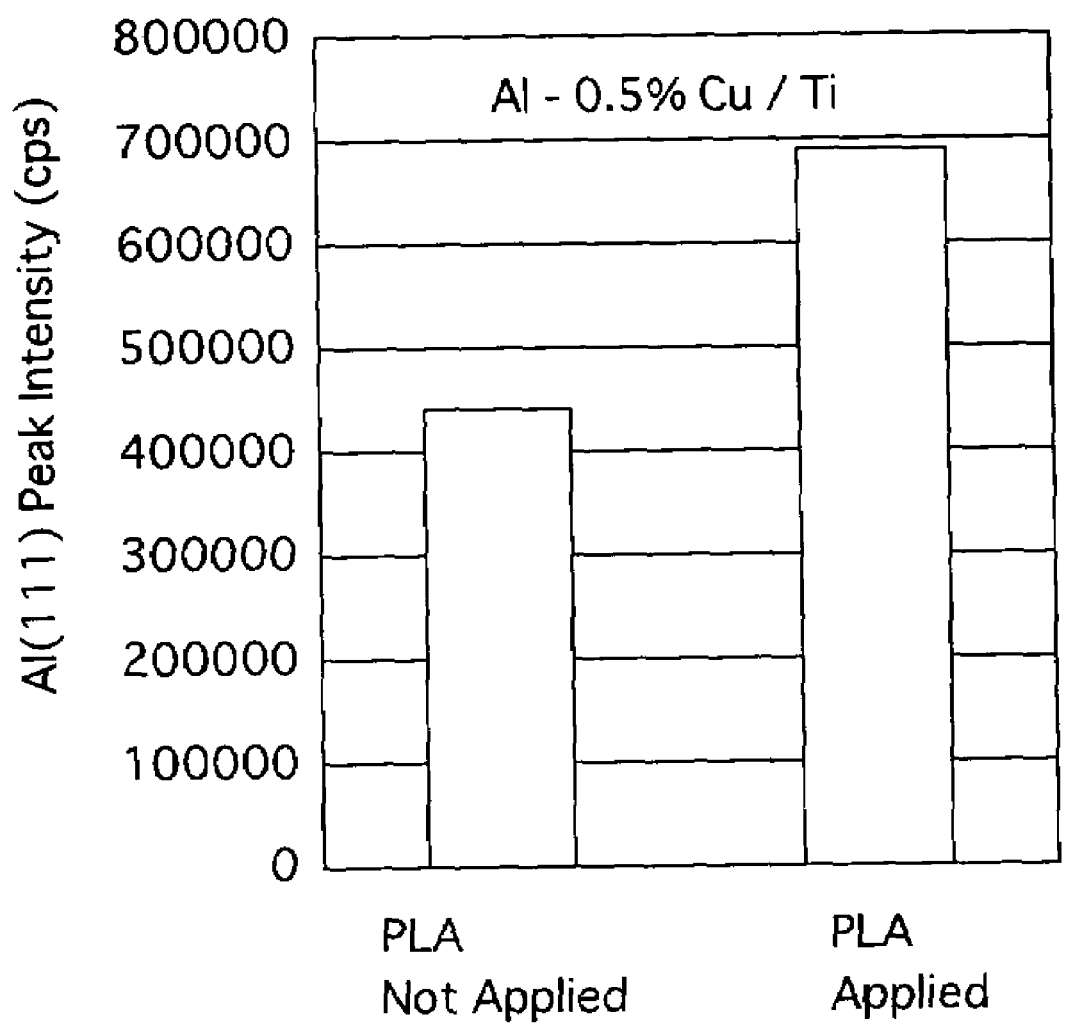
FIG. 19 is a view showing a (111) orientation intensity of Al—Cu films formed on the insulating film, which is processed by the $NH_3$ plasma, and the insulating film, which is not processed by the $NH_3$ plasma, respectively.

In this case, if the (002) orientation characteristic of the Ti film formed on the insulating film is improved by exposing the insulating film to the $NH_3$ plasma, the Al alloy can be set uniformly to (111) by forming the structure such as Al—Cu/Ti, Al—Cu/TiN/Ti, or the like on the insulating film, and also the electromigration resistance can be improved, as shown in FIG. 19.

The fact that the electromigration resistance can be increased by setting uniformly the orientation of the Al alloy to (111) is disclosed in following Literatures ①, ②. However, to expose the insulating film to the $NH_3$ plasma is not disclosed.

① M. Kageyama, K. Hashimoto and H. Onoda: Proc. $29^{th}$ Int. Reliability Physics Symp., 1991 (IEEE, New York, 1991) p. 97

② T. Mitsuzuka: Jpn. J. Appl. Phys. 31 (1992) L1280

Second Embodiment

In the first embodiment, the conditions applied to form the ferroelectric film by the sputter is explained as above. In the second embodiment, the conditions applied to form the ferroelectric film by the MOCVD method will be explained hereunder.

First, as shown in FIG. 1A, the upper surface of the first interlayer insulating film 10 is planarized by the CMP. Then, as shown in FIG. 1B, the first interlayer insulating film 10 is exposed to the $NH_3$ plasma. As the conditions for the $NH_3$ plasma process, for example, a flow rate of the $NH_3$ gas introduced into the chamber is set to 250 sccm, a pressure in the chamber is set to 4 Torr, a substrate temperature is set to 350° C., a power of the RF power supply supplied to the substrate is set to 100 W, a power of the RF power supply supplied to the plasma generating area is set to 55 W, a distance between the electrode—the first interlayer insulating film is set to 300 mils, and a plasma irradiating time is set to 1 minute.

Then, as shown in FIG. 1C, the intermediate layer 11 is formed on the first interlayer insulating film 10 that was processed by the $NH_3$ plasma. In the present embodiment, the Ti layer is formed as the intermediate layer 11 by the sputter method. The Ti intermediate layer 11 is formed by setting the substrate temperature to the room temperature to have a thickness of 10 nm.

Then, as shown in FIG. 1D, the first conductive film 12 is formed on the intermediate layer 11. In this case, in the present embodiment, the iridium film is formed as the first conductive film 12 by the sputter. The iridium film is formed to have a thickness of 200 to 400 nm, e.g., 400 nm. As the conditions to form the Ir film by the sputter, for example, a temperature of the silicon substrate 1 put into the chamber is set to about 500° C., a pressure of the argon gas introduced into the chamber is set to 0.15 Pa, iridium was used as the target, and a DC power applied between the target—the substrate is set to 2.6 kW.

Then, the PZT film of 120 nm thickness is formed as the ferroelectric film 13 on the first conductive film 12. In this case, in the present embodiment, the PZT film is formed by the MOCVD method under following conditions.

The growth temperature of the PZT film on the silicon substrate 1 put in the chamber (not shown) is set to 620° C. Then, out of the elements constituting the PZT film, $Pb(DPM)_2$ is used as the material of Pb, $Zr(dmhd)_4$ is used as the material of Zr, and $Ti(O-iPr)_2(DPM)_2$ is used as the material of Ti. These materials are supplied to a vaporizer in the liquid state in which they are dissolved in THF at a mole ratio of 3%, then are vaporized together with THF at the temperature of 260° C., for example, in the vaporizer, then are mixed with the oxygen, and then are sprayed onto the first conductive film 12 in the chamber via the shower head.

As flow rates of the material gases introduced into the chamber, the Pb material gas, the Zr material gas, and the Ti material gas are set to 0.365 ml/min, 0.196 ml/min, and 0.175 ml/min respectively in the initial growth of 20 second, and then the Pb material gas, the Zr material gas, and the Ti material gas are set to 0.376 ml/min, 0.277 ml/min, and 0.214 ml/min respectively in the subsequent period of 505 second.

A thickness of the PZT film formed under such conditions was 120 nm, and its compositions were Pb/(Zr+Ti)=1.17, Zr/(Zr+Ti)=0.43.

Since the PZT film formed by the MOCVD method is crystallized, the annealing required for the crystallization can be omitted.

In this case, when the PZT film is formed by the MOCVD method by setting the substrate temperature to 620° C., the lead (Pb) is diffused downwardly from the PZT film to form the alloy of constitutive elements of the first conductive film 12 serving as the lower electrode and Pb, which causes the leakage current from the lower electrode to increase. If the substrate temperature is set to 580° C., the diffusion of Pb from the PZT film can be prevented but improvement in the film quality of PZT cannot be achieved like the present embodiment.

Subsequent to the formation of such ferroelectric film 13, as shown in FIG. 1E, the $IrO_x$ film of 200 nm thickness is formed as the second conductive film 14 on the PZT film serving as the ferroelectric film 13 by the sputter. Like the first embodiment, the $IrO_x$ film may be formed by two steps.

Then, the ferroelectric capacitors Q are formed by patterning sequentially the second conductive film 14, the ferroelectric film 13, the first conductive film 12, and the intermediate layer 11 along the steps shown in FIGS. 1F to 1I. In this case, the second conductive film 14 constitutes the upper electrode 14c, the ferroelectric film 13 constitutes the dielectric film 13a, and the first conductive film 12 and the intermediate layer 11 constitute the lower electrode 11a.

Since subsequent steps are similar to those in the first embodiment, they will be omitted herein.

According to above steps, as described in the first embodiment, the Ti intermediate layer 11 constituting the lower electrode 11a is oriented along the c-axis that is perpendicular to the substrate surface, and thus the (002) orientation intensity can be enhanced. Therefore, the (111) orientation intensity of the first conductive film 12 formed thereon can be enhanced.

Table 6 indicates the half width of the (222) XRD profile of the Ir film when the structures of the lower electrode 11a are formed differently.

TABLE 6

| Lower electrode structure | Half width |
| --- | --- |
| Ir/SiO$_2$ (prior art) | 8.8 |
| Ir/Ti/SiO$_2$ (prior art) | 4.5 |
| Ir/Ti/NH$_3$ plasma process/SiO$_2$ | 1.6 |
| Ir/Pt/Ti/NH$_3$ plasma process/SiO$_2$ | 1.4 |

According to Table 6, the (222) XRD half width of the Ir film that is formed on the SiO$_2$ insulating film, which was subjected to the NH$_3$ plasma process, via the Ti film or the Pt/Ti film could be reduced such as 1.6 and 1.4. Therefore, it is preferable that the grains of the Ir film are directed uniformly in the (222) orientation. In this case, the (222) orientation is equivalent to the (111) orientation.

In this case, the (002) orientation intensity of the Ti film constituting the intermediate layer 11 is enhanced. Like the first embodiment, even when the Ti film is oxidized into the TiO$_x$ film by the RTA, the orientation characteristic of the TiO$_x$ film is improved because of the good orientation characteristic of the Ti film. Thus, as shown in Table 3, the flatness can be enhanced rather than the prior art. The present embodiment is different from the prior art in a respect that the surface of the first interlayer insulating film was processed by the NH$_3$ plasma.

Also, in the PZT dielectric film 13a formed on the first conductive film 12 and the lower electrode 11a, which is formed by patterning the intermediate layer 11 to have the high (111) orientation intensity, at a high substrate temperature of 620° C. by the MOCVD method, the grain orientation of more than 90% can be directed to (111) that is perpendicular to the substrate surface.

This is because, in order to improve the orientation characteristic of the lower electrode 11a, the Ti film whose orientation direction is aligned in the c-axis can be formed as the intermediate layer 11 on the first interlayer insulating film 10, which was processed by the NH$_3$ plasma, and therefore the Ir film on the intermediate layer 11 is oriented uniformly in the (111) and then the crystallinity of the ferroelectric film 13 is grown to succeed to the crystallinity of the underlying Ir film.

By the way, the growth temperature of the PZT film is set to 620° C. in the present embodiment, while such growth temperature is set to 580° C. in the prior art.

Figure 20:
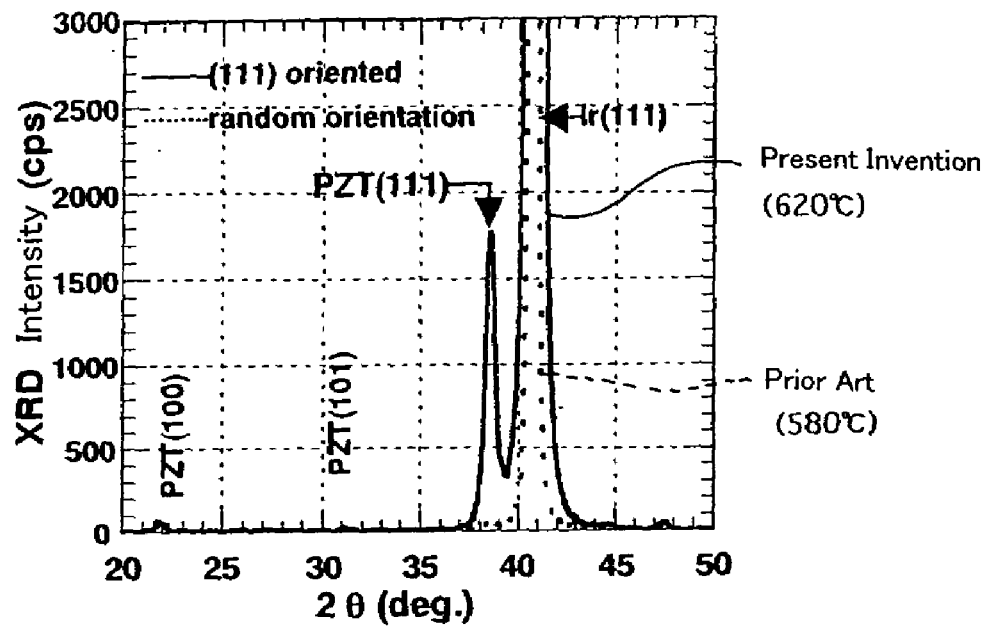
FIG. 20 is a view showing respective XRD profiles of the PZT film on an Ir film formed by the conventional method and the PZT film on an Ir/Ti film formed by the present invention.

When the intermediate layer 11 made of Ti was formed on the insulating film that was processed by the NH$_3$ plasma, then the Ir film is formed on the intermediate layer 11 by the sputter, and then the orientation of the Ir film was measured by the XRD method, an XRD profile indicated by a solid-line curve in FIG. 20 was derived. According to the solid-line curve in FIG. 20, it was found that the (111) orientation with the sufficient high intensity can be obtained in the Ir film. In addition, when the PZT film is formed on the Ir film by the MOCVD method at the substrate temperature of 620° C. and then the (111) orientation intensity of the PZT film was measured, another solid-line curve shown in FIG. 20 was also derived.

In contrast, when the PZT film is formed on the Ir film by the MOCVD method at the substrate temperature of 580° C., the (111) orientation intensity of the PZT film became extremely small, as shown by a broken line in FIG. 20. The PZT film has the random crystal.

Figure 21:
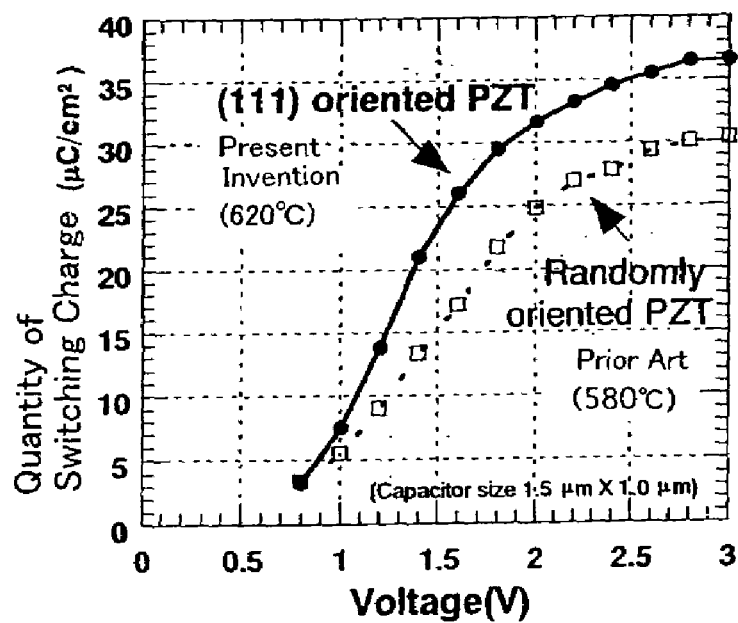
FIG. 21 is a view showing respective electric characteristics of a ferroelectric capacitor using the PZT that is formed by the conventional method, and a ferroelectric capacitor using the PZT that is formed by the present invention.

Then, when the upper electrode was formed on the PZT film in two samples used in FIG. 20 and then a quantity of switching charge was measured, characteristics shown in FIG. 21 were derived.

According to FIG. 21, a quantity of switching charge of the capacitor in the present embodiment, which has the PZT ferroelectric with the column-like crystal whose (111) orientation intensity is high, became larger than that of the capacitor, which has the PZT ferroelectric film with the random crystal. If a quantity of charge was compared at 1.8 V that is the standard device operating voltage, a high value such as 29 $\mu$C/cm$^2$ was obtained in the capacitor having the PZT film whose orientation intensity is high. In contrast, a low value such as 22 $\mu$C/cm$^2$ was obtained in the capacitor having the PZT film that has the random orientation.

The event that the initial quantity of switching charge is high indicates that the margin is high against the depolarization caused by the fatigue due to the increase of the number of rewriting times and the data holding for a long time.

Figure 22:
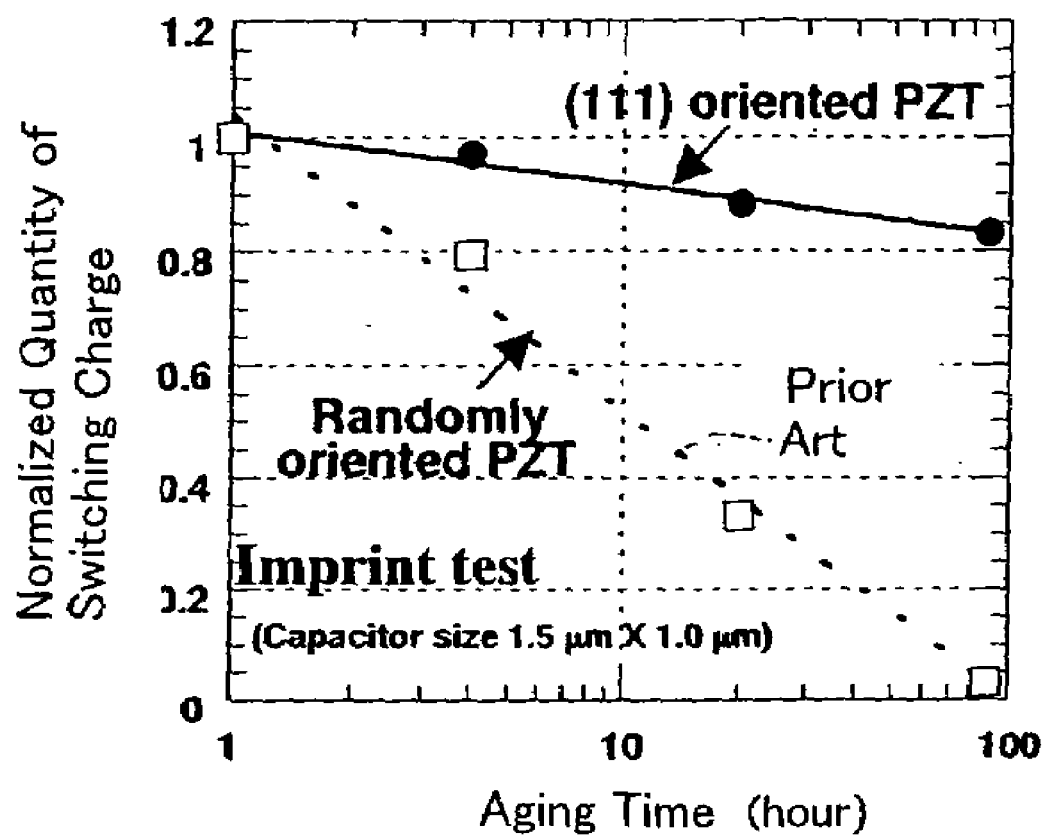
FIG. 22 is a view showing imprint characteristics of the ferroelectric capacitor using the PZT, which is formed by the conventional method, and the ferroelectric capacitor using the PZT, which is formed by the present invention, respectively.

Therefore, when imprint characteristics of the FeRAMs having these capacitors were measured, results shown in FIG. 22 were derived.

According to FIG. 22, in the FeRAM in the present embodiment having the capacitor made of PZT whose (111) orientation intensity is high, reduction in a quantity of charge was small even when an aging time is extended, and thus a sufficient reading margin could be maintained after 100 hours has lapsed. On the contrary, in the FeRAM having the capacitor that is made of PZT with the random crystal, a quantity of charge was largely reduced as an aging time is extended, and thus such quantity of charge became almost 0 after 100 hours has lapsed.

Next, the analyzed result of the capacitor, in which a fail bit is generated, and the capacitor, in which the fail bit is not generated, will be explained hereunder.

Figure 23A:
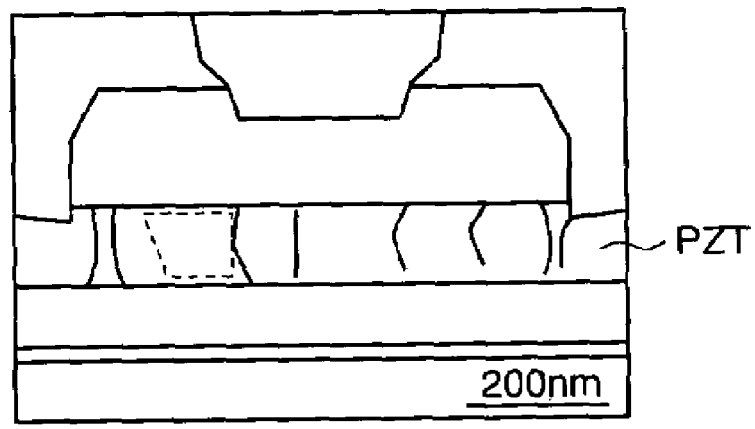
FIGS. 23A and 23B are a sectional view showing a capacitor in which a fail bit was generated and a view showing an electron diffraction image of the PZT crystal respectively.
Figure 23B:
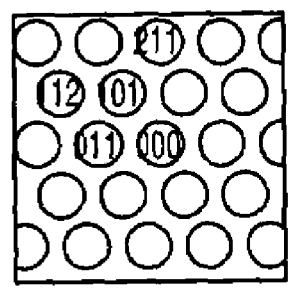

First, the (111) orientation of the PZT crystal of the ferroelectric film of the capacitor in which the fail bit was generated was examined. FIG. 23A is a sectional view depicted based on an image picked up when the capacitor in which the fail bit was generated was examined by the transmission electron microscope. FIG. 23B shows an electron diffraction image in such a range that the PZT crystal being indicated by a broken line in FIG. 23A was not oriented in the <111> direction. According to this, the (111) orientation ratio of the PZT film was about 85% at the most.

Figure 24:
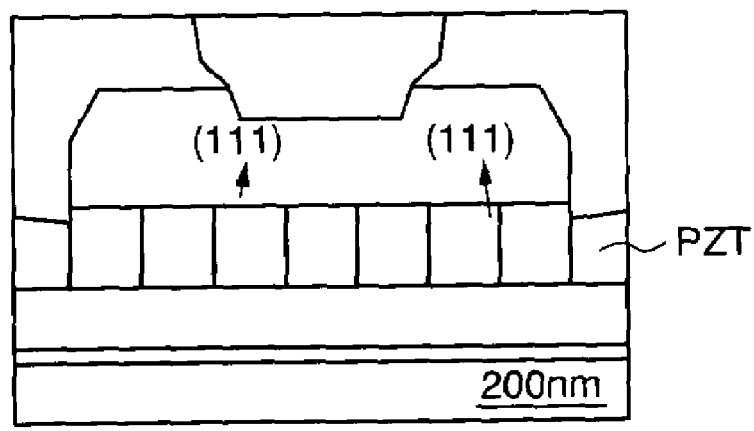
FIG. 24 is a sectional view showing a capacitor in which the fail bit was not generated.

Then, the (111) orientation of the PZT crystal of the ferroelectric film of the capacitor in which the fail bit was not generated was examined. FIG. 24 is a sectional view depicted based on an image picked up when the capacitor in which the fail bit was not generated was examined by the transmission electron microscope. The grains in the PZT film were directed uniformly like a column, and PZT film was almost 100%. The (111) orientation ratio of the ferroelectric film 13 made of PZT shown in the first embodiment was in excess of 90% and was almost 100% or close to the value.

If the crystal orientations are directed uniformly, the writing into the ferroelectric domain can be attained within a time of several tens nanoseconds in which the device operation is executed. In contrast, if the crystals having different crystal orientations are mixed with each other, it takes much time to propagate the polarization inversion and thus the domains that are not inverted within the time still remain. Therefore, it is considered that the imprint phenomenon is caused.

As a result, in order to operate the ferroelectric film as the device, more than 90% crystals must be directed in the same direction.

Third Embodiment

In the first and second embodiments, the FeRAM having the planar capacitor of the structure in which the upper electrode and the lower electrode are extended electrically from the top is explained as above. In the third embodiment, the FeRAM memory cell having the stacked capacitor of the structure in which the lower electrode is extended electrically from the bottom will be explained hereunder.

FIGS. 25A to 25I are sectional views showing steps of manufacturing a semiconductor device according to a third embodiment of the present invention.

Figure 25A:
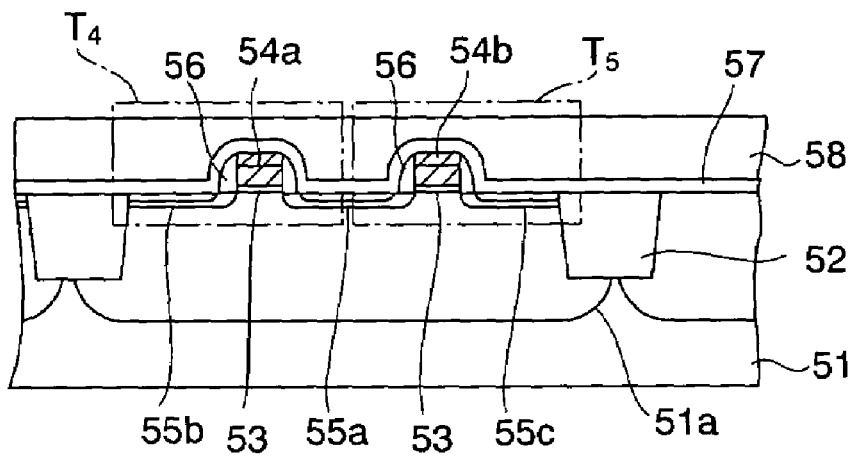
FIGS. 25A to 25I are sectional views showing steps of manufacturing a semiconductor device according to a third embodiment of the present invention.

First, steps required until a sectional structure shown in FIG. 25A is formed will be explained hereunder.

As shown in FIG. 25A, an element isolation recess is formed round a transistor forming region of an n-type or p-type silicon (semiconductor) substrate 51 by the photolithography method. Then, an element isolation insulating film 52 having the STI structure is formed by burying silicon oxide ($SiO_2$) into the element isolation recess. In this case, an insulating film formed by the LOCOS method may be employed as the element isolation insulating film.

Then, a p-well 51a is formed by introducing the p-type impurity into the transistor forming region of the silicon substrate 51. Then, a silicon oxide film serving as a gate insulating film 53 is formed by thermally oxidizing a surface of the transistor forming region of the silicon substrate 51.

Then, an amorphous silicon or polysilicon film and a tungsten silicide film are formed sequentially on the overall upper surface of the silicon substrate 51. Then, gate electrodes 54a, 54b are formed by patterning the silicon film and the tungsten silicide film by means of the photolithography method.

In this case, two gate electrodes 54a, 54b are formed in parallel on one p-well 51a. These gate electrodes 54a, 54b constitute a part of the word line.

Then, the n-type impurity is ion-implanted into the p-well 51a on both sides of the gate electrodes 54a, 54b. Thus, first to third n-type impurity diffusion regions 55a to 55c serving as the source/drain are formed.

Then, an insulating film, e.g., an $SiO_2$ film is formed on the overall surface of the silicon substrate 51 by the CVD method. Then, insulating sidewall spacers 56 are left on both side portions of the gate electrodes 54a, 54b by etching back the insulating film.

Then, the n-type impurity is ion-implanted again into the first to third n-type impurity diffusion regions 55a to 55c by using the gate electrodes 54a, 54b and the sidewall spacers 56 as a mask. Thus, the first to third n-type impurity diffusion regions 55a to 55c are formed into the LDD structure.

Here, the first n-type impurity diffusion region 55a between two gate electrodes 54a, 54b in one transistor forming region is connected electrically to the bit line described later. The second and third n-type impurity diffusion regions 55b, 55c on both sides of the transistor forming region are connected electrically to the lower electrode of the capacitor described later.

According to the above steps, a first MOS transistor $T_4$ having the gate electrode 54a and the n-type impurity diffusion regions 55a, 55b of the LDD structure and a second MOS transistor $T_5$ having the gate electrode 54b and the n-type impurity diffusion regions 55a, 55c of the LDD structure are formed in one p-well 51a.

Then, a silicon oxide nitride (SiON) film of about 200 nm thickness is formed as a cover insulating film 57, which covers the MOS transistors $T_4$, $T_5$, on the overall surface of the silicon substrate 51 by the plasma CVD method. Then, a silicon oxide ($SiO_2$) film of almost 1.0 μm thickness is formed as a first interlayer insulating film 58 on the cover insulating film 57 by the plasma CVD method using a TEOS gas.

Then, as the densifying process of the first interlayer insulating film 58, the first interlayer insulating film 58 is annealed at a temperature of 700° C. for 30 minutes in the atmospheric-pressure nitrogen atmosphere, for example. Then, an upper surface of the first interlayer insulating film 58 is planarized by the CMP (Chemical Mechanical Polishing) method.

Figure 25B:
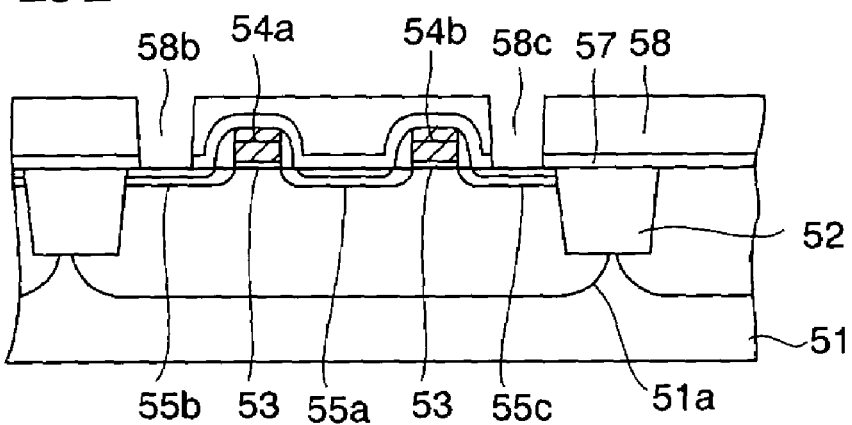

Next, steps required until a structure shown in FIG. 25B is formed will be explained hereunder.

First, the cover insulating film 57 and the first interlayer insulating film 58 are patterned by the photolithography method. Thus, first and second contact holes 58b, 58c are formed on the second and third n-type impurity diffusion regions 55b, 55c.

Then, a Ti film of 30 nm thickness and a TiN film of 50 nm thickness are formed sequentially as a glue film 59a on an upper surface of the first interlayer insulating film 58 and inner surfaces of the first and second contact holes 58b, 58c by the sputter method. Then, a W film 59b is grown by the CVD method on the glue film 59a to bury completely insides of the first and second contact holes 58b, 58c.

Figure 25C:
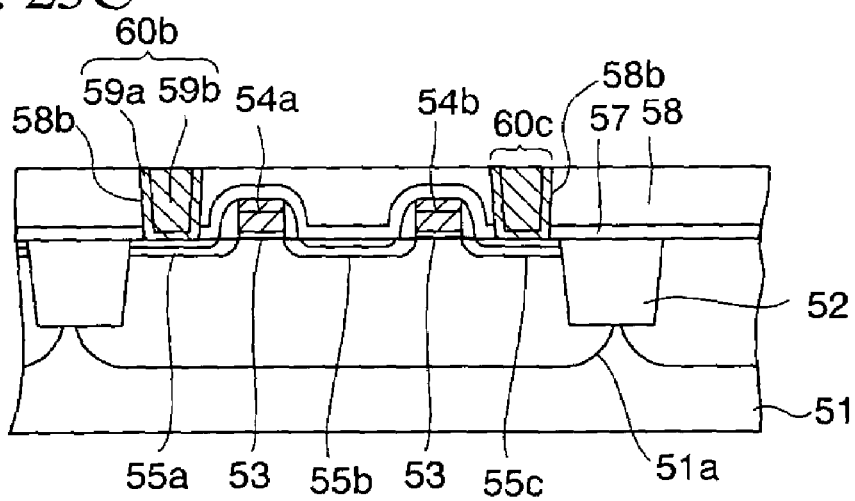

Then, as shown in FIG. 25C, the glue film 59a and the W film 59b are polished by the CMP method to remove from the upper surface of the first interlayer insulating film 58. The tungsten film, the TiN film, and the Ti film left in the first and second contact holes 58b, 58c are used as first and second conductive plugs 60b, 60c respectively.

Figure 25D:
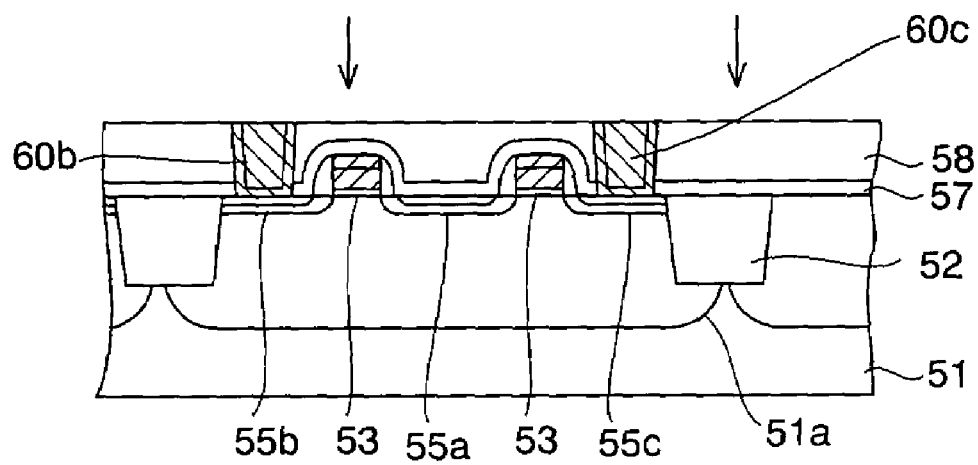

Then, as shown in FIG. 25D, a surface of the first interlayer insulating film 58 is reformed by the ammonia ($NH_3$) gas plasma. In this case, the second and third conductive plugs 60b, 60c are not oxidized.

As the conditions for the $NH_3$ plasma process, for example, a flow rate of the $NH_3$ gas introduced into the chamber is set to 350 sccm, a pressure in the chamber is set to 2 Torr, a substrate temperature is set to 400° C., a power of the RF power supply of 13.56 MHz supplied to the substrate is set to 100 W, a power of the RF power supply of 350 kHz supplied to the plasma generating area is set to 55 W, a distance between the electrode—the first interlayer insulating film is set to 350 mils, and a plasma irradiating time is set to 60 second.

Figure 25E:
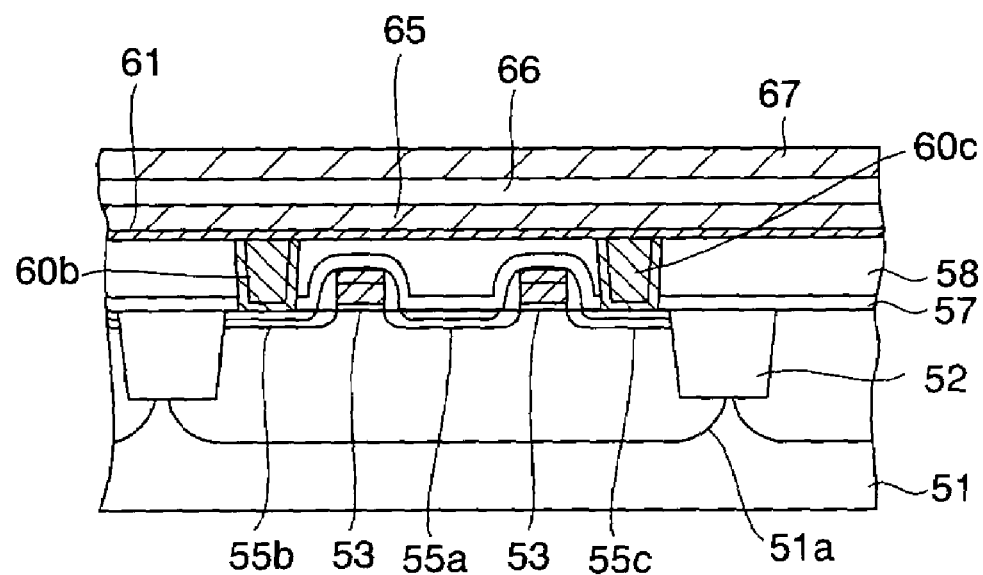

Next, steps required until a structure shown in FIG. 25E is formed will be explained hereunder.

First, a Ti layer of 10 nm thickness is formed as an intermediate layer (self-orientation layer) 61 on the second and third conductive plugs 60b, 60c and the first interlayer insulating film 58 by the sputter. As the sputter conditions of the Ti layer, for example, a pressure of an argon gas introduced into the sputter atmosphere is set to 0.15 Pa, a DC power for the sputter is set to 2.6 kW, a sputter time is set to 7 second, and a substrate temperature is set to 20° C.

Then, an iridium (Ir) film of 200 nm thickness, for example, is formed as a first conductive film 65 on the intermediate layer 61. As the sputter conditions of the Ir film, for example, a pressure of the argon gas introduced into the sputter atmosphere is set to 0.11 Pa, a DC power for the sputter is set to 0.5 kW, a sputter time is set to 335 second, and a substrate temperature is set to 500° C.

In this case, a platinum (Pt) film, a platinum oxide (PtO) film, an iridium oxide ($IrO_x$) film, or an SRO (strontium ruthenium oxygen) film, otherwise a multi-layered film selected from the Ir film, the Pt film, the PtO film, and the $IrO_x$ film may be formed as the first conductive film 65.

Then, a PZT film of 120 nm thickness, for example, is formed as a ferroelectric film 66 on the first conductive film 65. The material and the method shown in the first embodiment may be employed to form the ferroelectric film 66, but the step of growing PZT by the MOCVD (Metal Organic CVD) method is employed in the third embodiment.

The MOCVD method is characterized in that liquid organic materials are vaporized by the vaporizer and then introduced into the reaction chamber. That is, the PZT film is formed by dissolving respective solid materials consisting of Pb, Zr, and Ti into the organic compound solution, then vaporizing this dissolved solution to generate the material gases, and then introducing such material gases into the reaction chamber. Typical growth pressure, growth temperature, growth time, materials, and flow rates applied at the time of forming the PZT by the MOCVD method are given as shown in Table 7 and Table 8.

TABLE 7

PZT film forming conditions

| | Film forming Pressure | Film forming temperature | Time |
|---|---|---|---|
| PZT | 5 Torr | 620° C. | 620 sec |

TABLE 8

| Solution name | Flow rate |
|---|---|
| THF (TetraHydroFuran: $C_4H_8O$) | 0.474 ml/min |
| Pb(DPM)$_2$(concentration 0.3 mol/, dissolved in THF solution) | 0.326 ml/min |
| Zr(dmhd)$_4$(concentration 0.3 mol/, dissolved in THF solution) | 0.200 ml/min |
| Ti(O-iPr)$_2$(DPM)$_2$(concentration 0.3 mol/, dissolved in THF solution) | 0.200 ml/min |

Then, iridium oxide ($IrO_2$) of 200 nm thickness, for example, is formed as a second conductive layer 67 on the ferroelectric film 66 by the sputter method. As the sputter conditions of the $IrO_2$ film, for example, a pressure of the argon gas introduced into the sputter atmosphere is set to 0.8 Pa, a DC power for the sputter is set to 1.0 kW, a sputter time is set to 79 second, and a substrate temperature is set to the ordinary temperature, e.g., 20° C.

Here, the reason why the $IrO_2$ film is used as the second conductive layer 67 is to improve the hydrogen deterioration resistance. If the Pt film is formed as the second conductive layer 67, the hydrogen radical is generated because such Pt film has the catalytic action to the hydrogen molecule, so that the PZT film is reduced and easily deteriorated. In contrast, the hydrogen radical is difficult to be generated because the $IrO_2$ film has no catalytic action, so that the hydrogen deterioration resistance of the ferroelectric film can be improved remarkably.

Then, in order to recover the ferroelectric film 66 from the damage caused in forming the second conductive layer 67, the recovery annealing is applied to the ferroelectric film 66 through the second conductive layer 67. Such recovery annealing was executed at the substrate temperature of 550° C. for 260 minute in the furnace.

Then, a hard mask (not shown) constructed by forming sequentially titanium nitride and silicon oxide is formed on the second conductive layer 67. The hard mask is formed on the first and second conductive plugs 60b, 60c and their peripheral areas, and has the planar shape of the capacitor.

Figure 25F:
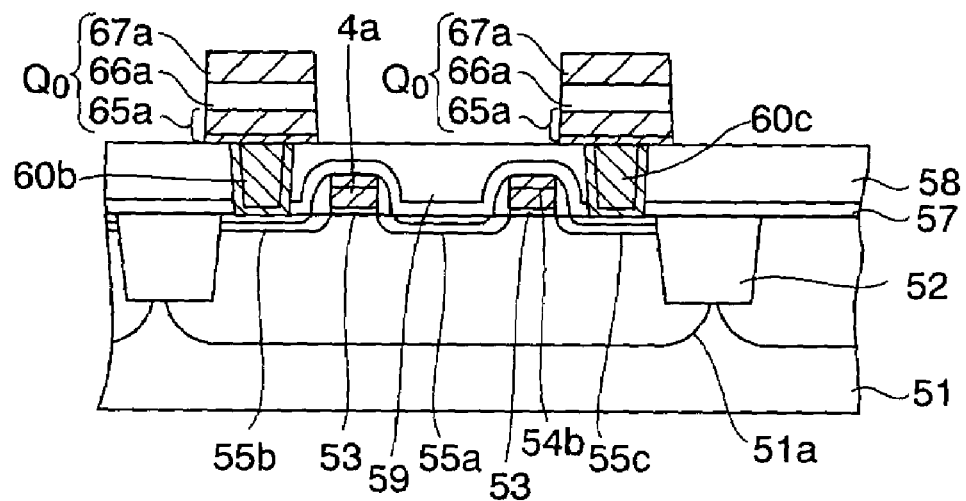

Then, as shown in FIG. 25F, the second conductive layer 67, the ferroelectric film 66, the first conductive film 65, and the intermediate layer 61 in the region, which is not covered with the hard mask, are etched sequentially. For example, the etching of the second conductive layer 67, the first conductive film 65, and the intermediate layer 61 is carried out by using a mixed gas of HBr and $O_2$, while the etching of the ferroelectric film 66 is carried out by using a gas containing chlorine.

As a result, the second conductive layer 67 left under this hard mask is used as an upper electrode 67a of a capacitor $Q_0$, the ferroelectric film 66 is used as a dielectric layer 66a of the capacitor $Q_0$, and the first conductive film 65 and the intermediate layer 61 are used as a lower electrode 65a of the capacitor $Q_0$.

Then, the hard mask is removed.

Then, in order to eliminate the damage of the ferroelectric film 66 caused by the etching, the recovery annealing is executed. The recovery annealing in this case is carried out at the substrate temperature of 650° C. for 60 minute in the oxygen atmosphere, for example.

Figure 25G:
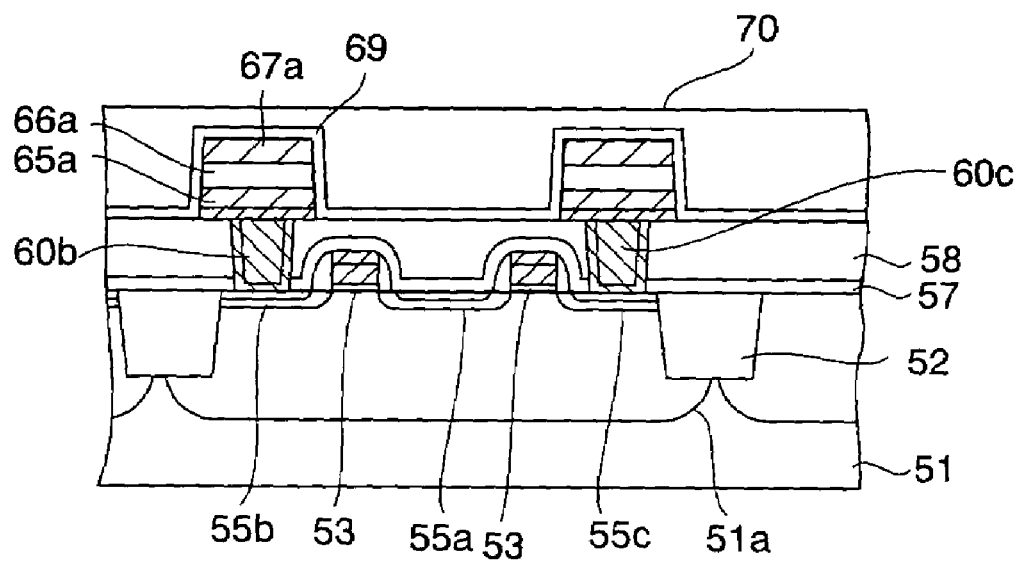

Then, as shown in FIG. 25G, alumina of 10 nm thickness is formed as a capacitor protection insulating film 69 on the first interlayer insulating film 58 and the capacitor $Q_0$ by the CVD method. Then, the capacitor $Q_0$ is annealed at the substrate temperature of 650° C. for 60 minute in the oxygen atmosphere. The capacitor protection insulating film 69 protects the capacitor $Q_0$ from the process damage.

Then, silicon oxide ($SiO_2$) of about 1.0 μm thickness is formed as a second interlayer insulating film 70 on the capacitor protection insulating film 69 by the plasma CVD method using the TEOS gas.

Then, an upper surface of the second interlayer insulating film 70 is planarized by the CMP method. For example, a remaining thickness of the second interlayer insulating film 70 after the CMP is set to about 300 nm on the upper electrode 67a of the capacitor $Q_0$.

Figure 25H:
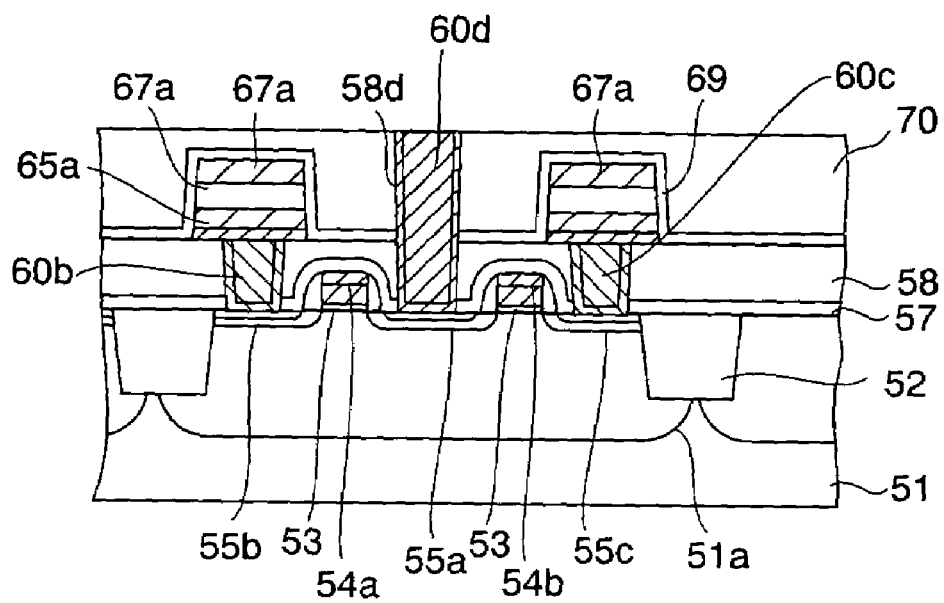

Next, steps required until a structure shown in FIG. 25H is formed will be explained hereunder.

First, the first and second interlayer insulating films 58, 70, the capacitor protection insulating film 69, and the cover insulating film 57 are etched by using a resist mask (not shown). Thus, a hole 58d is formed on the first n-type impurity diffusion region 55a.

Then, a Ti film of 30 nm thickness and a TiN film of 50 nm thickness are formed sequentially as a glue layer on an inner surface of the hole 58d and an upper surface of the second interlayer insulating film 70 by the sputter method. Then, a W film is grown on the glue layer by the CVD method to bury completely an interior of the hole 58d.

Then, the W film, the TiN film, and the Ti film are polished by the CMP method to remove from the upper surface of the second interlayer insulating film 70. Thus, the tungsten film and the glue layer left in the hole 58d are used as a third conductive plug 60d. This third conductive plug 60d is connected electrically to the first n-type impurity diffusion region 55a.

Figure 25I:
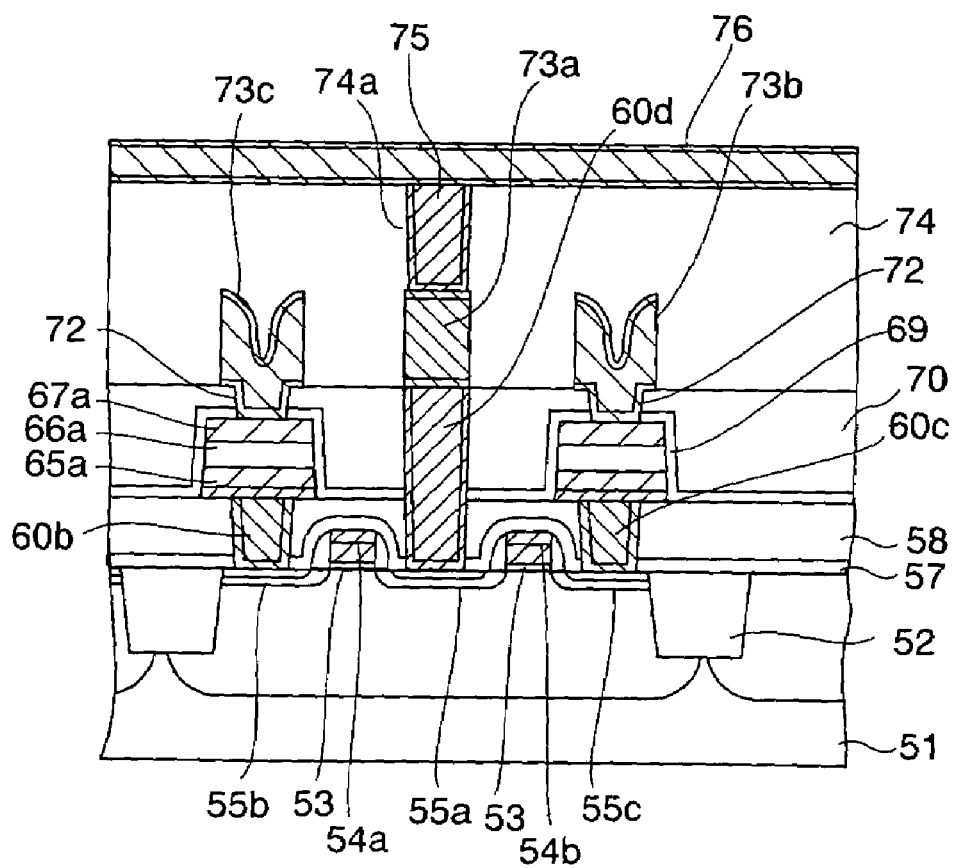

Next, steps required until a structure shown in FIG. 25I is formed will be explained hereunder.

First, an SiON film of 100 nm thickness is formed as an oxidation preventing film (not shown) on the third conductive plug 60d and the second interlayer insulating film 70 by the CVD method. Then, the oxidation preventing film (not shown), the second interlayer insulating film 70, and the capacitor protection insulating film 69 are patterned by the photolithography method. Thus, contact holes 72 are formed on the upper electrodes 67a of the capacitors $Q_0$.

The capacitors $Q_0$ damaged by forming the contact holes 72 are recovered by the annealing. For example, such annealing is executed at the substrate temperature of 550° C. for 60 minute in the oxygen atmosphere.

Then, the oxidation preventing film formed on the second interlayer insulating film 70 is removed by the etching-back, and also a surface of the third conductive plug 60d is exposed.

Then, a metal film is formed in the contact holes 72, which are formed on the upper electrodes 67a of the capacitors $Q_0$, and on the second interlayer insulating film 70. Then, a conductive pad 73a, which is connected to the third conductive plug 60d, and first-layer metal wirings 73b, 73c, which are connected to the upper electrodes 67a via the contact holes 72 respectively, are formed by patterning the metal film. As the metal film, for example, a multi-layered structure constructed by forming sequentially Ti of 60 nm thickness, TiN of 30 nm thickness, Al—Cu of 400 nm thickness, Ti of 5 nm thickness, and TiN of 70 nm thickness is employed.

Then, a third interlayer insulating film 74 is formed on the second interlayer insulating film 70, the first-layer metal wirings 73b, 73c, and the conductive pad 73a. Then, a hole 74a is formed on the conductive pad 73a by patterning the third interlayer insulating film 74. Then, a fourth conductive plug 75 consisting of the TiN film and the W film from the bottom is formed in the hole 74a.

Then, a metal film is formed on the third interlayer insulating film 74. A bit line 76 connected to the fourth conductive plug 75 is formed by patterning the third interlayer insulating film 74 by virtue of the photolithography method. The bit line 76 is connected electrically to the first n-type impurity diffusion region 55a via the fourth conductive plug 75, the conductive pad 73a, and the third conductive plug 60d. Then, an insulating film for covering the second-layer wiring layer, etc. are formed, but their details will be omitted.

In the above present embodiment, a rate of an area of upper ends of the first and second conductive plugs 60b, 60c to an area of the bottom surface of the capacitor $Q_0$ is about 10%. Therefore, like the first embodiment, improvement in the film quality of the first interlayer insulating film 58 by the $NH_3$ plasma process brings about improvement in the crystallinity of the ferroelectric film 66. As a result, an increase of a quantity of switching charge $Q_{SW}$ of the capacitor $Q_0$ appears.

Fourth Embodiment

In the third embodiment, focus is made on the FeRAM memory cell and its manufacturing steps including the step of forming the ferroelectric film 66 by the MOCVD method.

However, there is concern about oxidation of tungsten constituting the first and second conductive plug 60a, 60c due to oxygen and substrate temperature in the MOCVD method, which would allow these plugs to expand.

In view of this, in the present embodiment, the memory cell and its manufacturing steps including the step of preventing the oxidation of the first and second conductive plugs 60b, 60c when the ferroelectric film 66 is formed by the MOCVD method will be explained.

FIGS. 26A to 26K are sectional views showing steps of manufacturing a semiconductor device according to a fourth embodiment of the present invention.

Figure 26A:
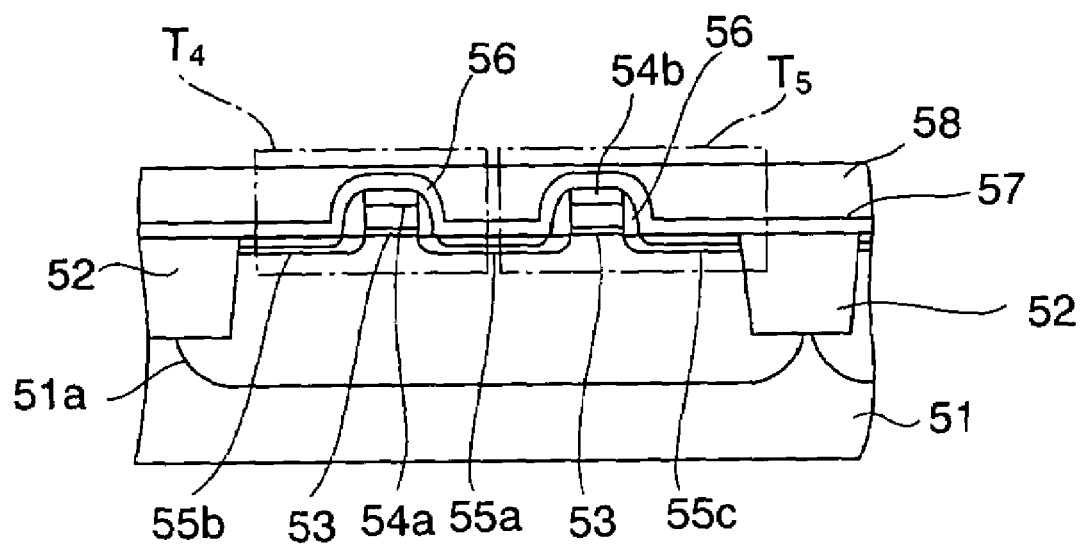
FIGS. 26A to 26K are sectional views showing steps of manufacturing a semiconductor device according to a fourth embodiment of the present invention.

First, as shown in FIG. 26A, according to the steps shown in the third embodiment, the MOS transistors $T_4$, $T_5$ are formed on the silicon substrate 51, and then the cover insulating film 57 and the first interlayer insulating film 58 are formed.

Figure 26B:
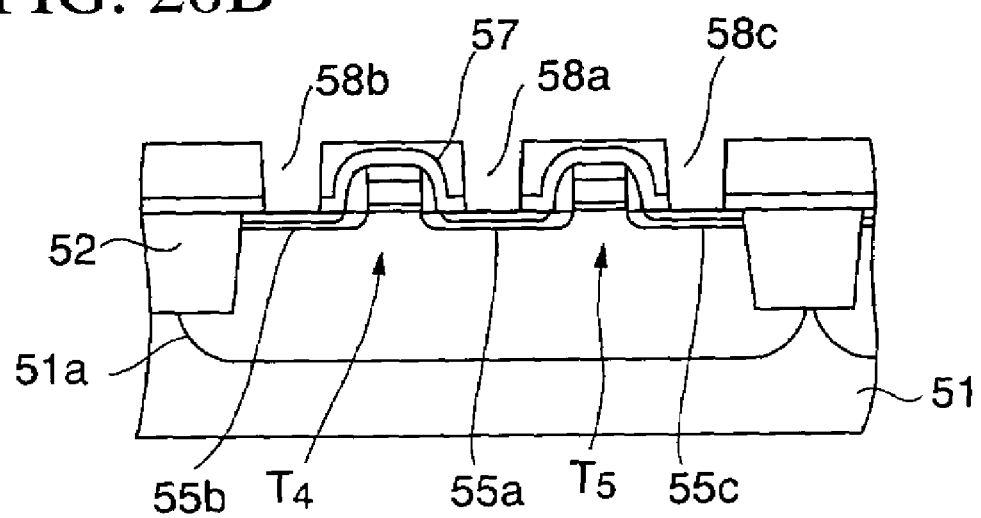

Then, as shown in FIG. 26B, the first interlayer insulating film 58 and the cover insulating film 57 are etched by using a resist pattern (not shown). Thus, the first, second, and third contact holes 58a, 58b, 58c are formed on the first, second, and third n-type impurity diffusion regions 55a, 55b, 55c in the memory cell region respectively.

Figure 26C:
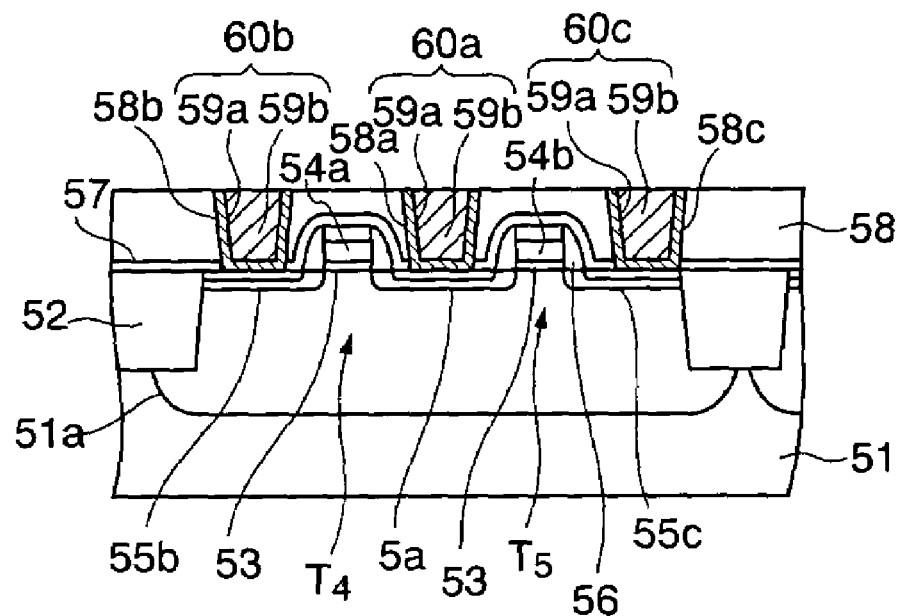

Next, steps required until a structure shown in FIG. 26C is formed will be explained hereunder.

First, a titanium (Ti) layer of 20 nm thickness and a titanium nitride (TiN) layer of 50 nm thickness are formed sequentially as a glue layer 59a on an upper surface of the first interlayer insulating film 58 and inner surfaces of the first to third contact holes 58a to 58c. Then, a tungsten (W) layer 59b is grown on the glue layer 59a by the CVD method using $WF_6$ to bury completely insides of the contact holes 58a to 58c.

Then, the tungsten layer 59b and the glue layer 59a are polished by the CMP method to remove from the upper surface of the first interlayer insulating film 58. Thus, the tungsten layer 59b and the glue layer 59a left in the first, second, and third contact holes 58a, 58b, 58c respectively are used as the first, second, and third conductive plugs 60a, 60b, 60c. The first, second, and third conductive plugs 60a, 60b, 60c are connected to the first, second, and third n-type impurity diffusion regions 55a, 55b, 55c respectively.

Figure 26D:
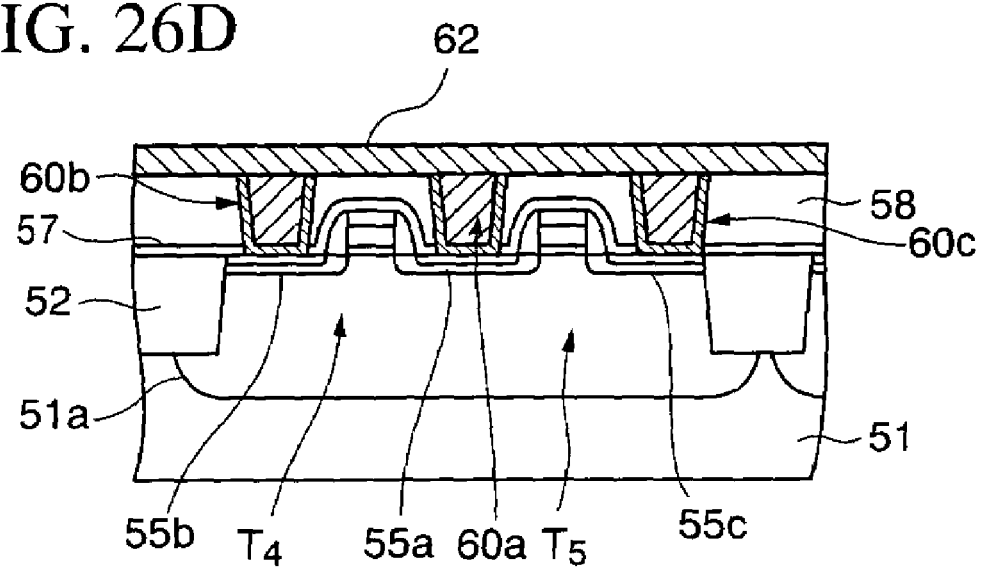

Then, as shown in FIG. 26D, an iridium layer is formed as a conductive oxygen barrier metal layer 62 on the first to third conductive plugs 60a to 60c and the first interlayer insulating film 58 by the sputter.

As the sputter conditions of the Ir film, for example, a pressure of the argon gas introduced into the sputter atmosphere is set to 0.11 Pa, a DC power for the sputter is set to 0.5 kW, and a substrate temperature is set to 500° C.

The Ir layer is formed to have a thickness enough to prevent the abnormal oxidation of the second and third conductive plugs 60b, 60c formed near both sides of the P-well 51a. For example, in order to prevent the abnormal oxidation of the conductive plugs 60a to 60c when the annealing is executed at the substrate temperature of 550° C. in the oxygen-containing atmosphere, the iridium layer is formed to have a thickness of 200 to 400 nm.

Then, a mask (not shown) having a capacitor planar shape is formed at least on the region of the oxygen barrier metal layer 62 over the second and third conductive plugs 60b, 60c. A resist pattern is formed as the mask.

Figure 26E:
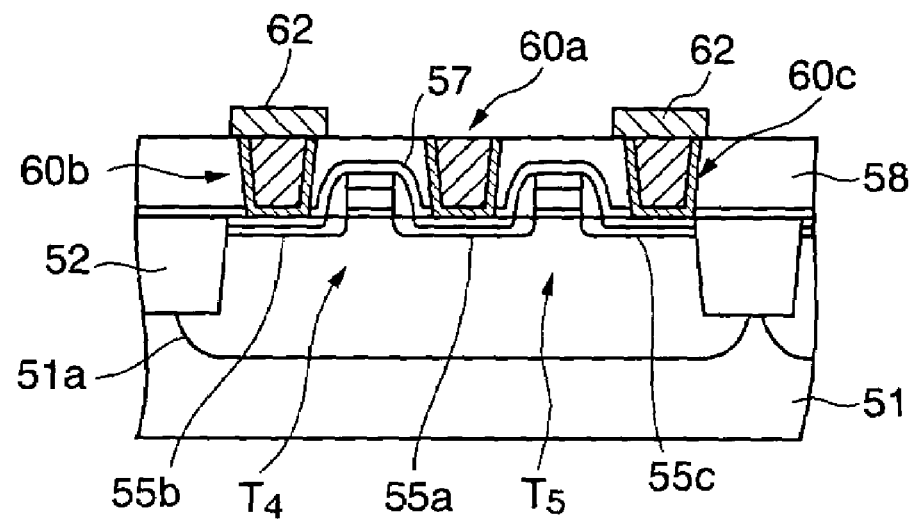

Then, as shown in FIG. 26E, the oxygen barrier metal layer 62 in the region that is not covered with the mask is etched such that the oxygen barrier metal layer 62 is left like an island on the second and third conductive plugs 60b, 60c and their peripheral areas. Thus, the first conductive plug 60a is exposed. Then, the mask is removed. In this case, a hard mask such as titanium nitride, silicon oxide, etc. may be employed as the mask.

Figure 26F:
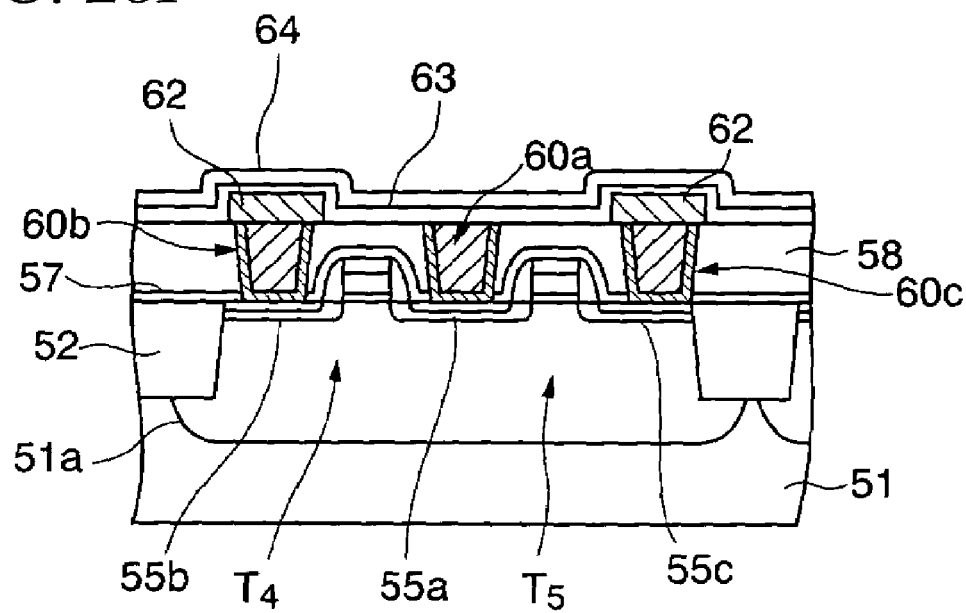

Then, as shown in FIG. 26F, a silicon oxide nitride (SiON) layer or a silicon nitride ($Si_3N_4$) layer of 100 nm thickness, for example, is formed as a oxidation-preventing insulating film 63 on the first conductive plug 60a, the oxygen barrier metal layer 62, and the first interlayer insulating film 58 by the CVD method. The SiON layer or the $Si_3N_4$ layer of 100 nm thickness has an ability to prevent the oxidation of the first conductive plug 60a in the oxygen annealing at about 650° C.

Then, an insulating adhesive layer 64 is formed on the oxidation-preventing insulating film 63. The insulating adhesive layer 64 is formed to improve the adhesion to the capacitor lower electrode described later.

As the insulating adhesive layer 64, a silicon oxide ($SiO_2$) layer of 100 nm thickness is formed by the CVD method using TEOS, for example.

Figure 26G:
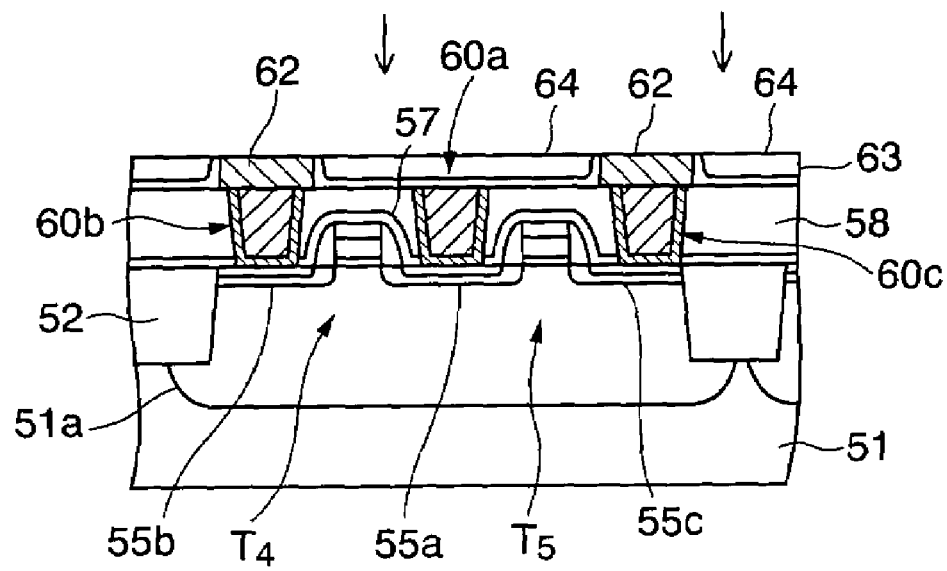

Then, as shown in FIG. 26G, while causing the oxygen barrier metal layer 62 to act as a stopper layer, the insulating adhesive layer 64 and the oxidation-preventing insulating film 63 are polished by the CMP to expose an upper surface of the oxygen barrier metal layer 62. In this case, polished surfaces of the oxygen barrier metal layer 62, the insulating adhesive layer 64, and the oxidation-preventing insulating film 63 are made flat.

Then, the surface of the first interlayer insulating film 58 is reformed by the ammonia ($NH_3$) gas plasma. In this case, the first and third conductive plug 60a, 60c are not oxidized.

As the conditions for the $NH_3$ plasma process, for example, a flow rate of the $NH_3$ gas introduced into the chamber is set to 350 sccm, a pressure in the chamber is set to 2 Torr, a substrate temperature is set to 400° C., a power of the RF power supply of 13.56 MHz supplied to the substrate is set to 100 W, a power of the RF power supply of 350 kHz supplied to the plasma generating area is set to 55 W, a distance between the electrode—the first interlayer insulating film is set to 350 mils, and a plasma irradiating time is set to 60 second.

Figure 26H:
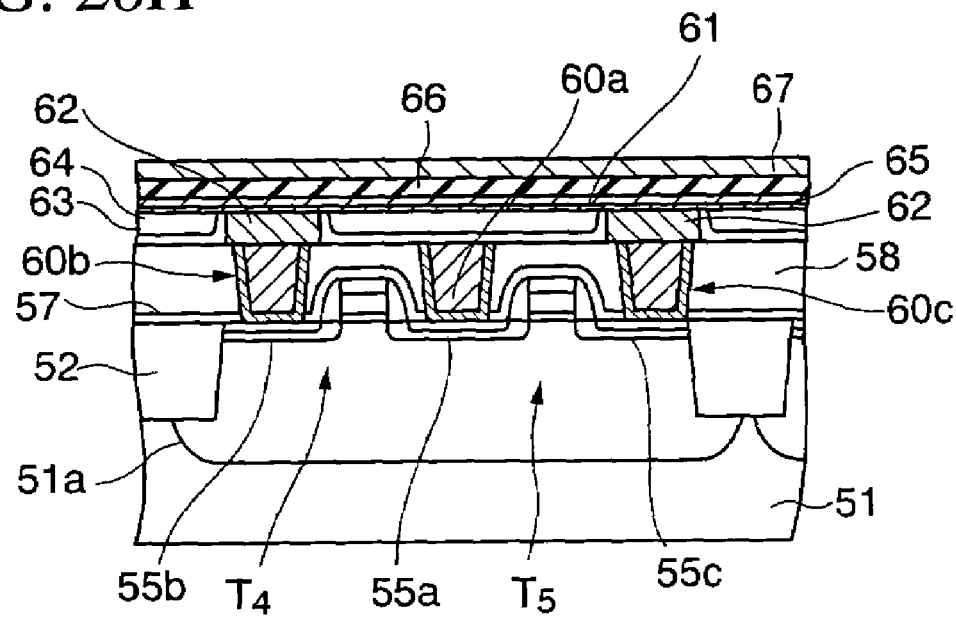

Then, as shown in FIG. 26H, the intermediate layer 61 and the first conductive film 65 are formed sequentially on the oxygen barrier metal layer 62, the oxidation-preventing insulating film 63, and the insulating adhesive layer 64. A Ti layer of 10 nm thickness, for example, is formed as the intermediate layer 61, and an Ir film of 200 nm thickness, for example, is formed as the first conductive film 65 by the sputter.

The conditions for forming the intermediate layer 61 and the first conductive film 65 are set identically to the conditions shown in the third embodiment.

Then, the PZT film of 200 nm thickness, for example, is formed as the ferroelectric film 66 on the first conductive film 65.

The PZT film is formed by the MOCVD method under following conditions.

The growth temperature of the PZT film on the silicon substrate 1 put in the chamber (not shown) is set to 620° C. Then, out of the elements constituting the PZT film, $Pb(DPM)_2$ was used as the material of Pb, $Zr(dmhd)_4$ was used as the material of Zr, and $Ti(O-iPr)_2(DPM)_2$ was used as the material of Ti. These materials are supplied to a vaporizer in the liquid state they are dissolved in THF at a mole ratio of 3%, then are vaporized together with THF at the temperature of 260° C., for example, in the vaporizer, then are mixed with the oxygen, and then are sprayed onto the first conductive film 12 in the chamber via the shower head.

As flow rates of the material gases introduced into the chamber, the Pb material gas, the Zr material gas, and the Ti material gas are set to 0.365 ml/min, 0.196 ml/min, and 0.175 ml/min respectively in the initial growth of 20 second, and then the Pb material gas, the Zr material gas, and the Ti material gas are set to 0.376 ml/min, 0.277 ml/min, and 0.214 ml/min respectively in the subsequent period of 505 second.

A thickness of the PZT film formed under such conditions was 120 nm, and its compositions were Pb/(Zr+Ti)=1.17 and Zr/(Zr+Ti)=0.43.

Since the PZT film formed by the MOCVD method is crystallized, the annealing required for the crystallization can be omitted.

In this case, like the first embodiment, as the formation of the ferroelectric film 66, the PZT film may be formed by employing the sputter, the sol-gel method, the COD method, or the like. Also, as the material of the ferroelectric film 66, the material shown in the first embodiment may be employed other than PZT.

Then, the iridium oxide ($IrO_2$) of 200 nm thickness, for example, is formed as the second conductive layer 67 on the ferroelectric film 66 by the sputter method.

Then, a hard mask (not shown) made of TiN and $SiO_2$ is formed on the second conductive layer 67. The hard mask is patterned to have a capacitor planar shape over the oxygen barrier metal layer 62 and its peripheral area on the second and third conductive plugs 60b, 60c.

Then, the second conductive layer 67, the ferroelectric film 66, the first conductive film 65, and the intermediate layer 61 in the region that is not covered with the hard mask are etched sequentially. Thus, capacitors $Q_1$ are formed on the oxygen barrier metal layer 62, the insulating adhesive layer 64, and the oxidation-preventing insulating film 63. The etching conditions in this case are set identically to those in the third embodiment.

Figure 26I:
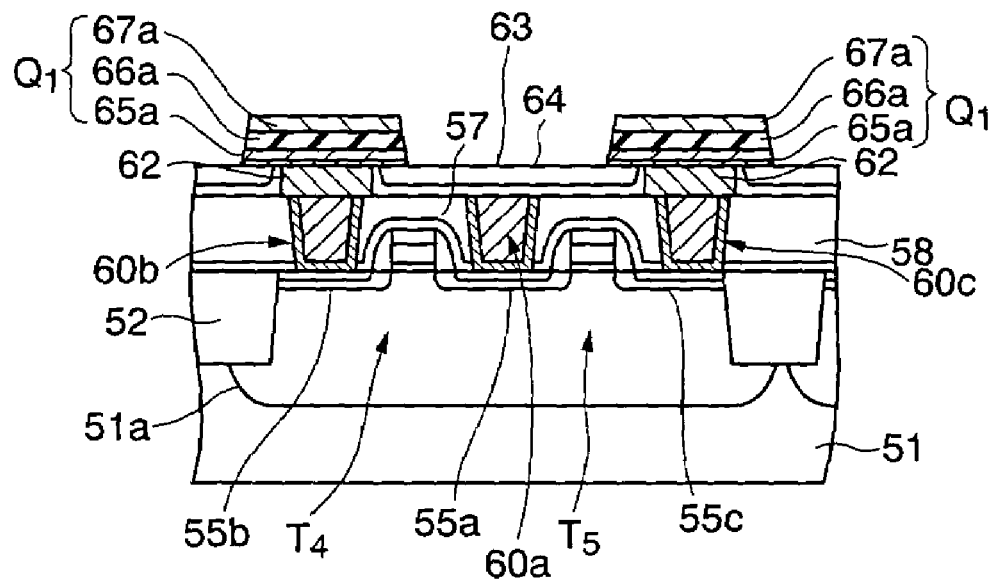

As shown in FIG. 26I, the capacitor $Q_1$ consists of the lower electrode 65a made of the intermediate layer 61 and the first conductive film 65, the dielectric layer 66a made of the ferroelectric film 66, and the upper electrode 65a made of the first conductive film 65.

Two capacitors $Q_1$ are formed over one p-well 51a. Their lower electrodes 65a are connected electrically to the second or third n-type impurity diffusion region 55b, 55c via the second or third conductive plug 60b, 60c respectively.

The hard mask is removed after the patterns of the capacitors $Q_1$ are formed.

Then, in order to recover the film quality of the ferroelectric film 66 from the damage caused by the etching, the recovery annealing of the capacitor is executed. For example, such recovery annealing in this case was executed at the substrate temperature of 650° C. for 60 minute in the furnace containing the oxygen.

In this manner, when the heat treatment such as the recovery annealing is applied immediately after the patterning of the ferroelectric film 66, the heat resistance of the second and third conductive plugs 60b, 60c, which are positioned directly under the lower electrodes 65a, is decided based on the oxygen permeability of the oxygen barrier metal layer 62, and also the oxidation resistance of the first conductive plug 60a, which is not positioned directly under the lower electrode 65a, is decided based on the oxygen permeability of the insulating adhesive layer 64 and the oxidation-preventing insulating film 63.

The above thermal process is applied when the capacitors $Q_1$ are formed. When the silicon nitride layer is employed as the oxidation-preventing insulating film 63, the first conductive plug 60a made of tungsten is not abnormally oxidized if the thickness of such silicon nitride layer is set to 70 nm.

Figure 26J:
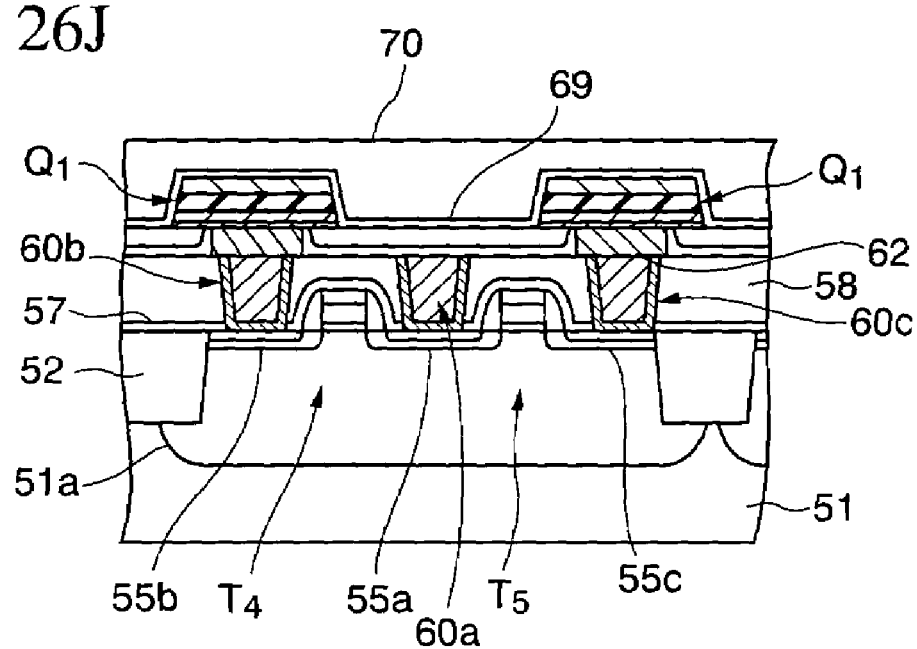

Then, as shown in FIG. 26J, alumina of 50 nm thickness is formed as the capacitor protection layer 69 on the capacitors $Q_1$ and the insulating adhesive layer 64 by the sputter. This capacitor protection layer 69 protects the capacitors $Q_1$ from the process damage, and may be formed of PZT in addition to the alumina.

Then, the capacitors $Q_1$ are annealed at 650° C. for 60 minute in the oxygen atmosphere in the furnace.

Then, the silicon oxide ($SiO_2$) of about 1.0 μm thickness is formed as the second interlayer insulating film 70 on the capacitor protection insulating film 69 by the plasma CVD method using the HDP (High Density Plasma) equipment.

Then, the upper surface of the second interlayer insulating film 70 is planarized by the CMP method. In this example, the remaining thickness of the second interlayer insulating film 70 after the CMP is set to about 300 nm on the upper electrode 67a.

Figure 26K:
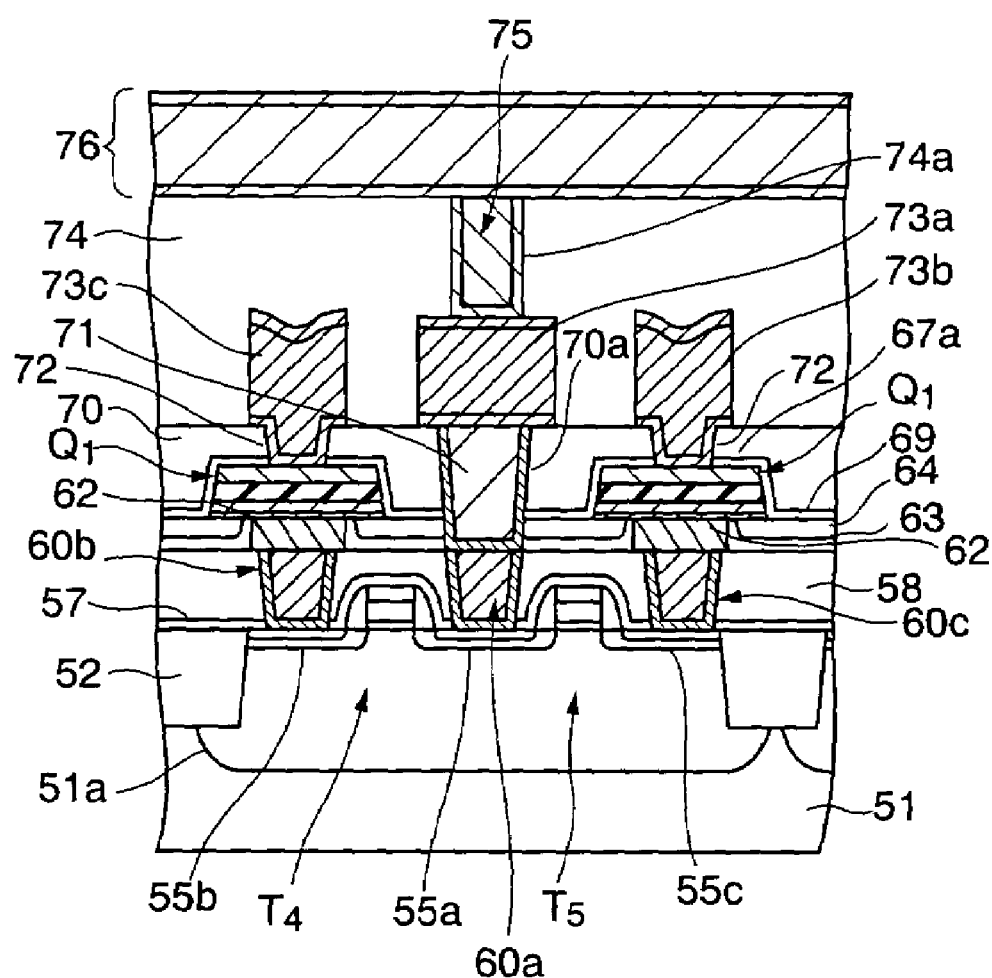

Next, steps required until a structure shown in FIG. 26K is formed will be explained hereunder.

First, the second interlayer insulating film 70, the capacitor protection insulating film 69, the insulating adhesive layer 64, and the oxidation-preventing insulating film 63 are etched by using a resist mask (not shown). Thus, a fourth contact hole 70a is formed on the first conductive plug 60a.

Then, a TiN layer of 50 nm thickness is formed as a glue layer on an inner surface of the fourth contact hole 70a and an upper surface of the second interlayer insulating film 70 by the sputter method. Then, a tungsten layer is grown on the glue layer by the CVD method to bury perfectly the inside of the fourth contact hole 70a.

Then, the tungsten layer and the glue layer are polished by the CMP method to remove from the upper surface of the second interlayer insulating film 70. Then, the tungsten layer and the glue layer left in the fourth contact hole 70a are used as the fourth conductive plug 71.

As a result, the fourth conductive plug 71 is connected to the first conductive plug 60a to constitute the via-to-via contact, and is connected electrically to the first n-type impurity diffusion region 55a.

Then, the second interlayer insulating film 70 is annealed at 350° C. for 120 second in the nitrogen plasma atmosphere.

Then, an SiON layer of 100 nm thickness is formed as a second oxidation preventing layer (not shown) on the fourth conductive plug 71 and the second interlayer insulating film 70 by the CVD method.

Then, the holes 72 are formed on the upper electrodes 67a of the capacitors $Q_1$ by patterning the second oxidation preventing layer, the second interlayer insulating film 70, and the capacitor protection insulating film 69 by means of the photolithography method. The capacitors $Q_1$ that are damaged by forming the holes 72 are recovered by the annealing. The annealing is executed at the substrate temperature of 550° C. for 60 minute in the oxygen-containing atmosphere, for example.

Then, the second oxidation preventing layer formed on the second interlayer insulating film 70 is removed by the etching-back. Thus, the surface of the fourth conductive plug 71 is exposed.

Then, the metal film having the same structure as the third embodiment is formed on the holes 72, which are formed on the upper electrodes 67a of the capacitors $Q_1$, and the second interlayer insulating film 70.

Then, the conductive pad 73a connected to the third conductive plug 60d and the first-layer metal wirings 73b, 73c connected to the upper electrodes 67a via the contact holes 72 respectively are formed by patterning the metal film.

Then, according to the same method as the third embodiment, the third interlayer insulating film 74, the fourth conductive plug 75, the bit line 76, etc. are formed.

In the above present embodiment, a rate of an area of the island-like oxygen barrier metal layer 62 to an area of the capacitor $Q_1$ is about 10%. Therefore, the crystal orientations of the lower electrode 65a constituting the capacitor $Q_1$ on the insulating adhesive layer 64 which was exposed to the $NH_3$ plasma are directed uniformly, and the crystallinity of the overlying ferroelectric film 66 could be improved rather than the prior art. As a result, an increase of a quantity of switching charge $Q_{SW}$ of the capacitor $Q_1$ appears.

In other words, the (111) orientation intensity of the first conductive film 65 (lower electrode 64a) can be enhanced. Thus, if the PZT ferroelectric film 66 is formed on the first conductive film 65 at the high substrate temperature of 620° C. by the MOCVD method, the grains constituting the ferroelectric film 66 are aligned uniformly in excess of 90% in the (111) orientation. Therefore, like the second embodiment, the imprint characteristic of the memory cell in the present embodiment could be improved.

Also, since the conductive plugs 60b, 60c made of tungsten are covered with the oxygen barrier metal layer 62 when the ferroelectric film 66 is formed by the MOCVD method, the abnormal oxidation of the conductive plugs 60b, 60c due to the oxygen is not generated.

However, if the growth temperature of the ferroelectric film 66 is set too high, the conductive plugs 60b, 60c are ready to be oxidized. Therefore, in order to prevent the oxidation of the conductive plugs 60b, 60c, the temperature of 650° C. or less is preferable. Also, in order to improve the (111) orientation ratio of the grains in the PZT film in excess of 90%, the substrate temperature of 600° C. or more is needed.

With the above, in the steps of forming the capacitor $Q_1$ having the stacked structure in which the conductive plugs 60b, 60c are connected to lower electrodes 65a, preferably the ferroelectric film 66 should be formed at the growth temperature of 600 to 650° C.

In this case, like the third embodiment, in the state shown in FIG. 26C, the $NH_3$ plasma process may be applied to the surface of the first interlayer insulating film 58, and then the oxygen barrier metal layer 62 may be formed thereon via the Ti film.

Fifth Embodiment

In the present embodiment, a structure constituting a part of the lower electrode 14a of the capacitor Q by the iridium layer that is formed as the oxygen barrier metal layer 62 will be explained hereunder.

FIGS. 27A to 27I are sectional views showing steps of manufacturing a semiconductor device according to a fifth embodiment of the present invention.

Figure 27A:
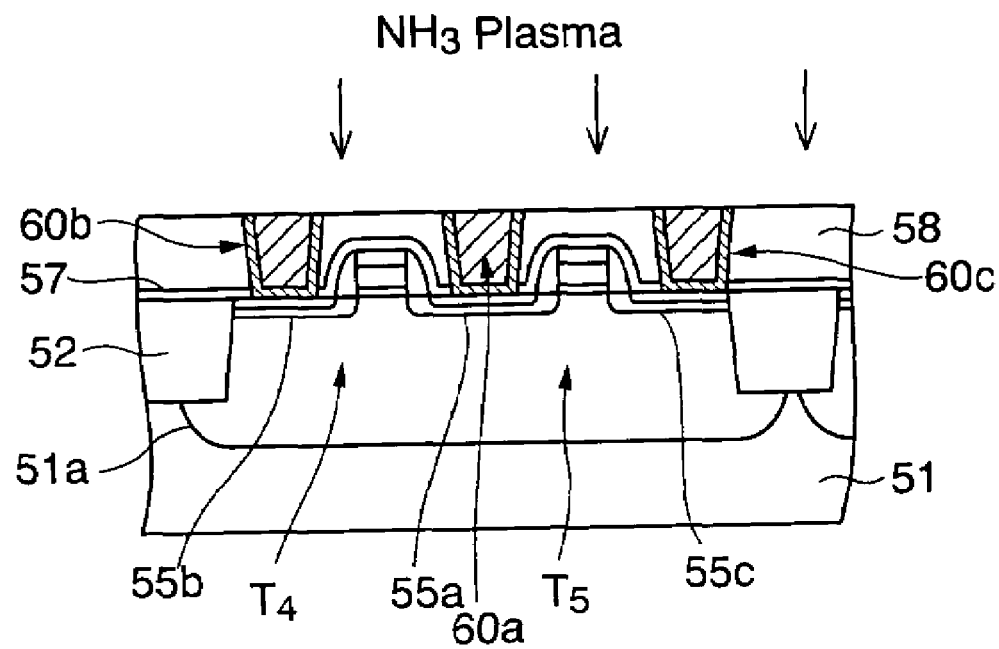
FIGS. 27A to 27I are sectional views showing steps of manufacturing a semiconductor device according to a fifth embodiment of the present invention.

First, steps required until a structure shown in FIG. 27A is formed will be explained hereunder.

According to the steps shown in the fourth embodiment, the MOS transistors $T_4$, $T_5$ are formed on the silicon substrate 51, the cover insulating film 57 and the first interlayer insulating film 58 are formed, and the first to third conductive plugs 60a to 60c are formed.

Then, according to the same conditions as the third embodiment, the surface of the first interlayer insulating film 58 is reformed by the $NH_3$ gas plasma. In this case, the first to third conductive plugs 60a to 60c are not oxidized.

Figure 27B:
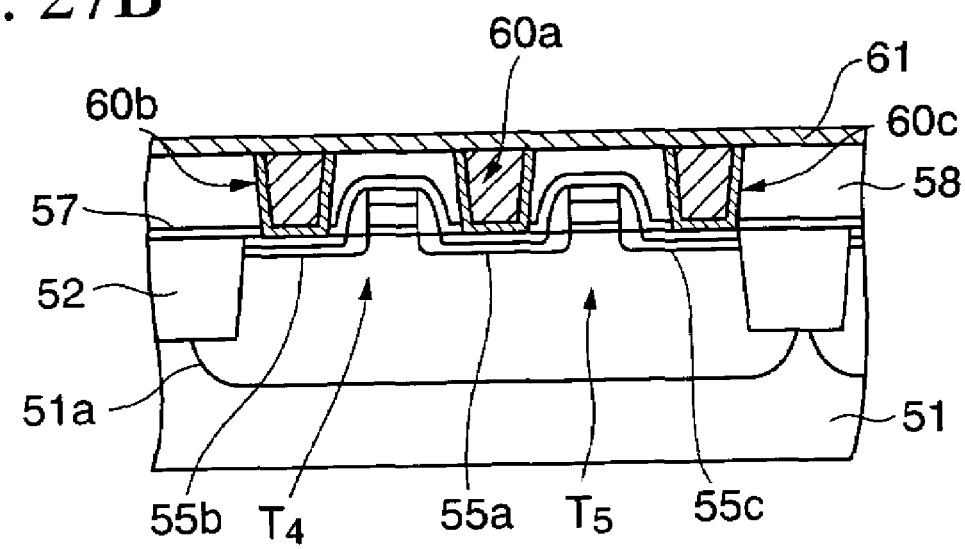

Then, as shown in FIG. 27B, the Ti layer of 10 nm thickness is formed as the intermediate layer 61 on the first interlayer insulating film 58 and the first to third conductive plugs 60a to 60c by the sputter. As the sputter conditions of the Ti layer, for example, a pressure of the argon gas introduced into the sputter atmosphere is set to 0.15 Pa, a DC power for the sputter is set to 2.6 kW, a sputter time is set to 7 second, and a substrate temperature is set to 20° C.

Figure 27C:
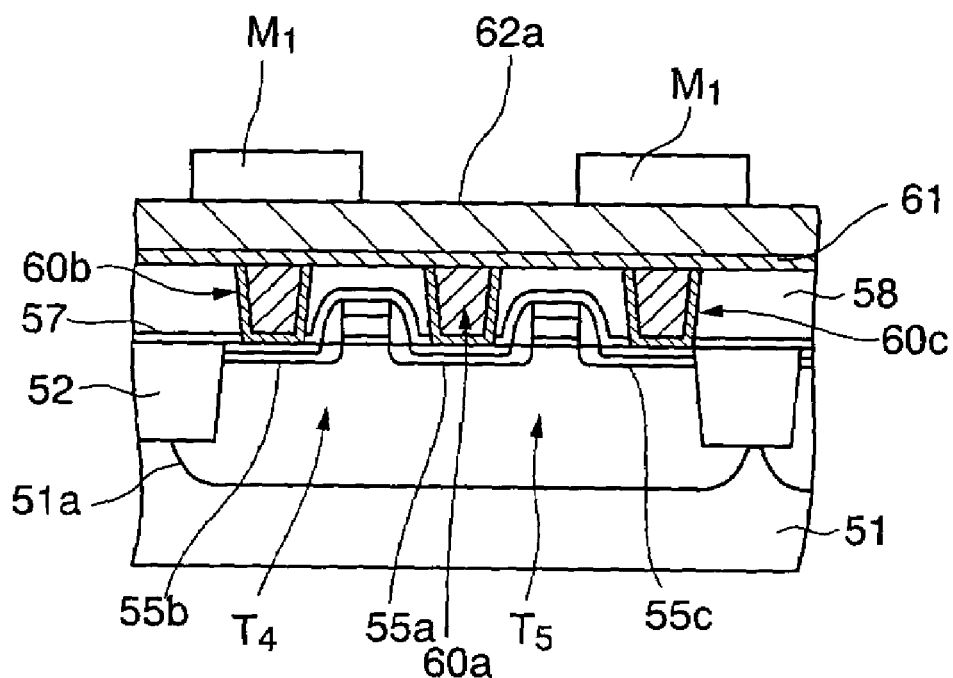

Then, as shown in FIG. 27C, an iridium layer is formed as a conductive oxygen barrier metal layer 62a on the intermediate layer 61 by the sputter. The oxygen barrier metal layer 62a serves as a part of the lower electrode of the capacitor Q, as described later. As the sputter conditions of the Ir layer, for example, a pressure of the argon gas introduced into the sputter atmosphere is set to 0.11 Pa, a DC power for the sputter is set to 0.5 kW, and a substrate temperature is set to 500° C.

The Ir layer acting as the oxygen barrier metal layer 62a is formed to have a thickness enough to prevent the abnormal oxidation of the conductive plugs 60a to 60c. For example, in order to prevent the abnormal oxidation of the conductive plugs 60a to 60c when the annealing is executed at the substrate temperature of 550° C. in the oxygen-containing atmosphere, the thickness of 200 nm is formed. In addition, the thickness is added by 100 nm every time when the substrate temperature is increased by 100° C. In other words, if the iridium layer has the thickness of 400 nm, this iridium layer can prevent the oxidation of the conductive plugs 60a to 60c against the oxygen annealing at 750° C.

Then, masks $M_1$ are formed on the oxygen barrier metal layer 62a over the second and third conductive plugs 60b, 60c and their peripheral areas. The planar shape of the masks $M_1$ is set to the shape of the lower electrode of the capacitor described later. As the masks $M_1$, the resist may be employed, or the hard mask such as titanium nitride, silicon oxide, or the like may be employed.

Figure 27D:
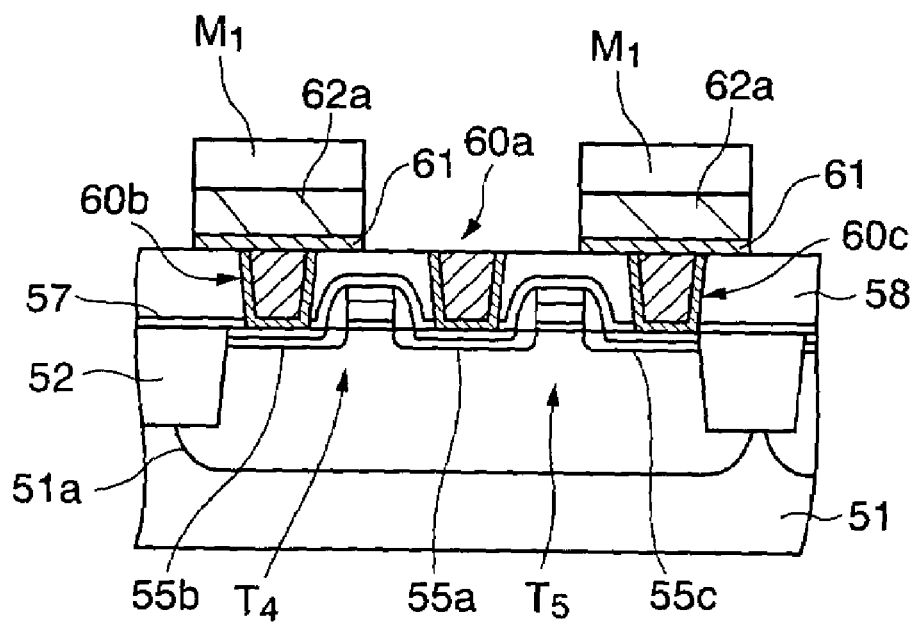

Then, as shown in FIG. 27D, the oxygen barrier metal layer 62a and the intermediate layer 61 in the region that is not covered with the masks $M_1$ are etched. Thus, the oxygen barrier metal layer 62a and the intermediate layer 61 are left in the region of the first interlayer insulating film 58, which is on the second and third conductive plugs 60b, 60c and their peripheral areas, to have a size of the capacitor. The halogen gas is used as the etching gas of the oxygen barrier metal layer 62a.

Then, the masks $M_1$ are removed.

Figure 27E:
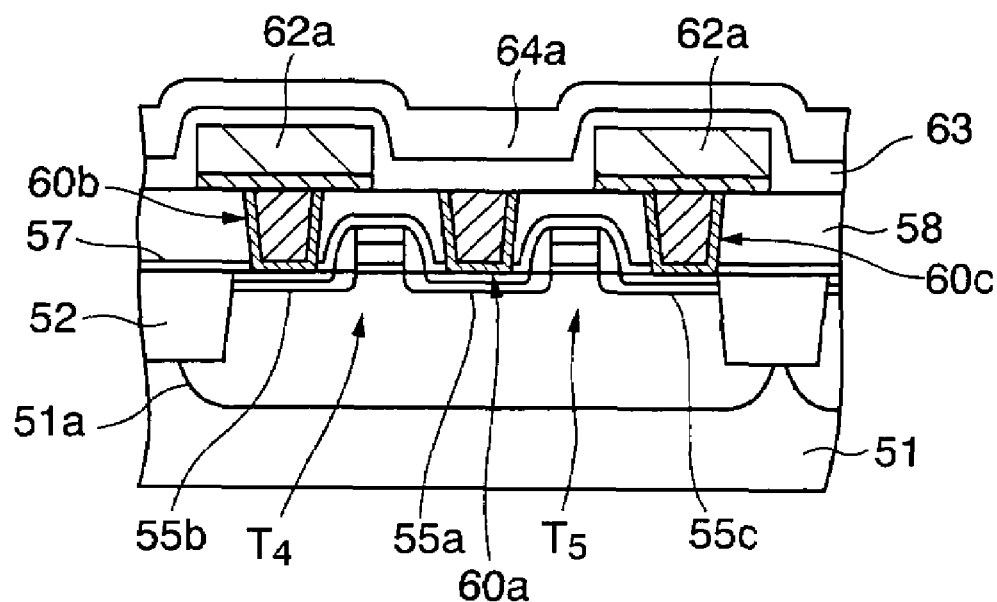

Then, as shown in FIG. 27E, the silicon oxide nitride (SiON) layer of the silicon nitride ($Si_3N_4$) layer of 100 nm thickness, for example, is formed as the oxidation-preventing insulating film 63 on the first conductive plug 60a, the oxygen barrier metal layer 62a, and the first interlayer insulating film 58 by the CVD method. Then, a silicon oxide ($SiO_2$) layer of 300 nm thickness, for example, is formed as a second insulating adhesive layer 64a on the oxidation-preventing insulating film 63 by the CVD method using the TEOS, for example.

Figure 27F:
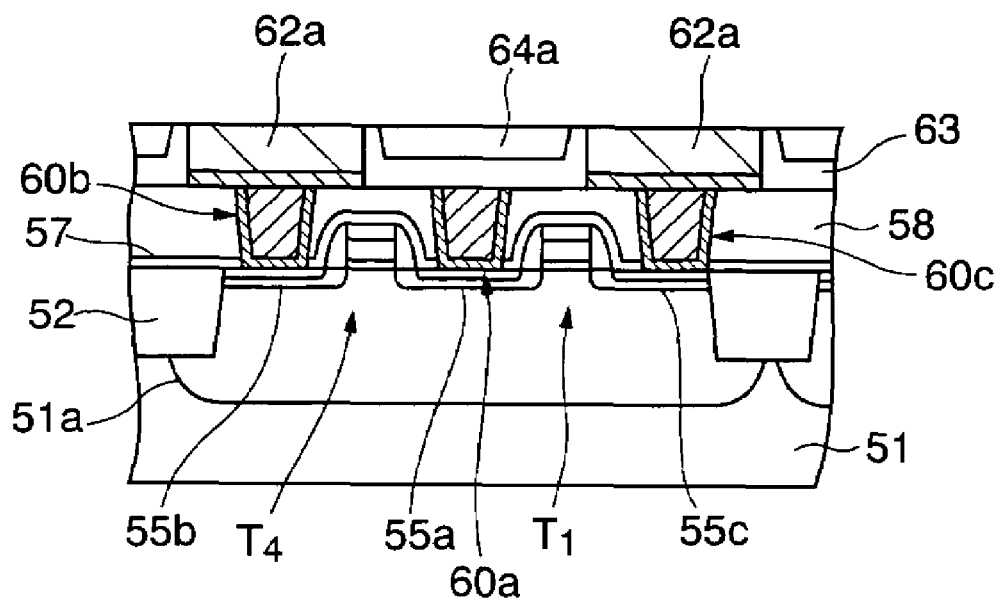

Then, as shown in FIG. 27F, while causing the oxygen barrier metal layer 62a to act as the stopper layer, the second insulating adhesive layer 64a and the oxidation-preventing insulating film 63 are polished by the CMP to expose an upper surface of the oxygen barrier metal layer 62a. In this case, upper surfaces of the oxygen barrier metal layer 62a, the second insulating adhesive layer 64a, and the oxidation-preventing insulating film 63 are planarized by the CMP.

Figure 27G:
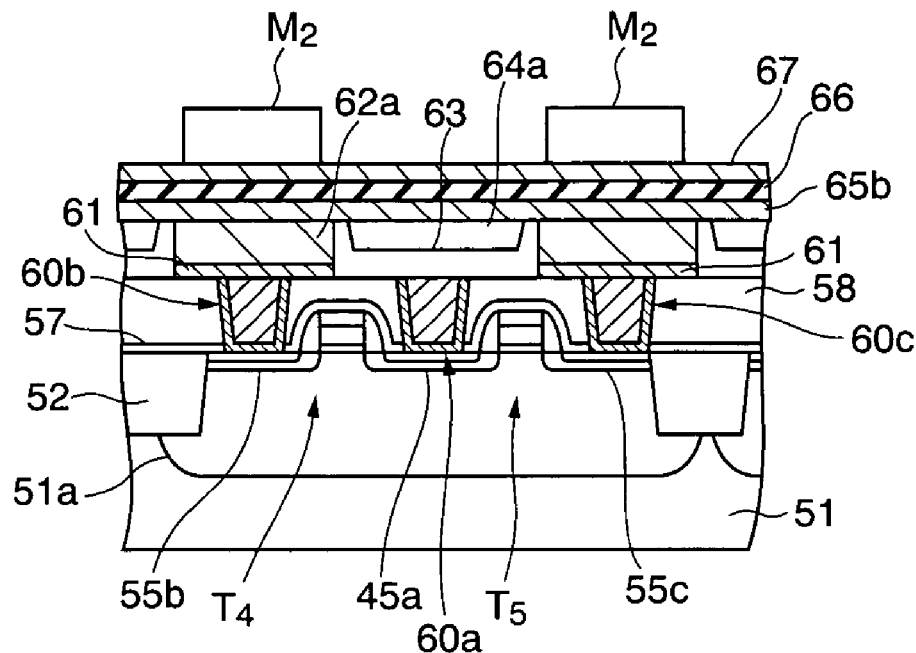

Then, as shown in FIG. 27G, an Ir layer of 30 nm thickness, for example, is formed as a first conductive film 65b on the oxygen barrier metal layer 62a, the oxidation-preventing insulating film 63, and the second insulating adhesive layer 64a by the sputter.

In this case, like the fourth embodiment, the second insulating adhesive layer 64a may be exposed to the $NH_3$ plasma before or after the first conductive film 65b is formed.

Then, the PZT layer of 200 nm thickness, for example, is formed as the ferroelectric layer 66 on the first conductive film 65b by the MOCVD method. The conditions for forming the ferroelectric layer 66 by the MOCVD method are set similarly to those in the fourth embodiment.

Here, as the method of forming the ferroelectric layer 66, other method shown in the first embodiment may be employed. Also, as the material of the ferroelectric layer 66, the material shown in the first embodiment may be employed other than PZT.

Then, the $IrO_2$ layer of 200 nm thickness, for example, is formed as the second conductive film 67 on the ferroelectric layer 66 by the sputter method.

Then, the TiN layer and the $SiO_2$ layer are formed sequentially on the second conductive film 67. The TiN layer is formed by the sputter, and the $SiO_2$ layer is formed by the CVD method using the TEOS. The TiN layer and the $SiO_2$ layer are patterned into the almost same planar shape as the oxygen barrier metal layer 62a over the second and third conductive plugs 60b, 60c, and act as hard masks $M_2$.

Then, the second conductive film 67, the ferroelectric layer 66, and the first conductive film 65b in the region that is not covered with the hard masks $M_2$ are etched sequentially. Even if the second insulating adhesive layer 64a is etched by this etching, the underlying oxidation-preventing insulating film 63 functions as the etching stopper and therefore the first conductive plug 60a is never exposed.

Figure 27H:
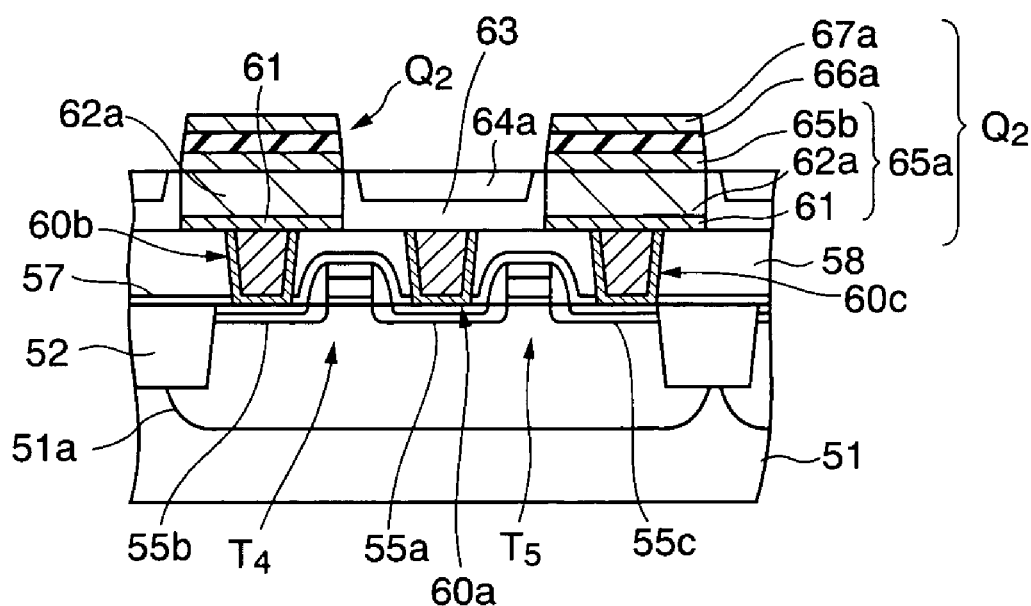

With the above, as shown in FIG. 27H, capacitors $Q_2$ are formed on the first interlayer insulating film 58. A lower electrode 65a of the capacitor $Q_2$ is made of the first conductive film 65b, the oxygen barrier metal layer 62a, and the intermediate layer 61. Also, a dielectric layer 66a of the capacitor $Q_2$ is made of the ferroelectric layer 66, and an upper electrode 67a of the capacitor $Q_2$ is made of the second conductive film 67.

Two capacitors $Q_2$ are arranged over one p-well 51a. The lower electrodes 65a of the capacitors $Q_2$ are connected electrically to the second or third n-type impurity diffusion region 55b, 55c via the second or third conductive plug 60b, 60c respectively.

The hard masks $M_2$ are removed after the patterns of the capacitors $Q_2$ are formed.

Then, in order to recover the film quality of the ferroelectric layer 66 from the damage caused by the etching, the recovery annealing of the capacitors $Q_2$ is executed. The recovery annealing in this case is at the substrate temperature of 650° C. for 60 minute in the furnace containing the oxygen, for example.

In this manner, when the heat treatment such as the recovery annealing is applied immediately after the patterning of the ferroelectric film 66, the heat resistance of the second and third conductive plugs 60b, 60c, which are positioned directly under the lower electrodes 65a, is decided based on the oxygen permeability of the oxygen barrier metal layer 62a, and also the oxidation resistance of the first conductive plug 60a, which is not positioned directly under the lower electrode 65a, is decided based on the oxygen permeability of the second insulating adhesive layer 64a and the oxidation-preventing insulating film 63.

Figure 27I:
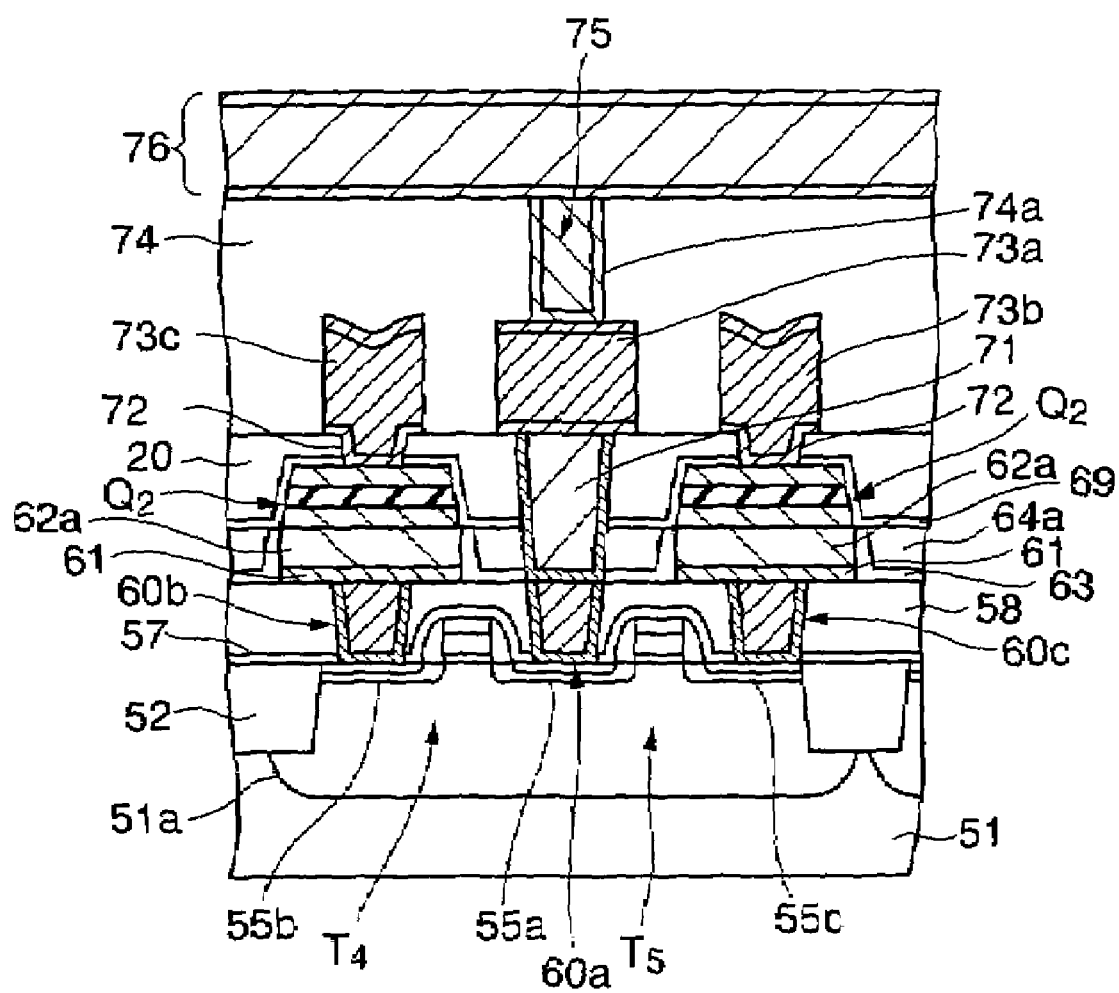

Next, steps required until a structure shown in FIG. 27I is formed will be explained hereunder.

First, alumina of 50 nm thickness is formed as the capacitor protection layer 69 on the capacitors $Q_2$, the oxidation-preventing insulating film 63, and the second insulating adhesive layer 64a. Then, in accordance with the steps shown in the third embodiment, the fourth conductive plug 71, the conductive pad 73a, the first-layer metal wirings 73b, 73c, the third interlayer insulating film 74, the fifth conductive plug 75, the bit line 76, etc. are formed.

In the above steps, the intermediate layer 61 and the oxygen barrier metal layer 62a are formed on the first interlayer insulating film 58 that was subjected to the $NH_3$ plasma process. Thus, the intermediate layer 61 and the oxygen barrier metal layer 62a constitute a part of the lower electrode 65a.

Therefore, the (111) orientation intensity of not only the oxygen barrier metal layer 62a but also the overlying first conductive film 65 (lower electrode 65a) can be enhanced. If the PZT ferroelectric film 66 is formed on the first conductive film 65 at the high substrate temperature of 620° C. by the MOCVD method, more than 90% of the grains constituting the ferroelectric film 66 can be directed uniformly in the (111) orientation. As a result, like the second embodiment, the imprint characteristic of the memory cell can be improved.

In addition, when the ferroelectric film 66 is formed by the MOCVD method, the conductive plugs 60b, 60c made of tungsten are covered with the oxygen barrier metal layer 62a. Therefore, the abnormal oxidation of the conductive plugs 60b, 60c is not generated.

In this case, like the fourth embodiment, it is preferable that, in the steps of forming the capacitors $Q_2$, the ferroelectric film 66 should be formed at the growth temperature of 600 to 650° C.

In the meanwhile, in the above embodiments, the insulating film is exposed to the plasma of the gas having the N—H bond, and then the intermediate layer and the first conductive film are formed on the insulating film by the sputter. But these films may be formed by the plasma CVD method, the MOCVD method, or the plating method.

As described above, according to the present invention, the plasma of the gas having the molecular structure in which the hydrogen and the nitrogen are bonded to each other, e.g., the $NH_3$ gas, is irradiated onto the insulating film, and then the self-orientation film having the self-orientation characteristic is formed on the insulating film. At that time, the self-orientation film itself can grow with the good orientation characteristic, and then can approach the functional film such as the ferroelectric material formed thereon to attain the good crystallinity of the overlying film.

What is claimed is:

1. A manufacturing method of a semiconductor device comprising the steps of:
   forming an insulating film over a semiconductor substrate;
   exciting a plasma of an ammonia gas having a molecular structure in which hydrogen and nitrogen are bonded and irradiating the plasma onto the insulating film to form nitrogen-hydrogen (N—H) bonds on a surface thereof;
   forming a self-orientation layer made of substance having a self-orientation characteristic on the insulating film; and
   forming a first conductive film made of conductive substance having the self-orientation characteristic on the self-orientation layer,
   wherein, after the plasma is irradiated onto the insulating film, the self-orientation layer is formed on the insulating film,
   wherein the insulating film is kept in a vacuum state without being exposed to the atmosphere during the period from the irradiation of plasma until the formation of the self-orientation layer.

2. A manufacturing method of a semiconductor device according to claim 1, wherein a pressure of the vacuum atmosphere is set to $1\sim10^{-3}$ Torr or less.

3. A manufacturing method of a semiconductor device according to claim 1, wherein the self-orientation layer is formed of any one of titanium, aluminum, silicon, copper, tantalum, tantalum nitride, iridium, iridium oxide, and platinum.

4. A manufacturing method of a semiconductor device according to claim 1, wherein the first conductive film is formed of any one of titanium, aluminum, silicon, copper, tantalum, tantalum nitride, iridium, iridium oxide, and platinum.

5. A manufacturing method of a semiconductor device according to claim 1, wherein the first conductive film is formed by any one of a sputter method, a plasma CVD method, an MOCVD method, and a plating method.

6. A manufacturing method of a semiconductor device according to claim 1, further comprising the step of forming a conductive pattern by patterning the first conductive film and the self-orientation layer.

7. A manufacturing method of a semiconductor device according to claim 6, wherein the conductive pattern is any one of an electrode and a wiring.

8. A manufacturing method of a semiconductor device according to claim 6, further comprising the step of:
   forming a hole under a part of the insulating film in a region in which the conductive pattern is to be formed, and forming a conductive plug in the hole before the plasma is irradiated onto the insulating film.

9. A manufacturing method of a semiconductor device according to claim 1, further comprising the steps of:
   forming a capacitor lower electrode on the insulating layer by patterning the self-orientation layer and the first conductive film wherein the insulating film including a conductive plug therein, the conductive plug being under the self-orientation layer and the first conductive film, and the capacitor lower electrode being formed on the conductive plug;
   forming sequentially an oxidation-preventing insulating film and an adhesive insulating layer on the capacitor lower electrode and the insulating film;
   polishing the adhesive insulating layer and the oxidation-preventing insulating layer to expose an upper surface of the capacitor lower electrode;
   forming an overlying conductive film made of a same material as the first conductive film on the adhesive insulating layer, the oxidation-preventing insulating layer, and the capacitor lower electrode;
   forming a ferroelectric film on the overlying conductive film;
   forming a second conductive film on the ferroelectric film; and patterning the second conductive film, the ferroelectric film, and the overlying conductive film to form a capacitor shape that coincides with the capacitor lower electrode.

10. A manufacturing method of a semiconductor device according to claim 9, further comprising the steps of:
crystallizing the ferroelectric film by a heat in an oxygen atmosphere after the ferroelectric film is formed; and
annealing the ferroelectric film and the second conductive film by the heat in the oxygen atmosphere after the second conductive film is formed.

11. A manufacturing method of a semiconductor device according to claim 9, wherein forming the second conductive film comprising forming a lower conductive film and forming an upper conductive film, and further comprising the step of:
annealing the ferroelectric film in an oxygen atmosphere before and after formation of the lower conductive film respectively.

12. A manufacturing method of a semiconductor device according to claim 9, wherein the ferroelectric film is formed of either PZT or PZT into which at least one of calcium, strontium, and lanthanum is doped.

13. A manufacturing method of a semiconductor device according to claim 9, wherein the ferroelectric film is formed by any one of a spin-on method, a sol-gel method, a MOD method, and a MOCVD method.

14. A manufacturing method of a semiconductor device according to claim 13, wherein, when the ferroelectric film is formed by the MOCVD method, a substrate temperature is set from 600° C. to 650° C.

15. A manufacturing method of a semiconductor device according to claim 14, wherein more than 90% of grains constituting the ferroelectric film have a (111) orientation.

16. A manufacturing method of semiconductor device according to claim 1, further comprising the steps of:
forming a ferroelectric film on the first conductive film;
forming a second conductive film on the ferroelectric film;
forming a capacitor upper electrode by patterning the second conductive film;
patterning the ferroelectric film to leave at least a portion of the ferroelectric film under the capacitor upper electrode; and
forming the capacitor lower electrode at least below the capacitor upper electrode by patterning the first conductive film and the self-orientation layer.

17. A manufacturing method of a semiconductor device comprising the steps of:
forming an insulating film over a semiconductor substrate;
exciting a plasma of a gas having a molecular structure in which hydrogen and nitrogen are bonded and irradiating the plasma onto the insulating film to form nitrogen-hydrogen (N—H) bonds on a surface thereof;
forming a self-orientation layer made of substance having a self-orientation characteristic on the insulating film; and
forming a first conductive film made of conductive substance having the self-orientation characteristic on the self-orientation layer,
wherein a surface of the insulating film is dehydrated by coating alcohol thereon after the plasma is irradiated onto the insulating film and before the self-orientation layer is formed.

* * * * *